(12) United States Patent
Ohnuma et al.

(10) Patent No.: US 9,006,043 B2
(45) Date of Patent: Apr. 14, 2015

(54) MANUFACTURING METHOD OF SEMICONDUCTOR DEVICE

(75) Inventors: Hideto Ohnuma, Kanagawa (JP); Masayuki Sakakura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/449,383

(22) Filed: Apr. 18, 2012

(65) Prior Publication Data

US 2012/0202331 A1 Aug. 9, 2012

Related U.S. Application Data

(63) Continuation of application No. 12/986,243, filed on Jan. 7, 2011, now Pat. No. 8,168,523, which is a continuation of application No. 11/458,266, filed on Jul. 18, 2006, now Pat. No. 7,867,791.

(30) Foreign Application Priority Data

Jul. 29, 2005 (JP) .................................. 2005-221983

(51) Int. Cl.
*H01L 21/00* (2006.01)
*H01L 21/027* (2006.01)
*H01L 27/12* (2006.01)
*H01L 27/32* (2006.01)
*H01L 51/52* (2006.01)

(52) U.S. Cl.
CPC ........ *H01L 21/0273* (2013.01); *H01L 27/1214* (2013.01); *H01L 27/3244* (2013.01); *H01L 27/3276* (2013.01); *H01L 51/5237* (2013.01)

(58) Field of Classification Search
CPC . H01L 27/12; H01L 27/1203; H01L 27/1207; H01L 27/1211; H01L 27/1214; H01L 27/1222
USPC ..................... 257/595–598, 59; 438/151–166
See application file for complete search history.

(56) References Cited

U.S. PATENT DOCUMENTS

| 5,589,707 | A | 12/1996 | Cronin |
| 6,020,598 | A | 2/2000 | Yamazaki |
| 6,410,373 | B1 * | 6/2002 | Chang et al. .................. 438/164 |
| 6,773,944 | B2 | 8/2004 | Okamoto |

(Continued)

FOREIGN PATENT DOCUMENTS

| JP | 08-032071 A | 2/1996 |
| JP | 09-036378 A | 2/1997 |

(Continued)

*Primary Examiner* — Matthew W Such
*Assistant Examiner* — Ali Naraghi
(74) *Attorney, Agent, or Firm* — Fish & Richardson P.C.

(57) ABSTRACT

The invention provides a technique to manufacture a highly reliable semiconductor device and a display device at high yield. As an exposure mask, an exposure mask provided with a diffraction grating pattern or an auxiliary pattern formed of a semi-transmissive film with a light intensity reducing function is used. With such an exposure mask, various light exposures can be more accurately controlled, which enables a resist to be processed into a more accurate shape. Therefore, when such a mask layer is used, the conductive film and the insulating film can be processed in the same step into different shapes in accordance with desired performances. As a result, thin film transistors with different characteristics, wires in different sizes and shapes, and the like can be manufactured without increasing the number of steps.

12 Claims, 35 Drawing Sheets

(56) References Cited

U.S. PATENT DOCUMENTS

| | | |
|---|---|---|
| 7,223,643 B2 | 5/2007 | Ohnuma et al. |
| 7,422,984 B2 | 9/2008 | Okamoto |
| 7,588,970 B2 | 9/2009 | Ohnuma et al. |
| 7,867,791 B2 | 1/2011 | Ohnuma et al. |
| 2002/0006705 A1 | 1/2002 | Suzawa et al. |
| 2002/0011597 A1 | 1/2002 | Fujimoto et al. |
| 2002/0013020 A1 | 1/2002 | Kim et al. |
| 2003/0020065 A1 | 1/2003 | Honda |
| 2003/0173566 A1* | 9/2003 | Nakazawa et al. ............. 257/66 |
| 2003/0194839 A1* | 10/2003 | Chung ........................ 438/151 |
| 2009/0004872 A1 | 1/2009 | Okamoto |

FOREIGN PATENT DOCUMENTS

| | | |
|---|---|---|
| JP | 2002-134756 A | 5/2002 |
| JP | 2002-203862 A | 7/2002 |
| JP | 2002-231953 A | 8/2002 |
| JP | 2003-209260 A | 7/2003 |
| KR | 10-0202234 B1 | 6/1999 |

* cited by examiner

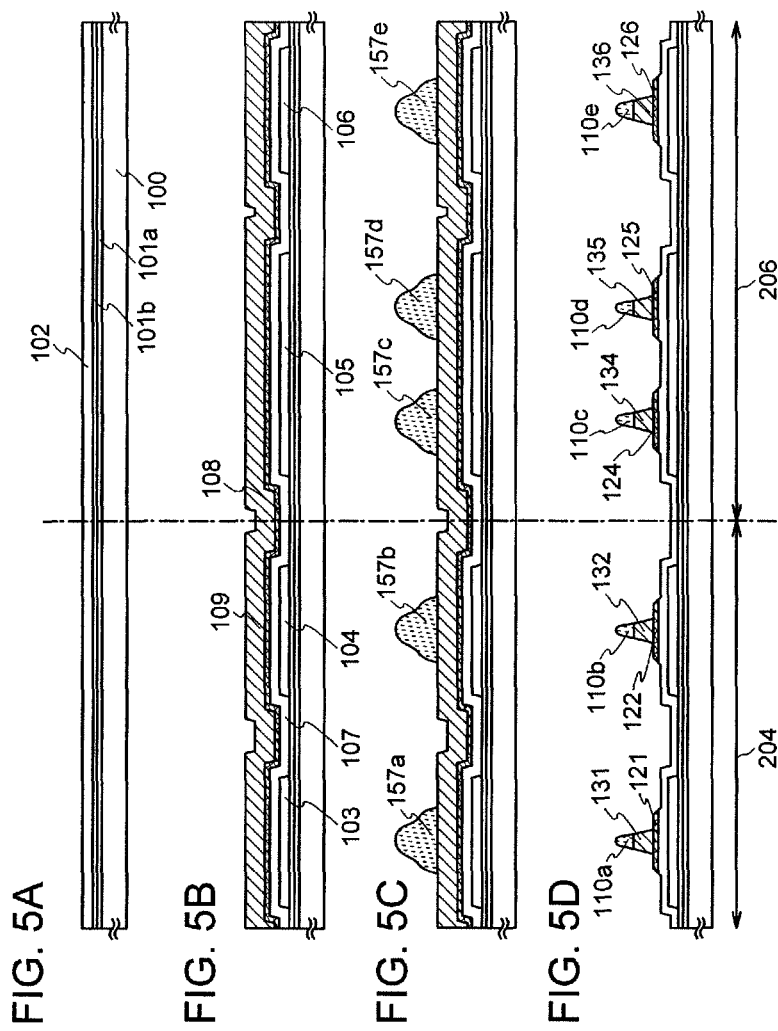

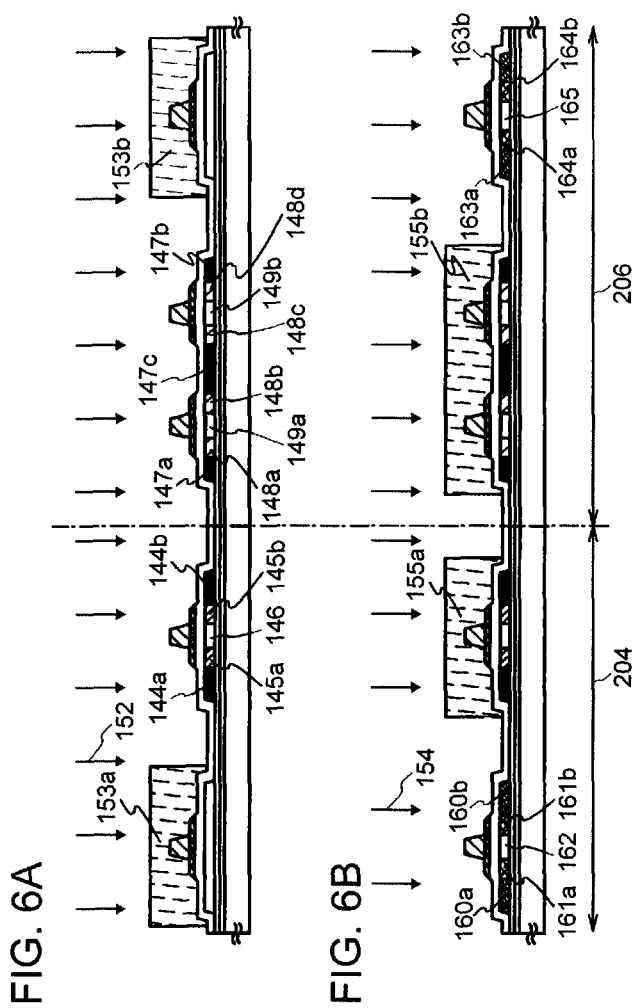

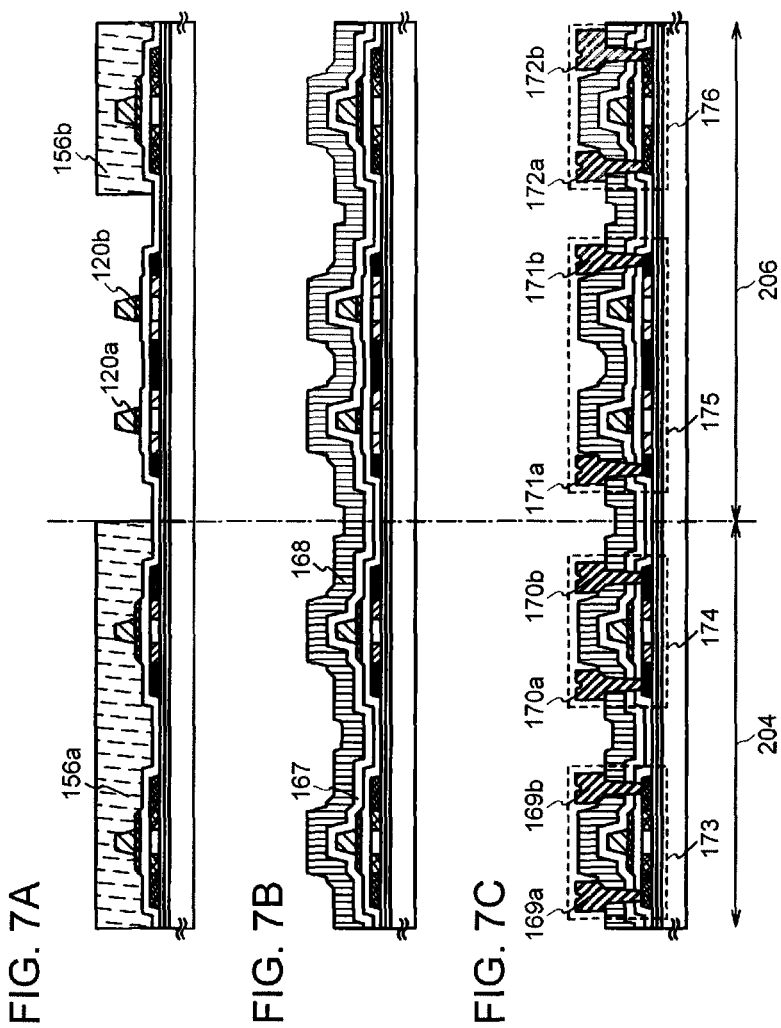

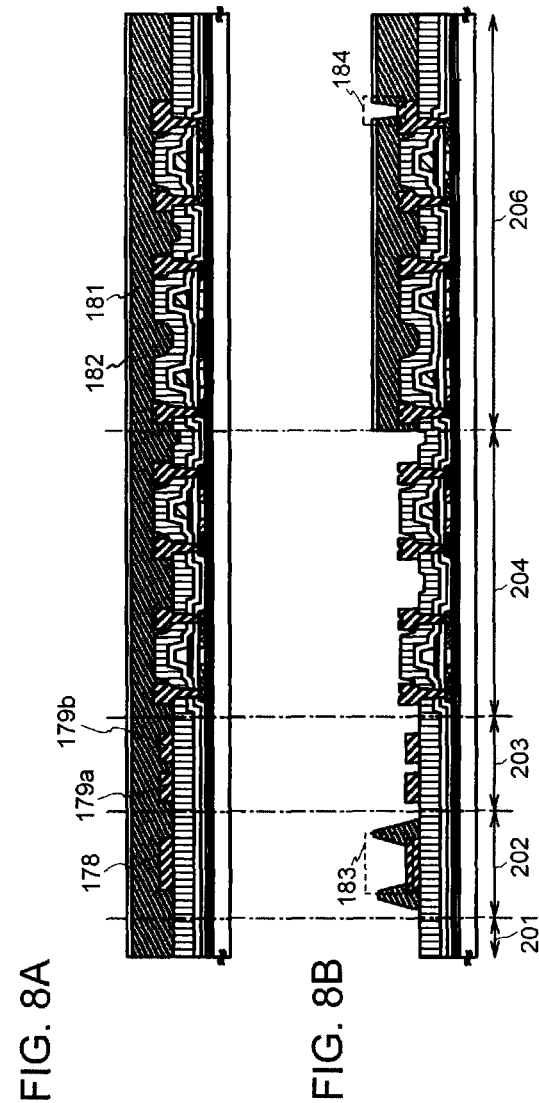

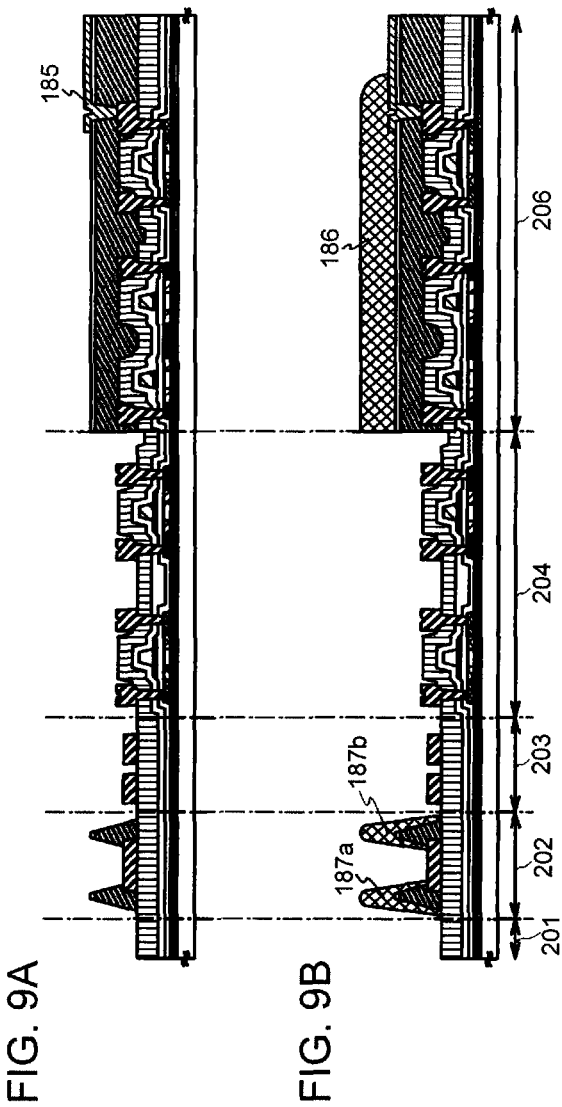

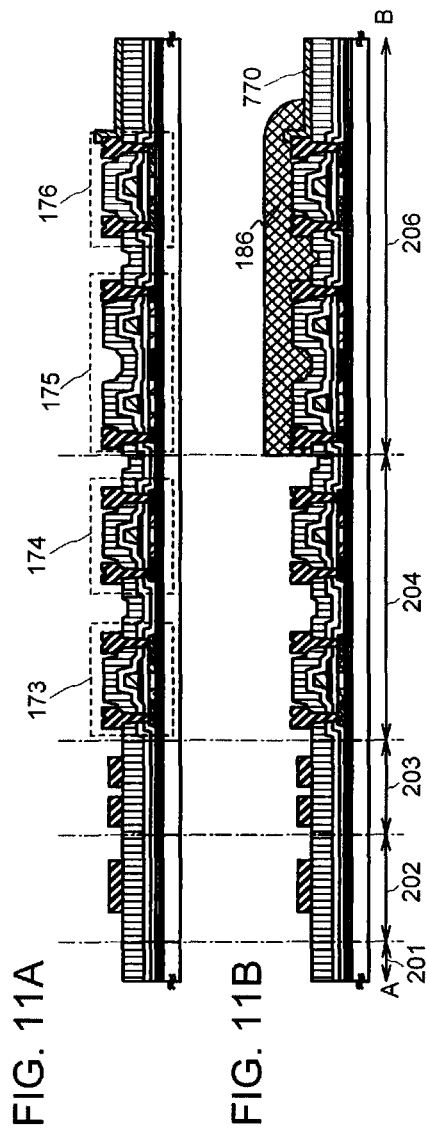

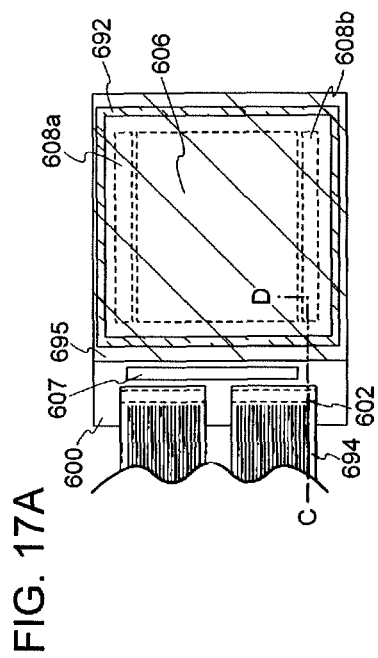
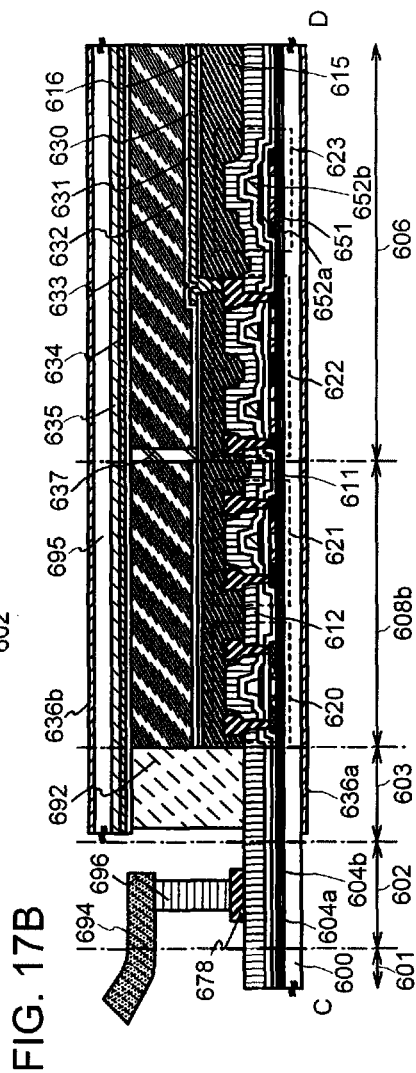
FIG. 17A
FIG. 17B

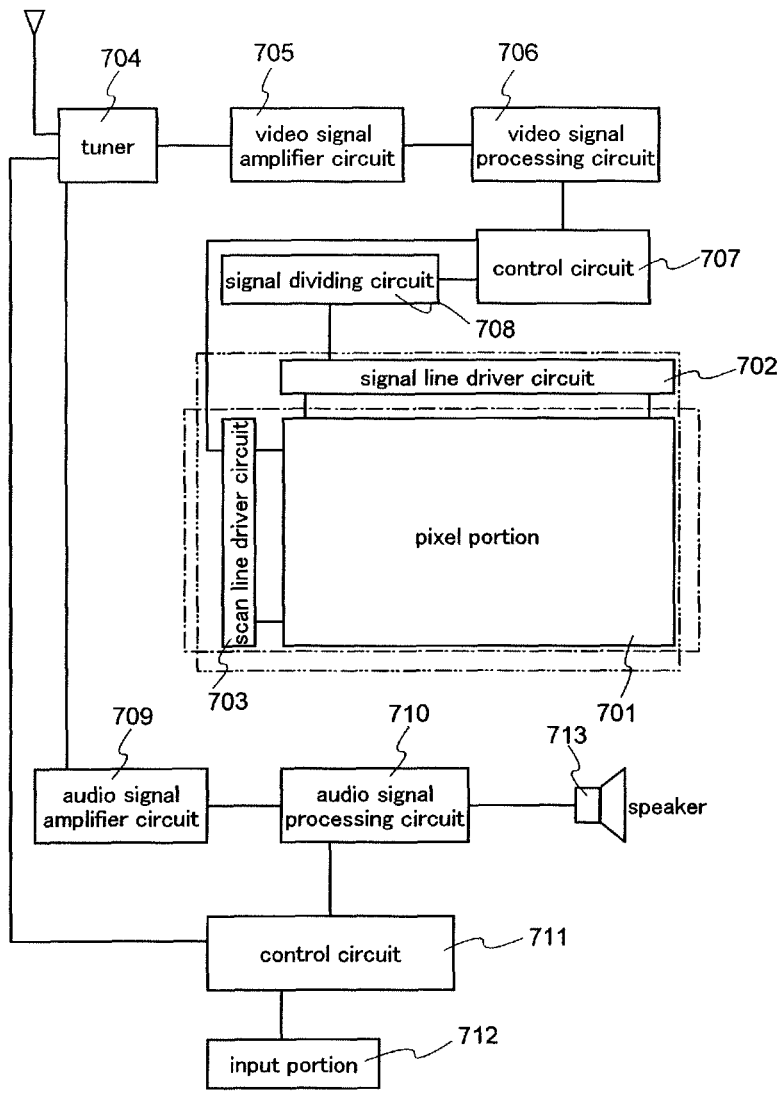

MANUFACTURING METHOD OF SEMICONDUCTOR DEVICE

CROSS-REFERENCE TO RELATED APPLICATIONS

This application is a continuation of U.S. application Ser. No. 12/986,243, filed Jan. 7, 2011, now allowed, which is a continuation of U.S. application Ser. No. 11/458,266, filed Jul. 18, 2006, now U.S. Pat. No. 7,867,791, which claims the benefit of a foreign priority application filed in Japan as Serial No. 2005-221983 on Jul. 29, 2005, all of which are incorporated by reference.

BACKGROUND OF THE INVENTION

1. Field of the Invention

The invention relates to a semiconductor device and a manufacturing method of a semiconductor device.

2. Description of the Related Art

A thin film transistor used for a semiconductor device, a display device, or the like is required to have different characteristics depending on the purpose or function of the semiconductor device. It is important to control the characteristics of the thin film transistor to satisfy the requirement, and a technique for manufacturing the thin film transistor has been researched to provide characteristics appropriate for the intended use.

In a thin film transistor, by etching a gate electrode layer into stacked layers of different shapes or a tapered shape and adding impurity elements by utilizing the etched shape, a technique to form impurity regions with different concentrations in a semiconductor layer in a self-aligned manner has been reported (for example, see Patent Document 1).

Patent Document 1

Japanese Patent Laid-open No. 2002-203862

However, when a shape of a gate electrode is controlled by etching as described above, there is a problem in that a wire, a capacitor electrode, and the like formed in the same step result in having similar tapered shapes to the gate electrode.

SUMMARY OF THE INVENTION

The invention provides a technique which enables manufacturing of a semiconductor device and a display device having high resolution and high reliability at high yield without complicating the steps and apparatuses.

It is to be noted in this specification that a semiconductor device corresponds to a device which can function by utilizing semiconductor characteristics. By using the invention, a multi-layer wiring layer or a semiconductor device such as an IC chip can be manufactured.

Moreover, by using the invention, a display device can be also manufactured. A display device applicable to the invention includes a light emitting display device in which a thin film transistor (hereinafter also referred to as a TFT) and a light emitting element formed of electrodes sandwiching a layer containing an organic substance, an inorganic substance or a mixture of an organic substance and an inorganic substance, each of which exhibits light emission called electroluminescence (hereinafter also referred to as EL), are connected, a liquid crystal display device which uses a liquid crystal element containing a liquid crystal material as a display element, and the like.

According to a manufacturing method of a semiconductor device of the invention, a first semiconductor layer and a second semiconductor layer are formed; a gate insulating layer is formed over the first semiconductor layer and the second semiconductor layer; a first conductive film is formed over the gate insulating layer; a second conductive film is formed over the first conductive film; a first mask layer over the first semiconductor layer and a second mask layer over the second semiconductor layer are formed over the second conductive film by using a light exposure mask which transmits light at a plurality of intensities; the first conductive film and the second conductive film are etched by using the first mask layer and the second mask layer; a first gate electrode layer and a second gate electrode layer are formed using the first mask layer, and a third gate electrode layer and a fourth gate electrode layer are formed by the second mask layer; an impurity element imparting one conductivity type is added to the first semiconductor layer by using the first gate electrode layer and the second gate electrode layer as masks and to the second semiconductor layer by using the third gate electrode layer and the fourth gate electrode layer as masks, thereby a first high concentration impurity region and a first low concentration impurity region which overlaps the first gate electrode layer are formed in the first semiconductor layer and a second high concentration impurity region and a second low concentration impurity region which overlaps the third gate electrode layer are formed in the second semiconductor layer; a third mask layer is formed over the second semiconductor layer, the third gate electrode layer, and the fourth gate electrode layer; and a region which overlaps the first low concentration impurity region in the first gate electrode layer is removed by using the third mask layer and the second gate electrode layer as masks.

According to a manufacturing method of a semiconductor device of the invention, a first semiconductor layer, a second semiconductor layer, and a third semiconductor layer are formed; a gate insulating layer is formed over the first semiconductor layer, the second semiconductor layer, and the third semiconductor layer: a first conductive film is formed over the gate insulating layer; a second conductive film is formed over the first conductive film; a first mask layer over the first semiconductor layer and a second mask layer over the second semiconductor layer, and a third mask over the third semiconductor layer are formed over the second conductive film by using a light exposure mask which transmits light at a plurality of intensities; the first conductive film and the second conductive film are etched by using the first mask layer, the second mask layer, and the third mask layer; a first gate electrode layer and a second gate electrode layer are formed by the first mask layer, a third gate electrode layer and a fourth gate electrode layer are formed by the second mask layer, and a fifth gate electrode layer and a sixth gate electrode layer are formed by the third mask layer; a fourth mask layer is formed over the third semiconductor layer, the fifth gate electrode layer, and the sixth gate electrode layer; an impurity element imparting n-type conductivity is added to the first semiconductor layer by using the fourth mask layer, the first gate electrode layer, and the second gate electrode layer as masks and to the second semiconductor layer by using the fourth mask layer, the third gate electrode layer and the fourth gate electrode layer as masks, thereby a first n-type high concentration impurity region and a first n-type low concentration impurity region which overlaps the first gate electrode layer are formed in the first semiconductor layer, and a second n-type high concentration impurity region and a second n-type low concentration impurity region which overlaps the third gate electrode layer are formed in the second semiconductor layer; a fifth mask layer is formed over the first semiconductor layer, the second semiconductor layer, the first gate electrode layer, the second gate electrode layer, the third gate electrode layer, and the fourth gate electrode layer; an impurity element imparting p-type conductivity is added to the third semiconductor layer by using the fifth mask layer, the fifth gate electrode layer, and the sixth gate electrode layer as masks, thereby a p-type impurity region is formed in the third semiconductor layer; a sixth mask layer is formed over the first semiconductor layer, the third semiconductor layer, the first gate electrode layer, the second gate electrode layer the fifth gate electrode layer and the sixth gate electrode layer; and a region which overlaps the second low concentration impurity region in the third gate electrode layer is removed by using the sixth mask layer and the fourth gate electrode layer as masks.

In the aforementioned structure, as the exposure mask which transmits light at a plurality of intensities, a semi-transmissive film (also called a semi-transparent film) which reduces the intensity of light to pass through or a diffraction grating pattern having a non-opening and an opening with a width of the resolution of the exposure apparatus (resolution limit) or narrower may be used.

By using the invention, a highly reliable semiconductor device and display device can be manufactured through simplified steps. Therefore, a semiconductor device and a display device with high resolution and high performance can be manufactured at low cost and high yield.

BRIEF DESCRIPTION OF DRAWINGS

FIGS. 5A to 5D are views showing a manufacturing method of a display device of the invention.

FIGS. 6A and 6B are views showing a manufacturing method of a display device of the invention.

FIGS. 7A to 7C are views showing a manufacturing method of a display device of the invention.

FIGS. 8A and 8B are views showing a manufacturing method of a display device of the invention.

FIGS. 9A and 9B are views showing a manufacturing method of a display device of the invention.

FIGS. 11A and 11B are views showing a manufacturing method of a display device of the invention.

FIGS. 17A and 17B are views showing a display device of the invention.

FIG. 26 is a view showing an electronic device to which the invention is applied.

DETAILED DESCRIPTION OF THE INVENTION

Figure 1A:
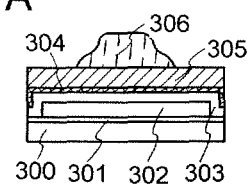
FIGS. 1A to 1D are views showing manufacturing steps of a semiconductor device of the invention.

Embodiment modes of the invention are described in details with reference to the drawings. Although the present invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Note that identical portions in embodiment modes are denoted by the same reference numerals and descriptions thereof are not repeated.

Embodiment Mode 1

A manufacturing method of a thin film transistor of this embodiment mode is described in details with reference to FIGS. 1A to 1D. It is to be noted that one thin film transistor is described in this embodiment mode; however, it is needless to say that a plurality of thin film transistors can be formed at the same time on the same substrate.

An insulating layer 301 is formed as a base film over a substrate 300 and a semiconductor layer 302 is formed over the insulating layer 301. In this embodiment mode, a crystalline semiconductor layer is used as the semiconductor layer 302. A gate insulating layer 303 is formed over the semiconductor layer 302 and a first conductive film 304 and a second conductive film 305 are stacked thereover. In this embodiment mode, a gate electrode layer formed over the gate insulating layer is formed to have a stacked-layer structure; therefore, the first conductive film 304 and the second conductive film 305 are stacked. The semiconductor layer 302 may be doped with a slight amount of impurity element (boron or phosphorus) for controlling a threshold voltage of a thin film transistor.

A mask layer 306 is formed for etching the first conductive film 304 and the second conductive film 305 into desired shapes (see FIG. 1A). The mask layer 306 is a resist pattern formed by etching a resist into a desired shape by an exposure mask. The exposure mask used in this embodiment mode is an exposure mask provided with a diffraction grating pattern or an auxiliary pattern formed of a semi-transmissive film with a light intensity reducing function. The diffraction grating pattern is a pattern provided with at least one opening pattern such as a slit or a dot. When a plurality of openings are provided, the openings may be arranged regularly (periodically) in some order or randomly (non-periodically). By using a fine diffraction grating pattern having an opening with a width of the resolution of an exposure apparatus or narrower and a non-opening, a substantial amount of light exposure can be changed, a thickness of an exposed resist film after development can be controlled, and the resist can be processed into a more precise shape. Therefore, by using such a mask layer, a conductive film and an insulating film can be processed into different shapes in accordance with a desired performance in the same step. As a result, different kinds of thin film transistors, wires in different sizes, and the like can be manufactured without increasing the number of steps.

Figure 1B:
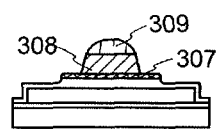

The first conductive film 304 and the second conductive film 305 are etched by using the mask layer 306; thereby the first gate electrode layer 307 and the second gate electrode layer 308 are formed (see FIG. 1B). The shapes of the first gate electrode layer 307 and the second gate electrode layer 308 reflect the shape of the mask layer 306. In this embodiment mode, a width of the first gate electrode layer 307 is wider than a width of the second gate electrode layer 308, and the first gate electrode layer 307 extends to exist outside the side edge portions of the second gate electrode 308. By the etching step for forming the gate electrode layer, the gate insulating layer is partially etched (also called film reduction) and becomes thin in some cases. Therefore, in this embodiment mode, by the etching step of the first conductive film 304 and the second conductive film 305, the gate insulating layer 303 of a region which is not covered with the first gate electrode layer 307 or the second gate electrode layer 308 is partially etched and has a less thickness. For the etching, dry etching, wet etching, or the like can be used. It is to be noted that the mask layer 306 is also etched in the step of etching the first conductive film and the second conductive film; thereby a mask layer 309 is formed.

Moreover, the first conductive film 304 and the second conductive film 305 can be etched into desired shapes to form wiring layers in the same step as the step of forming the first gate electrode layer 307 and the second gate electrode layer 308. In this case, by using a mask formed of an exposure mask provided with an auxiliary pattern having a light intensity reduction function such as the mask layer 306 for a wiring layer as well, a wiring layer having a shape which is freely set in accordance with a position or a function can be formed. In order to improve the coverage of an insulating layer or the like to be stacked over the wiring layer, the wiring layer can be formed so as to have a step (or a tapered shape) at edge portions similarly to the first gate electrode layer 307 and the second gate electrode layer 308. Alternatively, the wiring layer can be formed by precisely stacking a first wiring layer and a second wiring layer with approximately the same widths. When the stacked layers have the same widths, wiring capacitance between the stacked layers is reduced.

By introducing an impurity element imparting one conductivity type to the semiconductor layer 302, an impurity region is formed. In this embodiment mode, an impurity element imparting n-type conductivity (in this embodiment mode, phosphorus (P)) is used as the impurity element imparting one conductivity type in order to form an n-channel thin film transistor. An impurity element 312 imparting n-type conductivity is added to the semiconductor layer 302 provided with the mask layer 309, the first gate electrode layer 307, and the second gate electrode layer 308; thereby a first n-type impurity region 314a, a first n-type impurity region 314b, a second n-type impurity region 313a, and a second n-type impurity region 313b are formed (see FIG. 1C). Moreover, the semiconductor layer 302 of a region to which the impurity element 312 is not added becomes a channel forming region 315.

The n-type impurity element 312 can be added to the semiconductor layer 302 by using an ion doping method or an ion implanting method. The second n-type impurity region 313a and the second n-type impurity region 313b formed by adding the impurity element 312 imparting the n-type conductivity to the semiconductor layer 302 of a region which is not covered with the first gate electrode layer 307, the second gate electrode layer 308, and the mask layer 309 correspond to high concentration n-type impurity regions. On the other hand, the first n-type impurity region 314a and the first n-type impurity region 314b formed by adding the impurity element 312 imparting n-type conductivity to the semiconductor layer 302 through the first gate electrode layer 307 of a region which is not covered with the second gate electrode layer 308 correspond to low concentration n-type impurity regions.

In this embodiment mode, the gate electrode layer has a stacked-layer structure. By utilizing the different shapes of the first gate electrode layer 307 and the second gate electrode layer 308, the first n-type impurity region 314a, the first n-type impurity region 314b, the second n-type impurity region 313a, and the second n-type impurity region 313b are formed in a self-aligned manner by adding the impurity element 312 imparting n-type conductivity once. In this embodiment mode, the second n-type impurity region 313a, the second n-type impurity region 313b, the first n-type impurity region 314a, and the first n-type impurity region 314b are formed by performing a step of adding the impurity element once; however, the impurity regions can also be formed by a plurality of steps of adding the impurity element by controlling the thicknesses of the first gate electrode layer 307, the second gate electrode layer 308, and the gate insulating layer 303 and conditions of adding the impurity element.

The second n-type impurity region 313a and the second n-type impurity region 313b which are high concentration n-type impurity regions function as a source and a drain. On the other hand, the first n-type impurity region 314a and the first n-type impurity region 314b which are low concentration n-type impurity regions correspond to LDD (Lightly Doped Drain) regions. In this specification, an impurity region overlapped with a gate electrode layer with a gate insulating layer interposed therebetween is expressed as a Lov region while an impurity region which is not overlapped with a gate electrode layer with a gate insulating layer interposed therebetween is expressed as a Loff region.

Figure 1C:
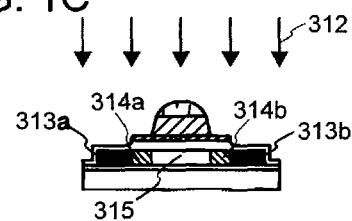

In FIG. 1C, the impurity regions are expressed by hatching and white, which does not mean that an impurity element is not added to the white portion. They are expressed like this so that it is easily recognized that the concentration distribution of impurity elements in this region reflects conditions of mask or doping. It is to be noted that this is similar in other drawings of this specification.

Figure 1D:

The first gate electrode layer 307 is etched by using the second gate electrode layer 308 as a mask; thereby a first gate electrode layer 316 is formed (see FIG. 1D). The first gate electrode layer 316 reflects a shape of the second gate electrode layer 308 and has a shape in which the first gate electrode layer 307 of regions which extend outside the second gate electrode layer 308 are removed. Therefore, edge portions of the first gate electrode layer 316 and those of the second gate electrode layer 308 almost correspond to each other. In this embodiment mode, when etching the first gate electrode layer 307, the mask layer 309 is removed. The mask layer 309 may be removed after forming the first gate electrode layer 307 and the second gate electrode layer 308; however, it may be removed in the same step as forming the first gate electrode layer 316 for simplifying the manufacturing steps.

As the first gate electrode layer 316 is formed, the first n-type impurity region 314a and the first n-type impurity region 314b are formed as Loff regions which are not covered with the first gate electrode layer 316 and the second gate electrode layer 308 with the gate insulating layer 303 interposed therebetween. The first n-type impurity region 314a or the first n-type impurity region 314b formed as a Loff region on a drain side has an effect to alleviate an electric field in the vicinity of the drain to prevent deterioration caused by hot carrier injection and to reduce an off current. As a result, a semiconductor device with high reliability and low power consumption can be manufactured.

A wiring layer (also called a source electrode layer or a drain electrode layer, not shown in FIGS. 1A to 1D) electrically connected to the second n-type impurity region 313a and the second n-type impurity region 313b which function as a source region and a drain region is formed, thereby an n-channel thin film transistor is manufactured.

Normally, when forming impurity regions with different concentrations in the semiconductor layer in a non-self-aligned manner, desired length and area of the impurity regions cannot be obtained in some cases because of misalignment in processing a mask layer used when forming the impurity region. When the desired impurity region is not formed, desired device characteristics of the thin film transistor cannot be obtained. Moreover, the device characteristics of a plurality of thin film transistors vary. Therefore, the reliability of the obtained semiconductor device is reduced.

Further, when the mask layer 309 is removed, the semiconductor layer 302 cannot be protected from doping of impurity elements in some cases.

By the invention, a highly reliable semiconductor device can be manufactured through simplified steps. Therefore, a semiconductor device and a display device with high resolution and high image quality can be manufactured at low cost and high yield.

Embodiment Mode 2

A manufacturing method of a thin film transistor of this embodiment mode is described in details with reference to FIGS. 2A to 2F. In this embodiment mode, two kinds of thin film transistors having gate electrode layers with different structures are manufactured in the same step as an example.

Figure 2A:
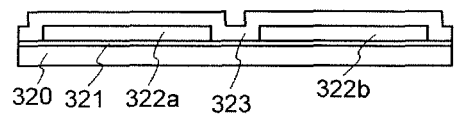
FIGS. 2A to 2F are views showing manufacturing steps of a semiconductor device of the invention.

Similarly to Embodiment Mode 1, an insulating layer 321 as a base film is formed over a substrate 320, and then semiconductor layers 322a and 322b, and a gate insulating layer 323 covering the semiconductor layers 322a and 322b are formed (see FIG. 2A). The semiconductor layers 322a and 322b may be doped with a slight amount of impurity element (boron (B) or phosphorus (P)) for controlling a threshold voltage of a thin film transistor.

Figure 2B:
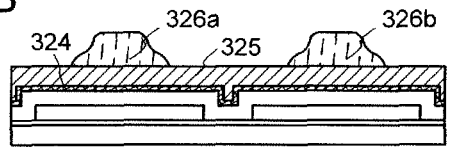

A first conductive film 324 and a second conductive film 325 are formed over the gate insulating layer 323, and mask layers 326a and 326b are formed of resists for processing the aforementioned films into desired shapes (see FIG. 2B). Similarly to the mask layer 306 described in Embodiment Mode 1, the mask layers 326a and 326b are also formed by using an exposure mask provided with a diffraction grating pattern or an auxiliary pattern formed of a semi-transmissive film having a light intensity reducing function. With such an exposure mask, various light exposures can be more accurately controlled, which enables a resist to be processed into a more accurate shape. Therefore, when such a mask layer is used, the conductive film and the insulating film can be processed in the same step into different shapes in accordance with desired performances. As a result, thin film transistors with different characteristics, wires in different sizes and shapes, and the like can be manufactured without increasing the number of steps.

Figure 2C:
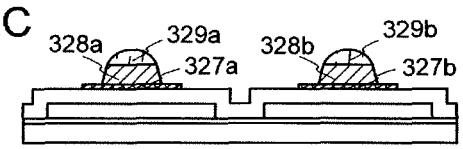

The first conductive film 324 and the second conductive film 325 are etched by using the mask layers 326a and 326b; thereby a first gate electrode layer 327a, a first gate electrode layer 327b, a second gate electrode layer 328a, and a second gate electrode layer 328b are formed (see FIG. 2C). It is to be noted that when etching the first conductive film 324 and the second conductive film 325, the mask layers 326a and 326b are also etched to be mask layers 329a and 329b respectively. The shapes of the first gate electrode layer 327a, the first gate electrode layer 327b, the second gate electrode layer 328a, and the second gate electrode layer 328b reflect the shapes of the mask layers 326a and 326b. In this embodiment mode, the widths of the first gate electrode layers 327a and 327b are wider than those of the second gate electrode layers 328a and 328b. The first gate electrode layers 327a and 327b extend to exist outside the side edge portions of the second gate electrode layers 328a and 328b respectively. For the etching, dry etching, wet etching, or the like can be used.

A mask layer 397a covering the semiconductor layer 322a, the first gate electrode layer 327a, and the second gate electrode layer 328a is formed, and an impurity element imparting one conductivity type is introduced to the semiconductor layer 322b to form an impurity region. In the step shown in FIG. 2D, an impurity element imparting n-type conductivity (in this embodiment mode, phosphorus (P)) is used as the impurity element imparting one conductivity type in order to form an n-channel transistor.

Figure 2D:
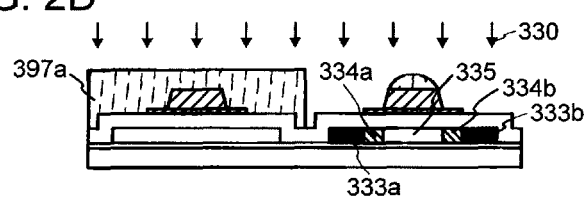
Figure 2E:
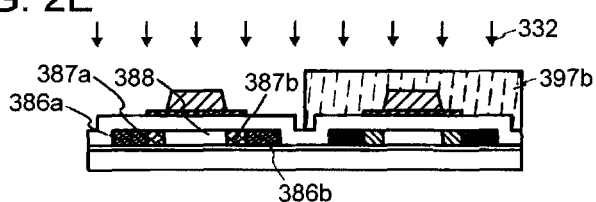

An impurity element 330 imparting n-type conductivity is added to the semiconductor layer 322b provided with the first gate electrode layer 327b, the second gate electrode layer 328b, and the mask layer 329b, thereby a first n-type impurity region 334a, a first n-type impurity region 334b, a second n-type impurity region 333a, and a second n-type impurity region 333b are formed (see FIG. 2D). Moreover, the semiconductor layer 322b of a region to which the impurity element 330 is not added corresponds to a channel forming region 335. It is to be noted that the semiconductor layer 322a is protected by the mask layer 397a from the impurity element 330.

The second n-type impurity region 333a and the second n-type impurity region 333b formed by adding the impurity element 330 imparting n-type conductivity to the semiconductor layer 322b of a region which is not covered with the first gate electrode layer 327b, the second gate electrode layer 328b, and the mask layer 329b correspond to high concentration n-type impurity regions. On the other hand, the first n-type impurity region 334a and the first n-type impurity region 334b formed by adding the impurity element 330 imparting n-type conductivity to the semiconductor layer 322b through the first gate electrode layer 327b of a region which is not covered with the second gate electrode layer 328b correspond to low concentration n-type impurity regions. In this embodiment mode, the gate electrode layer has a stacked-layer structure. By utilizing the different shapes of the first gate electrode layer 327b and the second gate electrode layer 328b, the first n-type impurity region 334a, the first n-type impurity region 334b, the second n-type impurity region 333a, and the second n-type impurity region 333b are formed in a self-aligned manner by adding the impurity element 330 imparting n-type conductivity once.

Each impurity region may be formed by adding the impurity element 330 imparting n-type conductivity a plurality of times or once. By controlling doping conditions to add the impurity element, whether the first n-type impurity regions 334a and 334b and the second n-type impurity regions 333a and 333b are formed by an adding step of once or a plurality of times can be selected.

The second n-type impurity regions 333a and 333b are high concentration n-type impurity regions which function as a source region and a drain region. On the other hand, the first n-type impurity regions 334a and 334b are low concentration n-type impurity regions which function as LDD regions. In this embodiment mode, the first n-type impurity regions 334a and 334b are Lov regions covered with the first gate electrode layer 327b with the gate insulating layer 323 interposed therebetween, which can alleviate an electric field in the vicinity of the drain region and suppress deterioration of an on current due to hot carriers.

In this embodiment mode, after the mask layers 397a and 329b are removed, a mask layer 397b covering the first gate electrode layer 327b, the second gate electrode layer 328b, and the semiconductor layer 322b is formed. As an impurity element imparting one conductivity type, an impurity element imparting p-type conductivity (in this embodiment mode, boron (B)) is added to the semiconductor layer 322a to form an impurity region. In this embodiment mode, an impurity element 332 imparting p-type conductivity is added to the semiconductor layer 322a provided with the first gate electrode layer 327a and the second gate electrode layer 328a, thereby a first p-type impurity region 387a, a first p-type impurity region 387b, a second p-type impurity region 386a, and a second p-type impurity region 386b are formed (see FIG. 2E). Moreover, the semiconductor layer 322a of a region to which the impurity element 332 is not added functions as a channel forming region 388. It is to be noted that the semiconductor layer 322b is protected by the mask layer 397b from the impurity element 332.

The second p-type impurity region 386a and the second p-type impurity region 386b formed by adding the impurity element 332 imparting p-type conductivity to the semiconductor layer 322a of a region which is not covered with the first gate electrode layer 327a and the second gate electrode layer 328a correspond to high concentration p-type impurity regions. On the other hand, the first p-type impurity region 387a and the first p-type impurity region 387b formed by adding the impurity element 332 imparting p-type conductivity to the semiconductor layer 322a though the first gate electrode layer 327a of a region which is not covered with the second gate electrode layer 328a correspond to low concentration p-type impurity regions.

Each impurity region may be formed by adding the impurity element 332 imparting p-type conductivity to the semiconductor layer 322a a plurality of times or once. In this embodiment mode, the first p-type impurity region 387a and the first p-type impurity region 387b have an impurity element imparting p-type conductivity at a concentration lower than the second p-type impurity region 386a and the second p-type impurity region 386b; however, depending on the conditions to add the impurity element, the impurity region under the first gate electrode layer 327a has a lower impurity concentration than the impurity region which is not covered with the first gate electrode layer 327a in some cases. Therefore, the first p-type impurity region 387a and the first p-type impurity region 387b have impurity elements imparting p-type conductivity at a concentration higher than or equal to the second p-type impurity region 386a and the second p-type impurity region 386b.

The first gate electrode layer 327a is etched by using the second gate electrode layer 328a as a mask; thereby a first gate electrode layer 336 is formed. The first gate electrode layer 336 has a shape in which the first gate electrode layer 327a of regions which extend to exist outside the second gate electrode layer 328a are removed, which reflects a shape of the second gate electrode layer 328a. Therefore, edge portions of the first gate electrode layer 336 and those of the second gate electrode layer 328a almost correspond to each other.

The second p-type impurity region 386a and the second p-type impurity region 386b are high concentration p-type impurity regions which function as a source and a drain. On the other hand, the first p-type impurity region 387a and the first p-type impurity region 387b are low concentration p-type impurity regions which function as LDD regions. As the first gate electrode layer 336 is formed, the first p-type impurity region 387a and the first p-type impurity region 387b are formed as Loff regions which are not covered with the first gate electrode layer 336 and the second gate electrode layer 328a with the gate insulating layer 323 interposed therebetween. The first p-type impurity region 387a or the first p-type impurity region 387b formed as the Loff regions on the drain side have an effect to reduce an off current.

Figure 2F:
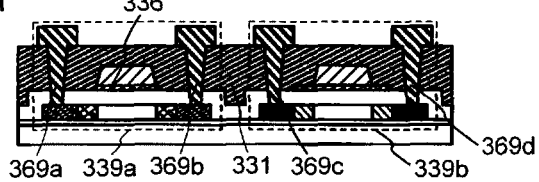

After the insulating layer 331 is formed and openings to reach each source region and drain region are formed therein, a source electrode layer or a drain electrode layer 369a and a source electrode layer or a drain electrode layer 369b which are electrically connected to the second p-type impurity region 386a and the second p-type impurity region 386b which function as a source region and a drain region respectively, and, a source electrode layer or a drain electrode layer 369c and a source electrode layer or a drain electrode layer 369d which are electrically connected to the second n-type impurity region 333a and the second n-type impurity region 333b which function as a source region and a drain region respectively are formed (see FIG. 2F). By the aforementioned steps, a p-channel thin film transistor 339a and an n-channel thin film transistor 339b are manufactured. By electrically connecting the p-channel thin film transistor 339a and the n-channel thin film transistor 339b, a CMOS structure can be manufactured.

By the invention, a highly reliable semiconductor device can be manufactured through simplified steps. Therefore, a semiconductor device and a display device with high resolution and high image quality can be manufactured at low cost and high yield.

Embodiment Mode 3

A manufacturing method of a thin film transistor of this embodiment mode is described in details with reference to FIGS. 3A to 3E. In this embodiment mode, two kinds of thin film transistors having gate electrode layers with different structures are manufactured in the same step as an example.

Similarly to Embodiment Mode 1, an insulating layer 341 as a base film is formed over a substrate 340, and then semiconductor layers 342a and 342b, and a gate insulating layer 343 covering the semiconductor layers 342a and 342b are formed. The semiconductor layers 342a and 342b may be doped with a slight amount of impurity elements (boron (B) or phosphorus (P)) for controlling a threshold voltage of a thin film transistor.

Figure 3A:
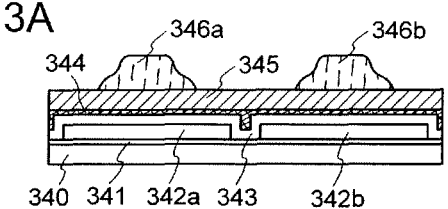
FIGS. 3A to 3E are views showing manufacturing steps of a semiconductor device of the invention.

A first conductive film 344 and a second conductive film 345 are formed over the gate insulating layer 343, and mask layers 346a and 346b are formed of resists for processing the aforementioned films into desired shapes (see FIG. 3A). Similarly to the mask layer 306 described in Embodiment Mode 1, the mask layers 346a and 346b are also formed by using an exposure mask provided with a diffraction grating pattern or an auxiliary pattern formed of a semi-transmissive film having a light intensity reducing function. With such an exposure mask, various light exposures can be more accurately controlled, which enables a resist to be processed into a more accurate shape. Therefore, when such a mask layer is used, the conductive film and the insulating film can be processed in the same step into different shapes in accordance with desired performances. As a result, thin film transistors with different characteristics, wires in different sizes and shapes, and the like can be manufactured without increasing the number of steps.

Figure 3B:
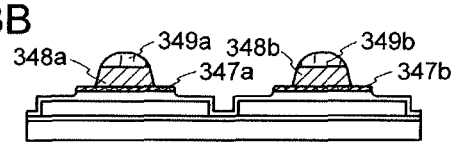
Figure 3C:
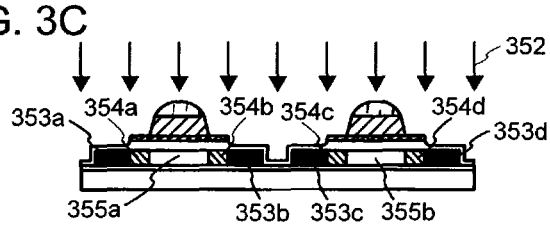

The first conductive film 344 and the second conductive film 345 are etched by using the mask layers 346a and 346b; thereby a first gate electrode layer 347a, a first gate electrode layer 347b, a second gate electrode layer 348a, and a second gate electrode layer 348b are formed (see FIG. 3B). It is to be noted that when etching the first conductive film 344 and the second conductive film 345, the mask layers 346a and 346b are also etched to be mask layers 349a and 349b respectively. The shapes of the first gate electrode layer 347a, the first gate electrode layer 347b, the second gate electrode layer 348a, and the second gate electrode layer 348b reflect the shapes of the mask layers 346a and 346b. In this embodiment mode, the widths of the first gate electrode layers 347a and 347b are wider than those of the second gate electrode layers 348a and 348b. The first gate electrode layers 347a and 347b extend to exist outside the side edge portions of the second gate electrode layers 348a and 348b respectively. For etching the first conductive film 344 and the second conductive film 345, dry etching, wet etching, or the like can be used.

By introducing impurity elements imparting one conductivity type to the semiconductor layers 342a and 342b, impurity regions are formed. In this embodiment mode, an impurity element 352 imparting n-type conductivity (in this embodiment mode, phosphorus (P)) is used as the impurity element imparting one conductivity type to form an n-channel thin film transistor. The impurity element 352 imparting n-type conductivity is added to the semiconductor layers 342a and 342b provided with the first gate electrode layer 347a, the first gate electrode layer 347b, the second gate electrode layer 348a, and the second gate electrode layer 348b, thereby a first n-type impurity region 354a, a first n-type impurity region 354b, a first n-type impurity region 354c, a first n-type impurity region 354d, a second n-type impurity region 353a, a second n-type impurity region 353b, a second n-type impurity region 353c, and a second n-type impurity region 353d are formed (see FIG. 3C). The semiconductor layers 342a and 342b of regions to which the impurity element 352 is not added function as a channel forming region 355a and a channel forming region 355b.

The second n-type impurity region 353a, the second n-type impurity region 353b, the second n-type impurity region 353c, and the second n-type impurity region 353d formed by adding the impurity element 352 imparting n-type conductivity to the semiconductor layer 342a and the semiconductor layer 342b of regions which are not covered with the first gate electrode layer 347a, the first gate electrode layer 347b, the second gate electrode layer 348a, the second gate electrode layer 348b, the mask layer 349a, and the mask layer 349b correspond to high concentration n-type impurity regions. On the other hand, the first n-type impurity region 354a, first n-type impurity region 354b, first n-type impurity region 354c, and first n-type impurity region 354d formed by adding the impurity element 352 imparting n-type conductivity to the semiconductor layer 342a and the semiconductor layer 342b through the first gate electrode layer 347a and the first gate electrode layer 347b of regions which are not covered with the second gate electrode layer 348a and the second gate electrode layer 348b correspond to low concentration n-type impurity regions. In this embodiment mode, the gate electrode layer has a stacked-layer structure. By utilizing the different shapes of the first gate electrode layer 347a, the first gate electrode layer 347b, the second gate electrode layer 348a, and the second gate electrode layer 348b, the first n-type impurity region 354a, the first n-type impurity region 354b, the first n-type impurity region 354c, the first n-type impurity region 354d, the second n-type impurity region 353a, the second n-type impurity region 353b, the second n-type impurity region 353c, and the second n-type impurity region 353d are formed in a self-aligned manner by adding the impurity element 352 imparting n-type conductivity once.

Each impurity region may be formed by adding the impurity element 352 imparting n-type conductivity a plurality of times or once. By controlling doping conditions to add the impurity element, either the first n-type impurity regions 354a, 354b, 354c, and 354d and the second n-type impurity regions 353a, 353b, 353c, and 353d are formed by an adding step of once or a plurality of times can be selected.

Figure 3D:
Figure 3E:
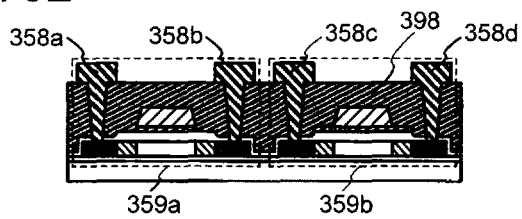

A mask layer 357 covering the first gate electrode layer 347b, the second gate electrode layer 348b, and the semiconductor layer 342b is formed and the first gate electrode layer 347a is etched by using the second gate electrode layer 348a as a mask; thereby a first gate electrode layer 356 is formed (see FIG. 3D). The first gate electrode layer 356 has a shape in which regions of the first gate electrode layer 347a which extend to exist outside the second gate electrode layer 348a are removed, which reflects a shape of the second gate electrode layer 348a. Therefore, edge portions of the first gate electrode layer 356 and those of the second gate electrode layer 348a almost correspond to each other.

Further, in this embodiment mode, the mask layer 349a and the mask layer 349b are used as protective layers for the second gate electrode layer 348a and the second gate electrode layer 348b in the step of adding the impurity element 352, and removed after the step of adding the impurity element 352.

The second n-type impurity region 353a, the second n-type impurity region 353b, the second n-type impurity region 353c, and the second n-type impurity region 353d which are high concentration n-type impurity regions function as source regions and drain regions. On the other hand, the first n-type impurity region 354a, the first n-type impurity region 354b, the first n-type impurity region 354c, and the first n-type impurity region 354d which are low concentration n-type impurity regions function as LDD regions.

As the first gate electrode layer 356 is formed, the first n-type impurity region 354a and the first n-type impurity region 354b are formed as Loff regions which are not covered with the first gate electrode layer 356 and the second gate electrode layer 348a with the gate insulating layer 343 interposed therebetween. The first n-type impurity region 354a or the first n-type impurity region 354b formed as a Loff region on a drain side has effects to alleviate an electric field in the vicinity of the drain region to prevent deterioration caused by hot carrier injection and to reduce an off current. As a result, a semiconductor device with high reliability and low power consumption can be manufactured.

On the other hand, the first n-type impurity region 354c and the first n-type impurity region 354d which are covered with the first gate electrode layer 347b with the gate insulating layer 343 interposed therebetween are Lov regions which can alleviate an electric field in the vicinity of the drain region to prevent deterioration of an on current caused by hot carrier injection.

After forming an insulating layer 398 and openings to reach respective source regions and drain regions in the insulating layer 398, a source electrode layer or a drain electrode layer 358a and a source electrode layer or a drain electrode layer 358b which are electrically connected to the second n-type impurity region 353a and the second n-type impurity region 353b respectively which function as a source region and a drain region, a source electrode layer or a drain electrode layer 358c and a source electrode layer or a drain electrode layer 358d which are electrically connected to the second n-type impurity region 353c and the second n-type impurity region 353d respectively which function as a source region and a drain region are formed. By the aforementioned steps, an n-channel thin film transistor 359a and an n-channel thin film transistor 359b are formed (see FIG. 3E). By electrically connecting the n-channel thin film transistor 359a and the n-channel thin film transistor 359b, a circuit with an NMOS structure can be manufactured.

Further, when an impurity element imparting n-type conductivity (for example, phosphorus (P)) is used as an impurity element imparting one conductivity type to be added as in this embodiment mode, an n-channel thin film transistor having an impurity region with n-type conductivity can be formed. When an impurity element imparting p-type conductivity (for example, boron (B)) is used as an impurity element imparting one conductivity type to be added, a p-channel thin film transistor having an impurity region with p-type conductivity can be similarly formed.

By the invention, a highly reliable semiconductor device can be manufactured through simplified steps. Therefore, a semiconductor device and a display device with high resolution and high image quality can be manufactured at low cost and high yield.

Embodiment Mode 4

A manufacturing method of a thin film transistor of this embodiment mode is described in details with reference to FIGS. 4A to 4F. In this embodiment mode, two kinds of thin film transistors having gate electrode layers with different structures and a capacitor are manufactured in the same step as an example.

Figure 4A:
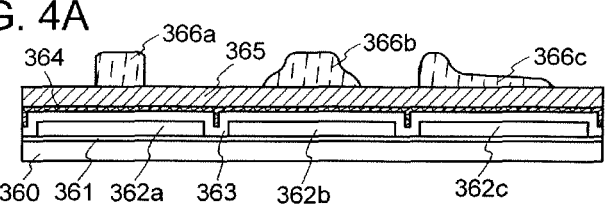
FIGS. 4A to 4F are views showing manufacturing steps of a semiconductor device of the invention.

Similarly to Embodiment Mode 1, an insulating layer 361 as a base film is formed over a substrate 360, and then semiconductor layers 362a, 362b, and 362c, and a gate insulating layer 363 covering the semiconductor layers 362a, 362b, and 362c are formed (see FIG. 4A). The semiconductor layers 362a and 362b may be doped with a slight amount of impurity element (boron (B) or phosphorus (P)) for controlling a threshold voltage of a thin film transistor.

A first conductive film 364 and a second conductive film 365 are formed over the gate insulating layer 363, and mask layers 366a, 366b, and 366c are formed of resists for processing the aforementioned films into desired shapes (see FIG. 4A). Similarly to the mask layer 306 described in Embodiment Mode 1, the mask layers 366a, 366b, and 366c are also formed by using an exposure mask provided with a diffraction grating pattern or an auxiliary pattern formed of a semi-transmissive film having a light intensity reducing function.

An exposure mask provided with a diffraction grating pattern or an auxiliary pattern formed of a semi-transmissive film having a light intensity reducing function which is used in this embodiment mode is described with reference to FIGS. 19A and 19B. By the light intensity reducing function of the semi-transmissive film, the intensity of light passing therethrough can be reduced to 10 to 70%.

Figure 19A:
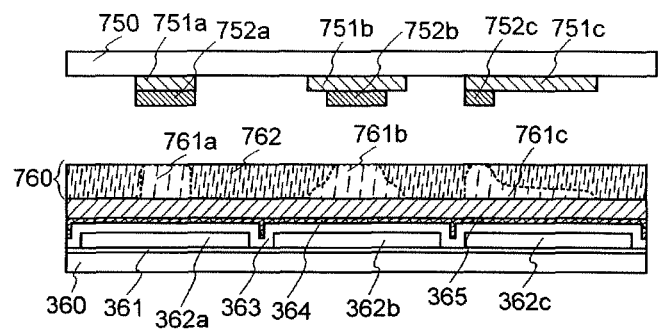
FIGS. 19A and 19B are views showing manufacturing steps of a semiconductor device of the invention.

FIG. 19A is a sectional view showing an exposure step for forming the mask layers 366a, 366b, and 366c. FIGS. 19A and 19B correspond to FIG. 4A, in which the semiconductor layers 362a, 362b, and 362c are provided over the substrate 360 and the insulating layer 361, while the gate insulating layer 363, the first conductive film 364, the second conductive film 365, and a resist film 760 are formed so as to cover the semiconductor layers 362a, 362b, and 362c. In this embodiment mode, a positive type resist in which a region exposed to light is removed is used.

An exposure mask is provided over the resist film 760 with an optical system interposed therebetween. The exposure mask has light shielding portions 752a, 752b, and 752c formed of metal films such as Cr and a portion provided with semi-transmissive films 751a, 751b, and 751c as an auxiliary pattern.

In FIG. 19A, an exposure mask has the semi-transmissive films 751a, 751b, and 751c formed of MoSiN over a light transmissive substrate 750 and the light shielding portions 752a, 752b, and 752c formed of metal films such as Cr so as to be stacked over the semi-transmissive films 751a, 751b, and 751c respectively. The semi-transmissive films 751a, 751b, and 751c can be formed by using MoSi, MoSiO, MoSiON, CrSi, or the like as well as MoSiN.

By performing light exposure to the resist films by using the exposure mask shown in FIG. 19A, a light-exposed region 762, light-unexposed regions 761a, 761b, and 761c are formed. In the case of light exposure, light passes around the light shielding portions and through the semi-transmissive films; thereby an exposed region 762 shown in FIG. 19A is formed.

Figure 19B:
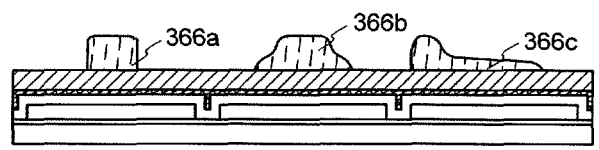

When developed, the exposed region 762 is removed and mask layers 366a, 366b, and 366c as resist patterns shown in FIG. 19B (corresponding to FIG. 4A) are obtained.

As an example of another exposure mask, an exposure mask provided with a diffraction grating pattern with a plurality of slits between the shielding portions may be used. A diffraction grating pattern is a pattern provided with at least one opening pattern such as a slit, a dot, or the like. When a plurality of openings are provided, the openings may be arranged regularly (periodically) in some order or randomly (non-periodically). By using a diffraction grating pattern having an opening (space) with a fine width of the resolution of an exposure apparatus or narrower and a non-opening (line), a substantial amount of light exposure can be changed and a thickness of an exposed resist film after development can be controlled. The resolution is the narrowest possible width formed by the exposure apparatus. In a projection exposure apparatus, a resolution R is expressed as $R = K\lambda/NA$. K is a constant, $\lambda$ is a wavelength of light used for exposure, and NA is the number of openings of the projection lens. Therefore, when the resist film is processed by the method shown in FIGS. 19A and 19B, the resist film can be selectively processed finely without increasing the number of steps; thereby various resist patterns (mask layers) can be obtained. By using such a resist pattern (mask layer), two kinds of thin film transistors having gate electrode layers with different shapes and a capacitor are formed in this embodiment mode.

In FIG. 4A, the first conductive film 364 and the second conductive film 365 are formed, and the mask layers 366a, 366b, and 366c in different shapes formed as shown in FIGS. 19A and 19B are formed.

The mask layer 366a has a shape like a rectangular solid without any steps, projections or depressions. The mask layer 366b has a shape with gentle steps at edge portions. The mask layer 366c has a shape with a projection near an edge portion.

Figure 4B:
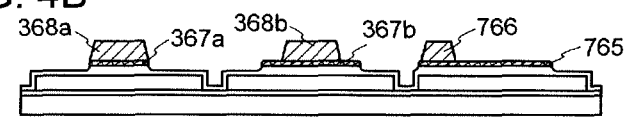

Etching treatment is carried out by using the mask layers 366a, 366b, and 366c to form a first gate electrode layer 367a, a second gate electrode layer 368a, a first gate electrode layer 367b, a second gate electrode layer 368b, a first conductive layer 765, and a second conductive layer 766 are formed (see FIG. 4B). Edge portions of the first gate electrode layer 367a and those of the second gate electrode layer 368a almost correspond to each other and are continuous. On the other hand, the first gate electrode layer 367b has a wider width than the second gate electrode layer 368b. The first gate electrode layer 367b extends to exist outside edge portions of the second gate electrode layer 368b. As for the first conductive layer 765 and the second conductive layer 766 which reflect the shape of the mask layer 366c, similarly to the first gate electrode layer 367a and the second gate electrode layer 367b, the first conductive layer 765 has a wider width than the second conductive layer 766 and extends to exist outside one edge portion of the second conductive layer 766. A top edge portion of one side of the first conductive layer 765 almost corresponds to a bottom edge portion of one side of the second conductive layer 766. As shown in FIG. 4B, the second conductive layer 766 has a narrower width than the first gate electrode layer 368b and covers a smaller region of the first conductive layer 765. Therefore, a larger region of the first conductive layer 765 is exposed.

A mask layer 396a covering the semiconductor layer 362a, the first gate electrode layer 367a, and the second gate electrode layer 368a is formed, an impurity element imparting one conductivity type is introduced to the semiconductor layer 362b provided with the first gate electrode layer 367b and the second gate electrode layer 368b and the semiconductor layer 362c provided with the first conductive layer 765 and the second conductive layer 766, thereby impurity regions are formed. In the step shown in FIG. 4C, an impurity element imparting n-type conductivity (in this embodiment mode, phosphorus (P)) is used as an impurity element imparting one conductivity type.

Figure 4C:
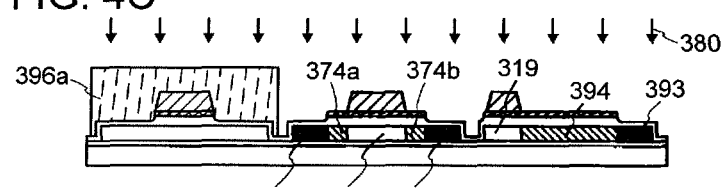

By adding an impurity element 380 imparting n-type conductivity to the semiconductor layer 362b provided with the first gate electrode 367b and the second gate electrode layer 368b and the semiconductor layer 362c over which the first conductive layer 765 and the second conductive layer 766 are provided, a first n-type impurity region 374a, a first n-type impurity region 374b, a second n-type impurity region 373a, a second n-type impurity region 373b, a first n-type impurity region 394, and a second n-type impurity region 393 are formed (see FIG. 4C). Moreover, the semiconductor layer 362b of a region to which the impurity element 380 is not added functions as a channel forming region 377. Similarly, the semiconductor layer 362c of a region to which the impurity element 380 is not added functions as a non-impurity added region 319. It is to be noted that the semiconductor layer 362a is protected by the mask layer 396a from the impurity element 380.

The second n-type impurity region 373a, the second n-type impurity region 373b, and the second n-type impurity region 393 which are formed by adding the impurity element 380 imparting n-type conductivity to the semiconductor layers 362b and 362c of regions which are not covered with the first gate electrode layer 367b, the second gate electrode layer 368b, the first conductive layer 765 and the second conductive layer 766 correspond to high concentration n-type impurity regions. On the other hand, the first n-type impurity region 374a, the first n-type impurity region 374b, and the first n-type impurity region 394 formed by adding the impurity element 380 imparting n-type conductivity through the first gate electrode layer 367b and the first conductive layer 765 of regions which are not covered with the second gate electrode layer 368b and the second conductive layer 766 correspond to low concentration n-type impurity regions. In this embodiment mode, a gate electrode layer has a stacked-layer structure. The first n-type impurity region 374a, the first n-type impurity region 374b, the first n-type impurity region 394, the second n-type impurity region 373a, the second n-type impurity region 373b, and the second n-type impurity region 393 are formed in a self-aligned manner by adding the impurity element 380 imparting n-type conductivity once by utilizing the different shapes of the first gate electrode layer 367b, the second gate electrode layer 368b, the first conductive layer 765, and the second conductive layer 766.

Each impurity region may be formed by adding the impurity element 380 imparting n-type conductivity a plurality of times or once. By controlling doping conditions to add the impurity element, whether the first n-type impurity region 374a, the first n-type impurity region 374b, the first n-type impurity region 394, the second n-type impurity region 373a, the second n-type impurity region 373b, and the second n-type impurity region 393 are formed by an adding step of once or a plurality of times can be selected.

The second n-type impurity regions 373a and 373b which are high concentration n-type impurity regions function as a source region and a drain region. On the other hand, the first n-type impurity regions 374a and 374b which are low concentration n-type impurity regions function as LDD regions.

Figure 4D:
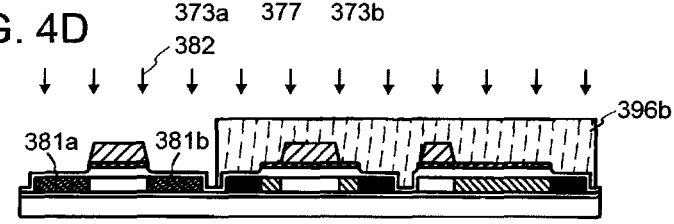

A mask layer 396b covering the semiconductor layer 362b and the semiconductor layer 362c is formed and an impurity element 382 imparting p-type conductivity (in this embodiment mode, boron (B)) is added to the semiconductor layer 362a as an impurity element imparting one conductivity type; thereby a p-type impurity region 381a and a p-type impurity region 381b are formed (see FIG. 4D). In this embodiment mode, the p-type impurity region 381a and the p-type impurity region 381b are formed in a self-aligned manner by using the first gate electrode layer 367a and the second gate electrode layer 368a as masks; therefore, a low concentration impurity region is not intentionally formed in the semiconductor layer 362a, and all the impurity regions can be high concentration impurity regions.

Figure 4E:
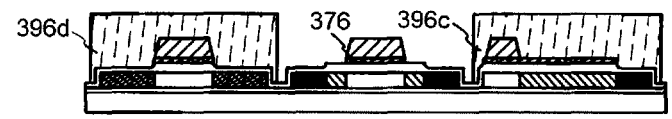
Figure 4F:
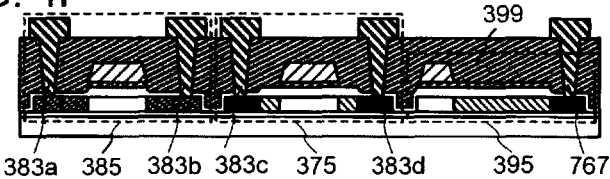

A mask layer 396d covering the semiconductor layer 362a, the first conductive layer 367a, and the second gate electrode layer 368a, and a mask layer 396c covering the semiconductor layer 362c, the first conductive layer 765, and the second conductive layer 766 are formed and the first gate electrode layer 367b is etched by using the second gate electrode layer 368b as a mask; thereby a first gate electrode layer 376 is formed (see FIG. 4E). The first gate electrode layer 376 has a shape in which the first gate electrode layer 367b of regions which extend to exist outside the second gate electrode layer 368b are removed, which reflects a shape of the second gate electrode layer 368b. Therefore, edge portions of the first gate electrode layer 376 and those of the second gate electrode layer 368b almost correspond to each other.

As the first gate electrode layer 376 is formed, the first n-type impurity region 374a and the first n-type impurity region 374b are formed as Loff regions which are not covered with the first gate electrode layer 376 and the second gate electrode layer 368b with the gate insulating layer 363 interposed therebetween. The first n-type impurity region 374a or the first n-type impurity region 374b formed as a Loff region on a drain side has effects to alleviate an electric field in the vicinity of the drain region to prevent deterioration caused by hot carrier injection and to reduce an off current. As a result, a semiconductor device with high reliability and low power consumption can be manufactured.

After forming an insulating layer 399 and forming openings to reach respective source regions and drain regions in the insulating layer 399 and an opening to reach the second n-type impurity region 393, a source electrode layer or a drain electrode layer 383a and a source electrode layer or a drain electrode layer 383b which are electrically connected respectively to the p-type impurity region 381a and the p-type impurity region 381b which function as a source region and a drain region, a source electrode layer or a drain electrode layer 383c, a source electrode layer or a drain electrode layer 383d, and a wiring layer 767 which are electrically connected respectively to the second n-type impurity region 373a and the second n-type impurity region 373b which function as a source region and a drain region, and the second n-type impurity region 393 are formed. By the aforementioned steps, a p-channel thin film transistor 385 having no LDD region (what is called a single drain type transistor), an n-channel thin film transistor 375 having an LDD region in a Loff region, and a capacitor 395 are formed (see FIG. 4F).

When an impurity element imparting n-type conductivity (for example, phosphorus (P)) is used as an impurity element imparting one conductivity type to be added, an n-channel thin film transistor having an impurity region with n-type conductivity can be formed. When an impurity element imparting p-type conductivity (for example, boron (B)) is used as an impurity element imparting one conductivity type to be added, a p-channel thin film transistor having an impurity region with p-type conductivity can be formed.

By controlling doping conditions or the like to add an impurity element imparting one conductivity type, all the impurity regions can be formed as high concentration impurity regions without forming a low concentration impurity region.

In the same step, thin film transistors having gate electrode layers and impurity regions with different structures can be formed. Moreover, in the case of forming a wire or the like in the same step, a wire with lower resistance or a wire in a smaller size can be formed. As a result, further fineness can be achieved, which realizes higher precision, higher performance, lighter weight, and the like of a semiconductor device.

The capacitor 395 can have a shape in which the first conductive layer 765 is wider than the second conductive layer 766; therefore, a region of the first n-type impurity region 394 can be formed wide. Capacitance formed between the impurity region and the gate electrode is larger than that formed between the non-impurity added region 319 and the gate electrode. Thus, by forming the first n-type impurity region 394 under the first conductive layer 765 wider, large capacitance can be obtained.

In this manner, by using this embodiment mode, a conductive film and an insulating film can be processed into different shapes in accordance with a desired performance in the same step. Therefore, thin film transistors with different characteristics, wires in different sizes or shapes, or the like can be manufactured without increasing the number of steps. This embodiment mode can be freely implemented in combination with each of Embodiment Modes 1 to 3.

By the invention, a highly reliable semiconductor device can be manufactured through simplified steps. Therefore, a semiconductor device and a display device with high resolution and high image quality can be manufactured at low cost and high yield.

Embodiment Mode 5

A manufacturing method of a display device of this embodiment mode is described in details with reference to FIGS. 5A to 10B and 20A to 21B.

Figure 20A:
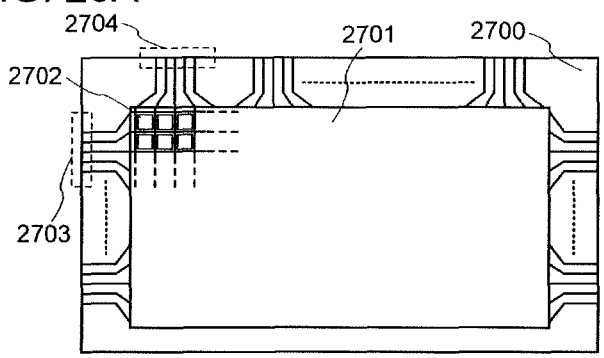
FIGS. 20A to 20C are top plan views of a display device of the invention.

FIG. 20A is a top plan view showing a configuration of a display panel of the invention. A pixel portion 2701 in which pixels 2702 are arranged in matrix, a scan line input terminal 2703, and a signal line input terminal 2704 are formed over a substrate 2700 having an insulating surface. The number of pixels may be any number in accordance with various standards. An XGA display requires 1024×768×3 (RGB), an UXGA display requires 1600×1200×3 (RGB), and a full-spec high vision display requires 1920×1080×3 (RGB) pixels.

The pixels 2702 are arranged in matrix in accordance with scan lines extending from the scan line input terminal 2703 and signal lines extending from the signal line input terminal 2704 intersecting each other. Each pixel 2702 has a switching element and a pixel electrode layer connected thereto. A typical example of a switching element is a TFT. Each pixel can be independently controlled by an externally inputted signal due to a structure of a TFT where a gate electrode layer side is connected to the scan line while a source or drain side is connected to the signal line.

Figure 21A:
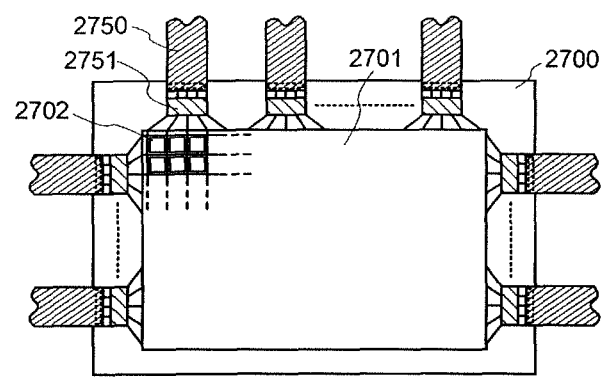
FIGS. 21A and 21B are top plan views of a display device of the invention.
Figure 21B:
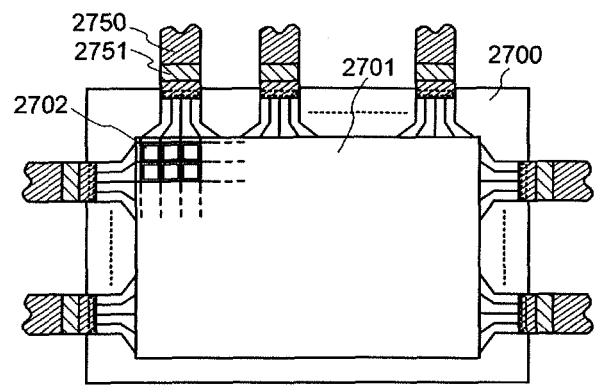

FIG. 20A shows a configuration of a display panel in which signals inputted to the scan line and the signal line are controlled by external driver circuits. Meanwhile, as shown in FIG. 21A, a driver IC 2751 may be mounted on the substrate 2700 by a COG (Chip On Glass) method. As another mode, a TAB (Tape Automated Bonding) method as shown in FIG. 21B may also be used. The driver IC may be formed over a single crystalline semiconductor substrate or formed of TFTs over a glass substrate. In each of FIGS. 21A and 21B, the driver IC 2751 is connected to an FPC (Flexible Printed Circuit) 2750.

Figure 20B:
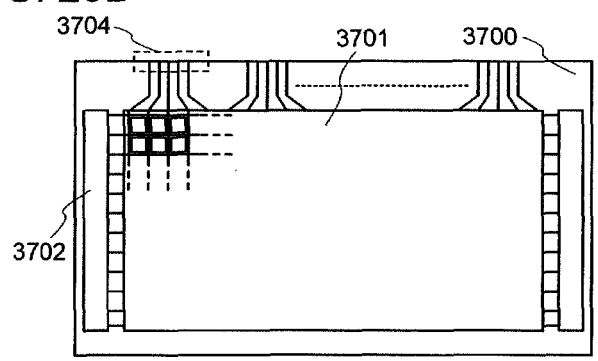

When a TFT provided in a pixel is formed of a crystalline semiconductor, a scan line driver circuit 3702 may be formed over a substrate 3700 as shown in FIG. 20B. In FIG. 20B, a pixel portion 3701 is controlled by an external driver circuit which is connected to a signal line input terminal 3704 similarly to FIG. 20A. When a TFT provided in a pixel is formed of a polycrystalline (microcrystalline) semiconductor, a single crystalline semiconductor, or the like having high mobility, a scan line driver circuit 4702 and a signal line driver circuit 4704 can be formed to be integrated over a substrate 4700 in FIG. 20C.

Over a substrate 100 having an insulating surface, a base film 101a is formed with a thickness of 10 to 200 nm (preferably, 50 to 150 nm) using a silicon nitride oxide (SiNO) film by a sputtering method, a physical vapor deposition (PVD) method, a chemical vapor deposition (CVD) method such as a low-pressure CVD (LPCVD) method or a plasma CVD method, or the like, and a base film 101b is stacked thereover with a film thickness of 50 to 200 nm (preferably, 100 to 150 nm) using a silicon oxynitride (SiON) film as a base film. Alternatively, acrylic acid, methacrylic acid, or a derivative thereof, a heat-resistant high molecular compound such as polyimide, aromatic polyamide, or polybenzimidazole, or a siloxane resin may be used. Note that the siloxane resin corresponds to a resin containing a Si—O—Si bond. The skeletal structure of siloxane is constituted by a bond of silicon (Si) and oxygen (O). As a substituent, an organic group containing at least hydrogen (for example, an alkyl group or an aromatic hydrocarbon) is used. As the substituent, a fluoro group may also be used. Alternatively, an organic group containing at least hydrogen, and a fluoro group may be used as the substituent. Further, a vinyl resin such as polyvinyl alcohol, or polyvinyl butyral; or a resin material such as epoxy resin, phenol resin, novolac resin, acrylic resin, melamine resin, or urethane resin is used. Further, an organic material such as benzocyclobutene, parylene, fluorinated-arylene-ether, or polyimide, or a composition material containing a water-soluble homopolymer and a water-soluble copolymer may be used. Further, an oxazole resin can also be used, for example, a photosensitive polybenzoxazole or the like can be used. A photosensitive polybenzoxazole has a low dielectric constant (a dielectric constant of 2.9 at 1 MHz and a normal temperature), high heat resistance (TGA: Thermal Gravity Analysis) thermal decomposition temperature of 550° C. with the rise in temperature at 5° C./min), and a low moisture absorbing rate (0.3% in 24 hours at a normal temperature). It is to be noted that the moisture absorbing rate is expressed in a percentage of a ratio of the weight increase to the original weight after soaking a sample of a certain size in distilled water for some period of time.

A droplet discharge method, a printing method (a method for forming a pattern, such as screen printing or offset printing), a coating method such as a spin coating method, a dipping method, or the like may also be used. In this embodiment mode, the base films 101a and 101b are formed by a plasma CVD method. The substrate 100 may be a glass substrate, a quartz substrate, a silicon substrate, a metal substrate, or a stainless steel substrate having a surface covered with an insulating film. Further, a plastic substrate having heat resistance which can resist a processing temperature of this embodiment mode or a flexible substrate such as a film may also be used. As a plastic substrate, a substrate formed of PET (polyethylene terephthalate), PEN (polyethylene naphthalate), or PES (polyether sulfone) may be used, and as a flexible substrate, a synthetic resin such as acrylic can be used. Since the display device manufactured in the present embodiment mode has a structure in which light from the light-emitting element is emitted through the substrate 100, the substrate 100 is required to have a light transmissive property.

The base film can be formed of a single layer or a stacked-layer structure of as two or three layers of silicon oxide, silicon nitride, silicon oxynitride, silicon nitride oxide, or the like. Note that in this specification, silicon oxynitride means a substance where the composition ratio of oxygen is higher than that of nitrogen, which can also be referred to as silicon oxide containing nitrogen. Meanwhile, silicon nitride oxide means a substance where the composition ratio of nitrogen is higher than that of oxygen, which can also be referred to as silicon nitride containing oxygen. In this embodiment, a silicon nitride oxide film with a thickness of 50 nm is formed over the substrate with $SiH_4$, $NH_3$, $N_2O$, $N_2$, and $H_2$ used as a reaction gas, and a silicon oxynitride film with a thickness of 100 nm is formed with $SiH_4$ and $N_2O$ used as a reaction gas. Alternatively, a silicon nitride oxide film with a thickness of 140 nm and a silicon oxynitride film with a thickness of 100 nm may be stacked.

Subsequently, a semiconductor film is formed over the base films. The semiconductor film may be formed by a known method (a sputtering method, an LPCVD method, a plasma CVD method, or the like) to have a thickness of 25 to 200 nm (preferably, 30 to 150 nm). In this embodiment mode, the semiconductor film is preferably formed of a crystalline semiconductor film that is obtained by laser crystallization of an amorphous semiconductor film.

The semiconductor film may be formed of an amorphous semiconductor (hereinafter also referred to as AS) that is formed by a vapor deposition method or a sputtering method using a semiconductor material gas typified by silane and germane; a polycrystalline semiconductor that is obtained by crystallizing the amorphous semiconductor utilizing optical energy or heat energy; a semi-amorphous semiconductor (also called microcrystal, hereinafter also referred to as SAS), or the like.

SAS is a semiconductor having an intermediate structure between amorphous and crystalline (including single crystalline and polycrystalline) structures. This semiconductor has a third state that is stable in free energy, and it includes a crystalline region that has a short range order and a lattice distortion. SAS is obtained by glow discharge decomposition (plasma CVD) of gas containing silicon. As the gas containing silicon, not only SiH4 but also $Si_2H_6$, $SiH_2Cl_2$, $SiHCl_3$, $SiCl_4$, $SiF_4$, or the like may be used. In addition, $F_2$ or $GeF_4$ may be mixed into the gas. The gas containing silicon may be diluted with $H_2$ or $H_2$ and one or more kinds of rare gas elements selected from He, Ar, Kr, and Ne. When a rare gas element such as helium, argon, krypton, and neon is mixed into SAS, the lattice distortion is further increased and the stability is thus enhanced, leading to a high quality SAS. Alternatively, as the semiconductor film, an SAS layer formed of a fluorine-based gas and an SAS layer made of a hydrogen-based gas may be stacked.

An amorphous semiconductor is typified by hydrogenated amorphous silicon, and a crystalline semiconductor is typified by polysilicon. Polysilicon (polycrystalline silicon) includes a so-called high temperature polysilicon that mainly uses polysilicon formed at a process temperature of 800° C. or higher, a so-called low temperature polysilicon that mainly uses polysilicon formed at a process temperature of 600° C. or lower, a polysilicon that is obtained by crystallization after adding an element for promoting crystallization, and the like. Needless to say, a semi-amorphous semiconductor or a semiconductor partially including a crystalline phase may also be used as set forth above.

When a crystalline semiconductor film is formed as the semiconductor film, the crystalline semiconductor film may be formed by a known method (laser crystallization, thermal crystallization, thermal crystallization using an element for promoting crystallization such as nickel, or the like). Alternatively, a microcrystalline semiconductor that is an SAS may be irradiated with a laser to be crystallized, thereby increasing the crystallinity. If an element for promoting crystallization is not introduced, an amorphous semiconductor film is heated at 500° C. for one hour in a nitrogen atmosphere before being irradiated with a laser beam, so that hydrogen included in the amorphous semiconductor film may be released to lower the hydrogen concentration to $1 \times 10^{20}$ atoms/$cm^3$ or lower. This is performed because the amorphous semiconductor film is damaged when the film containing much hydrogen is irradiated with laser. The heat treatment for crystallization may be performed using a heating furnace, laser irradiation, irradiation with light emitted from a lamp (hereinafter also referred to as lamp annealing), or the like. The heat treatment may also be performed by RTA such as GRTA (Gas Rapid Thermal Annealing) and LRTA (Lamp Rapid Thermal Annealing). The GRTA is heat treatment using a high temperature gas, and the LRTA is heat treatment using lamp light.

In the step of forming a crystalline semiconductor layer by crystallizing an amorphous semiconductor layer, an element (also called a catalyst element or a metal element) which promotes crystallization may be added to the amorphous semiconductor layer and crystallization may be performed by heat treatment (3 minutes to 24 hours at 550 to 750° C.). One or a plurality selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used as a metal element which promotes crystallization of silicon.

A metal element may be introduced to the amorphous semiconductor film by any method as long as the metal element can exist on the surface or inside of the amorphous semiconductor film, and for example, sputtering, CVD, plasma treatment (including plasma CVD), adsorption, or a method for applying a metal salt solution can be used. Among them, the method using a solution is simple, and is effective in easily adjusting the concentration of the metal element. Further, at this time, an oxide film is desirably formed by UV ray irradiation in an oxygen atmosphere, thermal oxidation, treatment with ozone water or hydrogen peroxide including hydroxyl radical, or the like in order to improve the wettability of the surface of the amorphous semiconductor film and to spread the water solution over the entire surface of the amorphous semiconductor film.

In order to remove or reduce the element which promotes crystallization from the crystalline semiconductor layer, a semiconductor layer containing an impurity element is formed in contact with the crystalline semiconductor layer and used as a gettering sink. The impurity element may be an impurity element imparting n-type conductivity, an impurity element imparting p-type conductivity, a rare gas element, or the like. For example, one or a plurality of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed in a crystalline semiconductor layer containing an element which promotes crystallization, and thermal treatment is performed (3 minutes to 24 hours at 550 to 750° C.). The element which promotes crystallization contained in the crystalline semiconductor layer moves into the semiconductor layer containing a rare gas element. The element which promotes crystallization contained in the crystalline semiconductor layer is removed or reduced. After that, the semiconductor layer containing a rare gas element which is a gettering sink is removed.

By scanning such laser and the semiconductor film relatively, laser irradiation can be performed. Further, in the laser irradiation, a marker may be formed to overlap beams with high precision and control positions for starting and finishing laser irradiation. The marker may be formed over the substrate at the same time when an amorphous semiconductor film is formed.

In the case of laser irradiation, a continuous wave laser beam (CW laser beam) or a pulsed wave laser beam (pulsed laser beam) can be used. As the laser beam, a laser beam oscillated from one or a plurality selected from a gas laser such as Ar laser, Kr laser, and excimer laser, a single crystal of YAG laser, YVO$_4$ laser, forstelite (Mg$_2$SiO$_4$), YLF laser, YAlO$_3$ laser, GdVO$_4$ laser, or a polycrystal (ceramic) of YAG, Y$_2$O$_3$, YVO$_4$, YAlO$_3$, or GdVO$_4$ doped with one or more kinds of Nd, Yb, Cr, Ti, Ho, Er, Tm, and Ta as a dopant, glass laser, ruby laser, alexandrite laser, Ti: sapphire laser, copper vapor laser, and gold vapor laser can be used. By emitting a laser beam of second to fourth wave of a fundamental wave in addition to a fundamental harmonic of the foregoing laser beams, a crystal having a large grain diameter can be obtained. For instance, a second harmonic (532 nm) or a third harmonic (355 nm) of Nd:YVO$_4$ laser (fundamental, 1064 nm) can be used. This laser can be emitted by CW or pulsed oscillation. In the case of CW, the laser requires power density of approximately from 0.01 to 100 MW/cm$^2$ (preferably, approximately from 0.1 to 10 MW/cm$^2$). The laser is emitted at a scanning rate of approximately 10 to 2000 cm/sec.

Note that, a laser using, as a medium, single crystal of YAG, YVO$_4$, forsterite (Mg$_2$SiO$_4$), YAlO$_3$, or GdVO$_4$ or polycrystal (ceramic) of YAG; Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti:sapphire laser can be continuously oscillated. Further, pulse oscillation thereof can be performed with an oscillation frequency of 10 MHz or more by carrying out Q switch operation, mode synchronization, or the like. When a laser beam is oscillated with a repetition rate of 10 MHz or more, a semiconductor film is irradiated with a next pulse during the semiconductor film is melted by the laser beam and then is solidified. Therefore, differing from a case of using a pulse laser with a low repetition rate, a solid-liquid interface can be continuously moved in the semiconductor film so that crystal grains, which continuously grow toward a scanning direction, can be obtained.

When ceramic (polycrystal) is used as a medium, the medium can be formed to have a free shape for short time at low cost. When using a single crystal, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal; therefore, there is a limit in improvement in output of a laser by increasing the concentration to some extent. However, in the case of the ceramic, the size of a medium can be significantly increased as compared with the case of the single crystal, and therefore, drastic improvement in output of a laser can be expected.

Further, in the case of the ceramic, a medium with a parallel six-hedron shape or a cuboid shape can be easily formed. In a case of using a medium having such a shape, when oscillated light is made travel in zigzag inside of the medium, a long path of the oscillated light can be obtained. Therefore, amplitude is increased and a laser beam can be oscillated at high output. Furthermore, a cross sectional shape of a laser beam emitted from a medium having such a shape is a quadrangular shape, and therefore, as compared with a laser beam with a circular shape, the laser beam with the quadrangular shape in cross section have an advantage to be shaped into a linear beam. By shaping a laser beam emitted in the above described manner using an optical system, a linear beam with 1 mm or less in length of a short side and several mm to several m in length of a long side can be easily obtained. In addition, when a medium is uniformly irradiated with excited light, a linear beam is emitted with a uniform energy distribution in a long side direction. Further, it is preferable that a semiconductor film be irradiated with laser at an incident angle $\theta$ ($0<\theta<90°$); thereby an interference of the laser can be prevented.

By irradiating the semiconductor film with this linear beam, the entire surface of the semiconductor film can be more evenly annealed. When the linear beam is required to be even to the opposite ends, slits are provided at the opposite ends to shield light of energy attenuation portions or other measures are required to be taken.

The semiconductor film obtained in this manner is annealed with the linear beam having uniform intensity, and a semiconductor device is manufactured by using the semiconductor film. Then, the characteristic of the semiconductor device can be favorable and uniform.

Further, the semiconductor film may be irradiated with the laser beam in the atmosphere of an inert gas such as a rare gas or nitrogen. Accordingly, roughness of the surface of the semiconductor can be suppressed by an irradiation of the laser beam, and variation of a threshold value generated by variation of interface state density can be suppressed.

An amorphous semiconductor film may be crystallized by the combination of thermal treatment and laser light irradiation, or one of thermal treatment and laser light irradiation may be performed a plurality of times.

In this embodiment mode, an amorphous semiconductor film is formed over the base film 101b and the amorphous semiconductor film is crystallized to form a crystalline semiconductor film. As the amorphous semiconductor film, amorphous silicon formed using a reaction gas of $SiH_4$ and $H_2$ is used. In this embodiment mode, the base film 101a, the base film 101b, and the amorphous semiconductor film are continuously formed by changing a reaction gas without breaking the vacuum in the same chamber at the same temperature of 330° C.

After removing an oxide film formed over the amorphous semiconductor film, an oxide film is formed with a thickness of 1 to 5 nm by UV light irradiation in an oxygen atmosphere, a thermal oxidization method, treatment with ozone water or hydrogen peroxide including hydroxyl radical, or the like. In this embodiment mode, Ni is used as an element for promoting crystallization. An aqueous solution containing 10 ppm of Ni acetate is applied by a spin coating method.

In this embodiment mode, after performing thermal treatment at 750° for 3 minutes by an RTA method, the oxide film formed over the semiconductor film is removed and laser light irradiation is applied. The amorphous semiconductor film is crystallized by the aforementioned crystallization treatment to be a crystalline semiconductor film.

In the case of performing crystallization using a metal element, a gettering step is performed for reducing or removing the metal element. In this embodiment mode, the metal element is captured using the amorphous semiconductor film as a gettering sink. First, an oxide film is formed over the crystalline semiconductor film by UV light irradiation in an oxygen atmosphere, a thermal oxidation method, treatment with ozone water or hydrogen peroxide including hydroxyl radical, or the like. It is desirable that the oxide film be formed thicker by heat treatment. Subsequently, an amorphous semiconductor film is formed with a thickness of 50 nm by a plasma CVD method (with a condition of this embodiment mode as 350 W, 35 Pa, deposition gas: $SiH_4$ (flow rate of 5 sccm) and Ar (flow rate 1000 sccm)).

After that, thermal treatment is performed at 744° C. for three minutes by an RTA method to reduce or remove the metal element. The thermal treatment may be performed in a nitrogen atmosphere. Then, the amorphous semiconductor film as a gettering sink and an oxide film formed over the amorphous semiconductor film are removed with hydrofluoric acid and the like, thereby a crystalline semiconductor film 102 in which the metal element is reduced or removed can be obtained (see FIG. 5A). In this embodiment mode, the amorphous semiconductor film as a gettering sink is removed using TMAH (Tetramethyl ammonium hydroxide).

The semiconductor film obtained in this manner may be doped with a slight amount of impurity element (boron or phosphorus) for controlling a threshold voltage of a thin film transistor. This doping of impurity element may be performed to an amorphous semiconductor film before a crystallization step. When impurity element are doped in a state of the amorphous semiconductor film, the impurity can be activated by heat treatment for crystallization later. Further, a defect and the like generated at the doping can be improved as well.

Subsequently, the crystalline semiconductor film 102 is processed into a desired shape. In this embodiment mode, after removing the oxide film formed over the crystalline semiconductor film 102, an oxide film is newly formed. Then, the oxide film is etched into a desired shape; thereby a semiconductor layer 103, a semiconductor layer 104, a semiconductor layer 105, and a semiconductor layer 106 are formed.

An etching process may adopt either plasma etching (dry etching) or wet etching. However, in the case of processing a large area substrate, plasma etching is suitable. As an etching gas, a gas containing fluorine such as $CF_4$ and $NF_3$ or a gas containing chlorine such as $Cl_2$ and $BCl_3$ is used, to which an inert gas such as He and Ar may be appropriately added. Further, in the case of applying an etching process by atmospheric pressure discharge, local discharge can be realized, thereby a mask layer is not required to be formed over an entire surface of the substrate.

In the invention, a conductive layer for forming a wiring layer or an electrode layer, a mask layer for forming a predetermined pattern, or the like may be formed by a method where a pattern can be selectively formed such as a droplet discharge method. In the droplet discharge (ejecting) method (also referred to as an inkjet method depending on the system thereof), a predetermined pattern (a conductive layer, an insulating layer, and the like) can be formed by selectively discharging (ejecting) droplets of a composition prepared for a specific purpose. At this time, a process for controlling wettability and adhesion may be performed to a region for forming a pattern. Additionally, a method for transferring or drawing a pattern, for example, a printing method (a method for forming a pattern such as screen printing and offset printing) or the like can be used.

In this embodiment mode, a resin material such as an epoxy resin, an acrylic resin, a phenol resin, a novolac resin, a melamine resin, or a urethane resin is used for a mask to be used. Alternatively, the mask may be formed using an organic material such as benzocyclobutene, parylene, fluorinated arylene ether and polyimide having a light transmitting property; a compound material formed by polymerization of siloxane polymers or the like; a composition material containing a water-soluble homopolymer and a water-soluble copolymer; and the like. In addition, a commercially available resist material containing a photosensitive agent may also be used. For example, a novolac resin and a naphthoquinonediazide compound that is a photosensitive agent, which are typical positive type resist; a base resin that is a negative type resist, diphenylsilanediol, an acid generating material, and the like may be used. In the case where a droplet discharge method is used, even when any material is used, the surface tension and the viscosity are appropriately adjusted by controlling the solvent concentration, adding a surfactant, or the like.

The oxide film over the semiconductor layer is removed to form a gate insulating layer 107 covering the semiconductor layer 103, the semiconductor layer 104, the semiconductor layer 105, and the semiconductor layer 106. The gate insulating layer 107 is formed of an insulating film containing silicon with a thickness of 10 to 150 nm using a plasma CVD method or a sputtering method. The gate insulating layer 107 may be formed of a known material such as an oxide material or nitride material of silicon, typified by silicon nitride, silicon oxide, silicon oxynitride, and silicon nitride oxide and may be stacked layers or a single layer. Three stacked layers of a silicon nitride film, a silicon oxide film, and a silicon nitride film are used for the gate insulating layer. Alternatively, a single layer or stacked layers of two layers of the aforementioned film or a silicon oxynitride film may be employed as well. Furthermore, a thin silicon oxide film may be formed between the semiconductor layer and the gate insulating layer with a thickness of 1 to 100 nm, preferably 1 to 10 nm, and more preferably 2 to 5 nm. As a method for forming the thin silicon oxide film, the surface of the semiconductor region is oxidized by a GRTA method, an LRTA method, or the like to form a thermal oxide film is formed, thereby a silicon oxide film with a thin thickness can be formed. Note that a rare gas element such as argon may be contained in a reaction gas so as to be mixed into an insulating film to be formed in order to form a dense insulating film having a little gate leak current at low film deposition temperature.

Subsequently, a first conductive film 108 with a thickness of 20 to 100 nm and a second conductive film 109 with a thickness of 100 to 400 nm, each of which is used as a gate electrode layer are stacked over the gate insulating layer 107 (see FIG. 5B). The first conductive film 108 and the second conductive film 109 can be formed by a known method such as a sputtering method, a vapor deposition method, or a CVD method. The first conductive film 108 and the second conductive film 109 may be formed of an element selected from tantalum (Ta), tungsten (W), titanium (Ti), molybdenum (Mo), aluminum (Al), copper (Cu), chromium (Cr), and neodymium (Nd), or an alloy material or compound material having the aforementioned element as a main component. Moreover, a semiconductor film typified by a polycrystalline silicon film which is doped with impurity element such as phosphorus or an AgPdCu alloy may be used as the first conductive film 108 and the second conductive film 109. Further, the conductive film is not limited to the two-layer structure, and for example, may have a three-layer structure in which a tungsten film with a thickness of 50 nm as a first conductive film, an alloy film of aluminum and silicon (Al—Si) with a thickness of 500 nm as a second conductive film, and a titanium nitride film with a thickness of 30 nm as the third conductive film are sequentially stacked. Moreover, in the case of the three-layer structure, tungsten nitride may be used instead of tungsten as the first conductive film; an alloy film of aluminum and titanium (Al—Ti) may be used instead of the alloy film of aluminum and silicon (Al—Si) as the second conductive film; or a titanium film may be used instead of the titanium nitride film as the third conductive film. In this embodiment mode, tantalum nitride (TaN) is formed with a thickness of 30 nm as the first conductive film 108 and tungsten (W) is formed with a thickness of 370 nm as the second conductive film 109.

Mask layers 157a, 157b, 157c, 157d, and 157e of resists for processing into desired shapes are formed over the gate insulating layer 107, the first conductive film 108, and the second conductive film 109 (see FIG. 5C). The mask layers 157a, 157b, 157c, 157d, and 157e are formed by using an exposure mask provided with a diffraction grating pattern or an auxiliary pattern formed of a semi-transmissive film with a light intensity reducing function similarly to the mask layers 306, 366a, 366b, and 366c described in Embodiment Modes 1 and 4. With such an exposure mask, various light exposures can be more accurately controlled, which enables a resist to be processed into a more accurate shape. Therefore, when such a mask layer is used, the conductive film and the insulating film can be processed in the same step into different shapes in accordance with desired performances. As a result, thin film transistors with different characteristics, wires in different sizes and shapes, and the like can be manufactured without increasing the number of steps.

Next, the first conductive layer 108 and the second conductive layer 109 are etched into desired shapes by using the mask layers 157a, 157b, 157c, 157d, and 157e, thereby first gate electrode layers 121, 122, 124, 125, and 126, and second gate electrode layers 131, 132, 134, 135, and 136 are formed (see FIG. 5D). By the step of etching the first conductive film 108 and the second conductive film 109, the mask layers 157a, 157b, 157c, 157d, and 157e are etched to be mask layers 110a, 110b, 110c, 110d, and 110e and removed later.

As an etching method, a plasma etching method, a reactive ion etching method, and an ICP (Inductively Coupled Plasma) etching method can be used. In this embodiment mode, an ICP etching method is used. The etching conditions (amount of power applied to a coil type electrode layer, amount of power applied to an electrode layer on the substrate side, an electrode temperature on the substrate side, or the like) may be appropriately controlled. The etching step may be performed a plurality of times or once as in this embodiment mode. As the etching gas, a gas containing chlorine typified by $Cl_2$, $BCl_3$, $SiCl_4$, $CCl_4$, or the like, a gas containing fluorine typified by $CF_4$, $CF_5$, $SF_6$, $NF_3$, or the like, or $O_2$ can be appropriately used. In this embodiment mode, the gate electrode layer is formed by dry etching but wet etching may also be employed.

In this embodiment mode, the first gate electrode layers and the second gate electrode layers have tapered shapes. However, the invention is not limited to this and only one side of the gate electrode layer may have a tapered shape while the other side may have a perpendicular side surface. As described in this embodiment mode, a taper angle may be different or the same between the stacked gate electrode layers. With the tapered shape, coverage of a film stacked thereover is improved and defects are reduced, which improves reliability. The shape of the gate electrode layer such as the tapered shape can be controlled finely and accurately by using a resist mask formed by the exposure process shown in FIGS. 19A and 19B as in this embodiment mode.

The gate insulating layer 107 is etched to some degree by the etching step of forming the gate electrode layer and a thickness thereof is reduced (what is called film reduction) in some cases.

Next, a mask layer 153a covering the first gate electrode layer 121, the second gate electrode layer 131, and the semiconductor layer 103, and a mask layer 153b covering the first gate electrode layer 126, the second gate electrode layer 136, and the semiconductor layer 106 are formed. Then, an impurity element imparting one conductivity type is introduced to the semiconductor layers 104 and 105 to form impurity regions. In a step shown in FIG. 6A, an impurity element imparting n-type conductivity (phosphorus (P) in this embodiment mode) is used as an impurity element imparting one conductivity type in order to form an n-channel thin film transistor.

An impurity element 152 imparting n-type conductivity is added to the semiconductor layer 104 over which the first gate electrode layer 122 and the second gate electrode layer 132 are provided and the semiconductor layer 105 over which the first gate electrode layer 124, the first gate electrode layer 125, the second gate electrode layer 134, and the second gate electrode layer 135 are provided, thereby first n-type impurity regions 145a, 145b, 148a, 148b, 148c, and 148d, and second n-type impurity regions 144a, 144b, 147a, 147b, and 147c are formed (see FIG. 6A). The semiconductor layers 104 and 105 of regions to which the impurity element 152 is not added correspond to channel forming regions 146, 149a, and 149b.

It is to be noted that the semiconductor layers 103 and 106 are protected by the mask layer 153a and 153b from the impurity element 152.

The second n-type impurity regions 144a, 144b, 147a, 147b, and 147c formed by adding the impurity element 152 imparting n-type conductivity to the semiconductor layer 104 and 105 of regions which are not covered with the first gate electrode layers 122, 124, and 125, and the second gate electrode layers 132, 134, and 135 correspond to high concentration n-type impurity regions. On the other hand, the first n-type impurity regions 145a, 145b, 148a, 148b, 148c, and 148d formed by adding the impurity element 152 imparting n-type conductivity to the semiconductor layer 104 and 105 through the first gate electrode layers 122, 124, and 125 of regions which are not covered with the second gate electrode layer 132, 134, and 135 correspond to low concentration n-type impurity regions.

In this embodiment mode, the gate electrode layer has a stacked-layer structure. By utilizing the different shapes of the first gate electrode layers 122, 124, and 125 and the second gate electrode layers 132, 134, and 135, the first n-type impurity regions 145a, 145b, 148a, 148b, 148c, and 148d, the second n-type impurity regions 144a, 144b, 147a, 147b, and 147c are formed in a self-aligned manner by adding the impurity element 152 imparting n-type conductivity once.

Each impurity region may be formed by adding the impurity element 152 imparting n-type conductivity a plurality of times or once. By controlling doping conditions to add the impurity element, whether impurity regions with different concentrations are formed by once or a plurality of adding steps can be selected.

The second n-type impurity regions 144a, 144b, 147a, 147b, and 147c which are high concentration n-type impurity regions function as source regions and drain regions. On the other hand, the first n-type impurity regions 145a, 145b, 148a, 148b, 148c, and 148d which are low concentration n-type impurity regions function as LDD regions. In this embodiment mode, the first n-type impurity regions 145a and 145b which are covered with the first gate electrode layer 122 with the gate insulating layer 107 interposed therebetween are Lov regions which can alleviate an electric field in the vicinity of the drain region to prevent deterioration of an on current caused by hot carrier injection. As a result, a thin film transistor capable of high speed operation can be formed.

In this embodiment mode also, an impurity region overlapped with a gate electrode layer with a gate insulating layer interposed therebetween is expressed as a Lov region while an impurity region which is not overlapped with a gate electrode layer with a gate insulating layer interposed therebetween is expressed as a Loff region. In FIGS. 6A and 6B, the impurity regions are expressed by hatching and white, which does not mean that an impurity element is not added to the white portion. They are expressed like this so that it is easily recognized that the concentration distribution of impurity elements in this region reflects conditions of mask or doping. It is to be noted that this is similar in the other drawings of this specification.

In this embodiment mode, $PH_3$ ($PH_3$ is diluted with hydrogen (H) by 5% as a doping gas) is used as a doping gas containing an impurity element, and the doping is conducted with the conditions of a gas flow rate of 80 sccm, a beam current of 540 μA/cm, an accelerating voltage of 70 kV, and a dose amount of $5.0 \times 10^{15}$ ions/cm$^2$. The impurity element imparting n-type conductivity is contained in the first n-type impurity regions 145a, 145b, 148a, 148b, 148c, and 148d at a concentration of about $1 \times 10^{17}$ to $5 \times 10^{18}$/cm$^3$. The impurity element imparting n-type conductivity is contained in the second n-type impurity regions 144a, 144b, 147a, 147b, and 147c at a concentration of about $5 \times 10^{19}$ to $5 \times 10^{20}$/cm$^3$.

The mask layers 153a and 153b are removed and a mask layer 155a covering the first gate electrode layer 122, the second gate electrode layer 132, and the semiconductor layer 103, and a mask layer 155b covering the first gate electrode layers 124 and 125, the second gate electrode layers 134 and 135, and the semiconductor layer 105 are formed. An impurity element imparting p-type conductivity (in this embodiment mode, boron (B)) is added as an impurity element imparting one conductivity type to the semiconductor layers 103 and 106, thereby impurity regions are formed. In this embodiment mode, an impurity element 154 imparting p-type conductivity is added to the semiconductor layer 103 over which the first gate electrode layer 121 and the second gate electrode layer 131 are provided and the semiconductor layer 106 over which the first gate electrode layer 126 and the second gate electrode layer 136 are provided, thereby first p-type impurity regions 161a, 161b, 164a, and 164b, and second p-type impurity regions 160a, 160b, 163a, and 163b are formed (see FIG. 6B). The semiconductor layer 103 or 106 of a region to which the impurity element 154 is not added becomes a channel forming region 162 or 165. It is to be noted that the semiconductor layers 104 and 105 are protected by the mask layers 155a and 155b from the impurity element 154.

The second p-type impurity regions 160a, 160b, 163a, and 163b formed by adding the impurity element 154 imparting p-type conductivity to the semiconductor layers 103 and 106 of regions which are not covered with the first gate electrode layers 121 and 126, and the second gate electrode layers 131 and 136 correspond to high concentration p-type impurity regions. On the other hand, the first p-type impurity regions 161a, 161b, 164a, and 164b formed by adding the impurity element 154 imparting p-type conductivity to the semiconductor layers 103 and 106 through the first gate electrode layers 121 and 126 of regions which are not covered with the second gate electrode layers 131 and 136 correspond to low concentration p-type impurity regions.

Each impurity region may be formed by adding the impurity element 154 imparting p-type conductivity to the semiconductor layers 103 and 106 a plurality of times or once. In this embodiment mode, the first p-type impurity regions 161a, 161b, 164a, and 164b have lower concentrations of impurity element imparting p-type conductivity than the second p-type impurity regions 160a, 160b, 163a, and 163b, however, depending on the conditions of adding the impurity element, the impurity regions under the first gate electrode layers 121 and 126 have higher concentrations of impurity element than the impurity regions which are not covered with the first gate electrode layers 121 and 126 in some cases. Therefore, there is a case where the first p-type impurity regions 161a, 161b, 164a, and 164b have concentrations of impurity element imparting p-type conductivity higher than or approximately equal to the second p-type impurity regions 160a, 160b, 163a, and 163b.

In this embodiment mode, boron (B) is used as an impurity element, therefore, diborane ($B_2H_6$) is used as a doping gas ($B_2H_6$ is diluted with hydrogen ($H_2$) by 15% as doping gas) containing an impurity element for doping at a gas flow rate of 70 sccm, with a beam current of 180 μA/cm, an acceleration voltage of 80 kV, and a dosage of $2.0 \times 10^{15}$ ions/cm$^2$. An impurity element imparting p-type conductivity is added to the second p-type impurity regions 160a, 160b, 163a, and 163b at a concentration of about $1 \times 10^{20}$ to $5 \times 10^{21}$/cm$^3$. The impurity element imparting p-type conductivity is added to the first p-type impurity regions 161b, 164a, and 164b at a concentration of about $5\times10^{18}$ to $5\times10^{19}$/cm$^3$. In this embodiment mode, the first p-type impurity regions 161a, 161b, 164a, and 164b are formed so as to have lower concentrations than the second p-type impurity regions 160a, 160b, 163a, and 163b in a self-aligned manner, which reflect the shapes of the first gate electrode layers 121 and 126, and the second gate electrode layers 131 and 136.

The second p-type impurity regions 160a, 160b, 163a, and 163b which are high concentration p-type impurity regions function as source regions and drain regions. On the other hand, the first p-type impurity regions 161a, 161b, 164a, and 164b which are low concentration p-type impurity regions function as LDD regions. The first p-type impurity regions 161a, 161b, 164a, and 164b which are covered with the first gate electrode layers 121 and 126 with the gate insulating layer 107 interposed therebetween are Lov regions, which can alleviate an electric field in the vicinity of the drain region.

A mask layer 156a covering the first gate electrode layer 121, the second gate electrode layer 131, the semiconductor layer 103, the first gate electrode layer 122, the second gate electrode layer 132, and the semiconductor layer 104, and a mask layer 156b covering the first gate electrode layer 126, the second gate electrode layer 136, and the semiconductor layer 106 are formed, and the first gate electrode layers 124 and 125 are etched by using the second gate electrode layers 134 and 135 as masks, thereby a first gate electrode layer 120a and a first gate electrode layer 120b are formed (see FIG. 7A). The first gate electrode layers 120a and 120b have shapes in which regions thereof which extend to exist outside the second gate electrode layer 134 and the second gate electrode layer 135 are removed, which reflect the shapes of the second gate electrode layer 134 and the second gate electrode layer 135. Therefore, edge portions of the first gate electrode layer 120a and the second gate electrode layer 134 and those of the first gate electrode layer 120b and the second gate electrode layer 135 almost correspond to each other.

As the first gate electrode layers 120a and 120b are formed, the first n-type impurity regions 148a, 148b, 148c, and 148d are formed as Loff regions which are not covered with the first gate electrode layers 120a and 120b with the gate insulating layer 107 interposed therebetween. The first n-type impurity region 148a, 148b, 148c, or 148d as a Loff region on a drain side has effects to alleviate an electric field in the vicinity of the drain to prevent deterioration caused by hot carrier injection and to reduce an off current. As a result, a semiconductor device with high reliability and low power consumption can be manufactured.

The mask layers 156a and 156b are removed by O$_2$ ashing or a resist peeling solution.

In order to activate an impurity element, thermal treatment or irradiation of intense light or laser light may be carried out. At the same time as the activation, plasma damage to the gate insulating layer or an interface between the gate insulating layer and the semiconductor layer can be improved.

Then, a first interlayer insulating layer covering the gate electrode layers and the gate insulating layer is formed. In this embodiment mode, the first interlayer insulating layer has a stacked-layer structure of insulating films 167 and 168 (see FIG. 7B). A silicon nitride oxide film is formed with a thickness of 200 nm as the insulating film 167 and a silicon oxynitride film is formed with a thickness of 800 nm as the insulating film 168, which are stacked. A three-layer structure covering the gate electrode layer and the gate insulating layer, constituted by a silicon oxynitride film formed with a thickness of 50 nm, a silicon nitride oxide film formed with a thickness of 140 nm, and a silicon oxynitride film formed with a thickness of 800 nm may also be employed. In this embodiment mode, the insulating films 167 and 168 are continuously formed by a plasma CVD method similarly to the base film. The insulating films 167 and 168 can be formed of a silicon nitride film, a silicon nitride oxide film, a silicon oxynitride film, a silicon oxide film, or the like by a sputtering method or a plasma CVD method, or a single layer or a stacked-layer structure of three or more layers of other insulating films containing silicon.

Further, thermal treatment is performed at 300 to 550° C. for 1 to 12 hours in a nitrogen atmosphere to hydrogenate the semiconductor layer. The temperature is preferably 400 to 500° C. This step is carried out for terminating dangling bonds in the semiconductor layer by hydrogen contained in the insulating film 167 which is an interlayer insulating layer. In this embodiment mode, the thermal treatment is carried out at 410° C.

As the insulating films 167 and 168, a material selected from aluminum nitride (AlN), aluminum oxynitride (AlON), aluminum nitride oxide (AlNO) containing more nitrogen than oxygen, aluminum oxide, diamond-like carbon (DLC), nitrogen-containing carbon (CN), polysilazane, or other substances containing an inorganic insulating material can be used. Alternatively, siloxane resin may be used. Further, an organic insulating material may be used, such as polyimide, acrylic, polyamide, polyimide amide, resist, or benzocyclobutene. Moreover, oxazole resin can also be used, which is, for example, photosensitive polybenzoxazole. Photosensitive polybenzoxazole has a low dielectric constant (a dielectric constant of 2.9 at a normal temperature at 1 MHz), high heat resistance (TGA: Thermal Gravity Analysis) thermal decomposition temperature of 550° C. with the rise in temperature at 5° C./min), and low moisture absorbing rate (0.3% in 24 hours at a normal temperature). A coating film formed by a coating method with favorable planarity may also be used.

Next, contact holes (openings) reaching the semiconductor layer are formed in the insulating films 167 and 168, and the gate insulating layer 107 by using a mask of resist. Etching may be performed once or a plurality of times depending on a selection ratio of a material to be used. The insulating films 168, 167, and the gate insulating layer 107 are removed and openings reaching the second p-type impurity regions 160a, 160b, 163a, and 163b, and the second n-type impurity regions 144a, 144b, 147a, and 147b are formed. Etching may be performed by wet etching, dry etching, or both of them. As the etching gas, a gas containing chlorine typified by Cl$_2$, BCl$_3$, SiCl$_4$, CCl$_4$, or the like, a gas containing fluorine typified by CF$_4$, SF$_6$, NF$_3$, or the like, or O$_2$ can be appropriately used. It is possible to add an inert gas to the etching gas. As an inert element to be added, one or a plurality of elements selected from He, Ne, Ar, Kr, and Xe can be used.

A conductive film is formed so as to cover the openings, and the conductive film is etched to form source electrode layers or drain electrode layers 169a, 169b, 170a, 170b, 171a, 171b, 172a, and 172b which are electrically connected to portions of respective source regions or drain regions. The source electrode layers and drain electrode layers can be formed by depositing conductive films by a PVD method, a CVD method, a vapor deposition method, or the like and then etching them into desired shapes. Furthermore, a conductive layer can be selectively formed at a predetermined position by a droplet discharge method, a printing method, an electrolytic plating method, or the like. In addition, a reflow method, a damascene method, or the like may also be employed. The source electrode layers or drain electrode layers are formed of a metal such as Ag, Au, Cu, Ni, Pt, Pd, Ir, Rh, W, Al, Ta, Mo, Cd, Zn, Fe, Ti, Si, Ge, Zr, or Ba, an alloy or a metal nitride thereof. A stacked-layer structure of the aforementioned substances may also be used. In this embodiment mode, a titanium (Ti) film is formed with a thickness of 100 nm, an alloy of aluminum and silicon (Al—Si) is formed with a thickness of 700 nm, and titanium (Ti) is formed with a thickness of 200 nm, which are then processed into desired shapes.

By the aforementioned steps, an active matrix substrate can be formed, which includes a p-channel thin film transistor 173 having a p-type impurity region in a Lov region and an n-channel thin film transistor 174 having an n-type impurity region in a Lov region in a peripheral driver circuit region 204, a multi-channel type n-channel thin film transistor 175 having an n-type impurity region in a Loff region and a p-channel thin film transistor 176 having a p-type impurity region in a Lov region in a pixel region 206 (see FIG. 7C).

The active matrix substrate can be used for a light emitting device including a self-luminous element, a liquid crystal display device including a liquid crystal element, and other display devices. Further, the active matrix substrate can be applied to various processors typified by a CPU (Central Processing Unit) or a semiconductor device such as a card incorporating an ID chip.

The structure of the thin film transistor is not limited to this embodiment mode, and may be a single gate structure having one channel forming region, a double gate structure having two channel forming regions, or a triple gate structure having three channel forming regions. Moreover, a thin film transistor in the peripheral driver circuit region may have a single gate structure, a double gate structure, or a triple gate structure.

Next, insulating films 181 and 182 are formed as second interlayer insulating layers (see FIG. 8A). FIGS. 8A and 8B show manufacturing steps of a display device, including a separating region 201 for separating the substrate by scribing, an external terminal connecting region 202 as an attaching portion of an FPC, a wiring region 203 as a peripheral wire leading region, a peripheral driver circuit region 204, and a pixel region 206. The wiring region 203 is provided with wires 179a and 179b and the external terminal connecting region 202 is provided with a terminal electrode layer 178 connected to an external terminal.

The insulating films 181 and 182 can be formed of a material selected from silicon oxide, silicon nitride, silicon oxynitride, silicon nitride oxide, aluminum nitride (AlN), aluminum oxide containing nitrogen (also called aluminum oxynitride) (AlON), aluminum nitride containing oxygen (also called aluminum nitride oxide) (AlNO), aluminum oxide, diamond-like carbon (DLC), a nitrogen-containing carbon film (CN), PSG (phosphosilicate glass), BPSG (borophosphosilicate glass), an alumina film, or other substances containing an inorganic insulating material. Alternatively, siloxane resin may also be used. Further, an organic insulating material may be used, which may be a photosensitive type or a non-photosensitive type, such as polyimide, acrylic, polyamide, polyimide amide, resist, benzocyclobutene, polysilazane, or a low dielectric constant (Low-k) material. Moreover, oxazole resin can also be used, which is, for example, photosensitive polybenzoxazole. Photosensitive polybenzoxazole has a low dielectric constant (a dielectric constant of 2.9 at a normal temperature at 1 MHz), high heat resistance (TGA: Thermal Gravity Analysis) thermal decomposition temperature of 550° C. with the rise in temperature at 5° C./min), and low moisture absorbing rate (0.3% in 24 hours at a normal temperature).

An interlayer insulating layer provided for planarization is required to be high in heat resistance, an insulating property, and a planarizing property. Therefore, a coating method typified by a spin coating method is preferably used for forming the insulating film 181. In this embodiment mode, the insulating film 181 is formed of a coated film using a siloxane resin material while the insulating film 182 is formed of a silicon nitride oxide film by a CVD method.

The insulating films 181 and 182 can be formed by a dipping method, spray coating, a doctor knife, a roll coater, a curtain coater, a knife coater, a CVD method, a vapor deposition method, or the like. The insulating films 181 and 182 may be formed by a droplet discharge method. In the case of using a droplet discharge method, a material solution can be used economically. Moreover, a method enabling a pattern to be transferred or drawn such as a droplet discharge method, for example, a printing method (a method to form a pattern such as screen printing or offset printing) can also be used.

As shown in FIG. 8B, openings are formed in the insulating films 181 and 182 which are interlayer insulating layers. The insulating films 181 and 182 are required to be etched in a wide area in a connecting region 205 (see FIG. 10A), the peripheral driver circuit region 204, the wiring region 203, the external terminal connecting region 202, the separating region 201, and the like. The connecting region 205 is a region shown in the top plan view of FIG. 10A, where a wiring layer manufactured in the same step as the source electrode layer or the drain electrode layer and a second electrode layer which later functions as an upper electrode layer of a light emitting element are electrically connected. The connecting region 205 is omitted in FIGS. 8A and 8B. Therefore, an opening is required to be formed in the insulating films 181 and 182 in the connecting region 205 as well. However, the opening area of the pixel region 206 is much smaller and finer than the opening area of the peripheral driver circuit region 204 or the like. Therefore, a margin of the etching conditions can be expanded by providing a photolithography step for forming the opening in the pixel region and a photolithography step for forming an opening in the connecting region. As a result, yield can be improved. Moreover, when the margin of etching conditions is expanded, a contact hole can be formed in the pixel region at high precision.

In specific, an opening of a wide area is formed in the insulating films 181 and 182 provided in the connecting region 205, the peripheral driver circuit region 204, the wiring region 203, the external terminal connecting region 202, and the separating region 201. For forming the opening, a mask is formed to cover the insulating films 181 and 182 in the non-opening region in the pixel region 206, the connecting region 205, the peripheral driver circuit region 204, the wiring region 203, and the external terminal connecting region 202. A parallel plate RIE apparatus or an ICP etching apparatus can be used for etching. Etching is preferably performed until the wiring layer or the insulating film 168 is over-etched. By over-etching the films in this manner, variations in film thickness and etching rate in the substrate can be reduced. In this manner, openings are formed in the connecting region 205, the peripheral driver circuit region 204, the wiring region 203, the external terminal connecting region 202, and the separating region 201. An opening 183 is formed in the external terminal connecting region 202, thereby a terminal electrode layer 178 is exposed.

After that, a fine opening, which is a contact hole, is formed in the insulating films 181 and 182 of the pixel region 206. At this time, a mask is formed to cover the insulating films 181 and 182 in the non-opening region of the pixel region 206, and the connecting region 205, the peripheral driver circuit region 204, the wiring region 203, and the external terminal connecting region 202. The mask is used for forming the opening in the pixel region 206 and is provided with a fine opening at a predetermined position. As such a mask, for example, a resist mask can be used.

By using the parallel plate RIE apparatus, the insulating films 181 and 182 are etched. It is to be noted that etching is preferably performed until the wiring layer and the insulating film 168 are over-etched. By over-etching the films in this manner, variations in film thickness and etching rate in the substrate can be reduced.

Moreover, an ICP apparatus may also be used as the etching apparatus. By the aforementioned steps, an opening 184 to reach the source electrode layer or drain electrode layer 172b is formed in the pixel region 206 (see FIG. 8B).

Etching for forming the opening may be performed a plurality of times at the same position. For example, the opening in the connecting region 205 having a wide area requires to be etched a lot. Such a wide area opening may be formed by performing etching a plurality of times. Moreover, etching may be similarly performed a plurality of times in the case of forming an opening deeper than other openings.

In this embodiment mode, the openings are formed in the insulating films 181 and 182 with a plurality of steps separately; however, they may be formed by one etching step as well. In this case, etching is performed with an ICP power of 7000 W, a bias power of 1000 W, and a pressure of 0.8 Pascal (Pa), using an etching gas including 2400 sccm of $CF_4$ and 160 sccm of $O_2$ by using an ICP apparatus. A bias power is preferably 1000 to 4000 W. The openings are formed by one etching step; therefore, it is advantageous in that the manufacturing steps can be simplified.

In the case of forming all the openings in the insulating films 181 and 182 in one step, it is preferable to use a mask layer formed of an exposure mask provided with a diffraction grating pattern or an auxiliary pattern formed of a semi-transmissive film having a light intensity reducing function. With such an exposure mask, a mask layer having regions with different thicknesses can be formed. That is, it is possible to form a mask layer thick in a region where the opening is shallow such as the opening 184 and form a mask layer thin in a region where the opening is deep such as the opening 183. When a mask layer having a gradient in thickness by the desired depth of etching is used, different depths of etching can be performed by one etching step. Therefore, in the shallow opening, as exposed wiring layer or the like is not exposed to etching treatment for a long time, damage to the wiring layer by a lot of over-etching can be prevented.

Next, a first electrode layer 185 (also called a pixel electrode layer) is formed so as to contact the source electrode layer or the drain electrode layer 172b. The first electrode layer functions as an anode or a cathode and is formed of a film containing as a main component an element selected from Ti, Ni, W, Cr, Pt, Zn, Sn, In, or Mo, an alloy material or a compound material containing the aforementioned element as a main component, such as TiN, $TiSi_xN_y$, $WSi_x$, $WN_x$, $WSi_xN_y$, and NbN, or a stacked-layer of these with a total thickness of 100 to 800 nm.

In this embodiment mode, a light emitting element is used as a display element and light emitted from the light emitting element is extracted from the first electrode layer 185 side. Therefore, the first electrode layer 185 has light transmittance. As the first electrode layer 185, a transparent conductive film is formed and etched into a desired shape (see FIG. 9A). In this embodiment mode, by forming a transparent conductive film in a desired shape over the insulating film 182, the insulating film 182 functions as an etching stopper as well when the first electrode layer 185 is etched.

In the invention, a transparent conductive film formed of a conductive material having light transmittance is preferably used in the first electrode layer 185 as a light transmissive electrode layer, for which indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like can also be used.

An example of composition ratio of a conductive material having light transmissivity is described. The composition ratio of indium oxide containing tungsten oxide is preferably 1.0 wt %:99.0 wt %=tungsten oxide:indium oxide. The composition ratio of indium zinc oxide containing tungsten oxide is preferably 1.0 wt %:0.5 wt %:98.5 wt %=tungsten oxide:zinc oxide:indium oxide. The composition ratio of indium oxide containing titanium oxide is preferably 1.0 to 5.0 wt %:99.0 to 95.0 wt %=titanium oxide:indium oxide. The composition ratio of indium tin oxide (ITO) is preferably 10.0 wt %:90.0 wt %=tin oxide:indium oxide. The composition ratio of indium zinc oxide (IZO) is preferably 10.7 wt %:89.3 wt %=zinc oxide:indium oxide. The composition ratio of indium tin oxide containing titanium oxide is preferably 5.0 wt %:10.0 wt %:85.0 wt %=titanium oxide:tin oxide:indium oxide. The aforementioned composition ratios are just examples and the composition ratio may be set appropriately.

Further, when a material such as a metal film having no light transmissivity is formed thin (preferably a thickness of about 5 to 30 nm) so as to be able to transmit light, light can be emitted from the first electrode 185. As a metal thin film which can be used for the first electrode layer 185, a conductive film formed of titanium, tungsten, nickel, gold, platinum, silver, aluminum, magnesium, calcium, lithium, or an alloy thereof, or the like can be used.

The first electrode layer 185 can be formed by a vapor deposition method, a sputtering method, a CVD method, a printing method, a droplet discharge method, or the like. In this embodiment mode, the first electrode layer 185 is formed of indium zinc oxide containing tungsten oxide by a sputtering method. The first electrode layer 185 is preferably formed with a total thickness of 100 to 800 nm, and is formed with a thickness of 125 nm in this embodiment mode.

The first electrode layer 185 may be cleaned by a polyvinyl alcohol-based porous body or polished by a CMP method so as to planarize the surface. Moreover, after polishing the first electrode layer by a CMP method, ultraviolet ray irradiation or oxygen plasma treatment may be applied to the surface of the first electrode layer 185.

After forming the first electrode layer 185, thermal treatment may be performed. By this thermal treatment, moisture contained in the first electrode layer 185 is discharged. Therefore, as the first electrode layer 185 does not generate degasification or the like, even when a light emitting material which easily deteriorates due to moisture is formed over the first electrode layer 185, the light emitting material does not deteriorate. As a result, a highly reliable display device can be manufactured.

Next, an insulating layer 186 (called a partition, a barrier, or the like) is formed to cover an edge portion of the first electrode layer 185 and the source electrode layer or the drain electrode layer (see FIG. 9B). Moreover, in the same step, insulating layers 187a and 187b are formed in the external terminal connecting region 202.

When the selection ratio between the first electrode layer 185 and the insulating layer 186 is high, the first electrode layer 185 functions as an etching stopper when forming the insulating layer 186 functioning as a partition covering a portion of the first electrode layer 185 by etching into a desired shape.

The insulating layer 186 can be formed of silicon oxide, silicon nitride, silicon oxynitride, aluminum oxide, aluminum nitride, aluminum oxynitride, other inorganic insulating materials, acrylic acid, methacrylic acid, a derivative of these, heat resistant high molecular material such as polyimide, aromatic polyamide, or polybenzimidazole, or siloxane resin. The insulating layer 186 may be formed of a photosensitive or non-photosensitive material such as acrylic and polyimide. Moreover, oxazole resin can also be used, which is, for example, photosensitive polybenzoxazole. Photosensitive polybenzoxazole has a low dielectric constant (a dielectric constant of 2.9 at a normal temperature at 1 MHz), high heat resistance (TGA: Thermal Gravity Analysis) thermal decomposition temperature of 550° C. with the rise in temperature at 5° C./min), and a low moisture absorbing rate (0.3% in 24 hours at a normal temperature). The insulating layer 186 preferably has a shape with a continuously changing curvature radius, thereby an electroluminescent layer 188 and a second electrode layer 189 can have improved coverage.

Figure 10A:
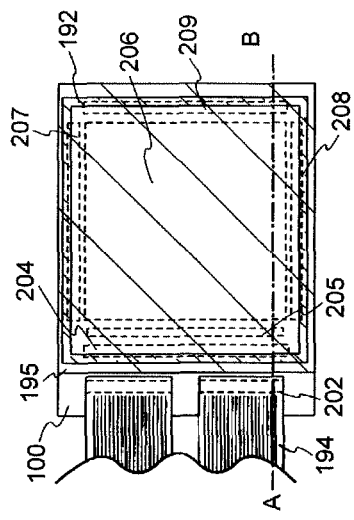
FIGS. 10A and 10B are views showing a display device of the invention.

In the connecting region 205 shown in FIG. 10A, a wiring layer formed of the same material and in the same step as the second electrode layer is electrically connected to a wiring layer formed of the same material and in the same step as the gate electrode layer. For this connection, an opening to expose the wiring layer formed of the same material in the same step as the gate electrode layer is formed. By covering a step in the periphery of the opening with the insulating layer 186 so as to smooth the step, the coverage of the second electrode layer 189 can be improved.

Further, in order to further improve the reliability, it is preferable to perform degasification by vacuum heating before forming the electroluminescent layer 188. For example, before performing evaporation of an organic compound material, it is preferable to perform thermal treatment in a reduced pressure atmosphere or an inert gas atmosphere at 200 to 400° C., or preferably 250 to 350° C. in order to remove gas contained in the substrate. Moreover, it is preferable to form the electroluminescent layer 188 by a vacuum vapor deposition method or a droplet discharge method at a reduced pressure without exposing the electroluminescent layer 188 to air. By this thermal treatment, moisture contained and attached to the conductive layer as the first electrode layer and the insulating layer (partition) can be discharged. This thermal treatment may include the prior heating step if the substrate can be carried through the vacuum chambers without breaking the vacuum, in which case the prior heating step may be performed once after the insulating layer (partition) is formed. Here, when the interlayer insulating film and the insulating layer (partition) are formed of a highly heat resistant substance, the thermal treatment step can be sufficiently performed to improve the reliability.

The electroluminescent layer 188 is formed over the first electrode layer 185. It is to be noted that only one pixel is shown in FIG. 10B, however, electric field electrode layers corresponding to each of red (R), green (G), and blue (B) are separately formed in this embodiment mode.

A material (a low or high molecular material or the like) which exhibits light emission of red (R), green (G), or blue (B) can also be formed by a droplet discharge method.

Next, a second electrode layer 189 formed of a conductive film is provided over the electroluminescent layer 188. As the second electrode layer 189, a material having a low work function (Al, Ag, Li, Ca, Mg, In, or an alloy or a compound thereof such as MgAg, MgIn, AlLi, $CaF_2$, or calcium nitride) may be used. In this manner, a light emitting element 190 formed of the first electrode layer 185, the electroluminescent layer 188, and the second electrode layer 189 is formed (see FIG. 10B).

Figure 10B:
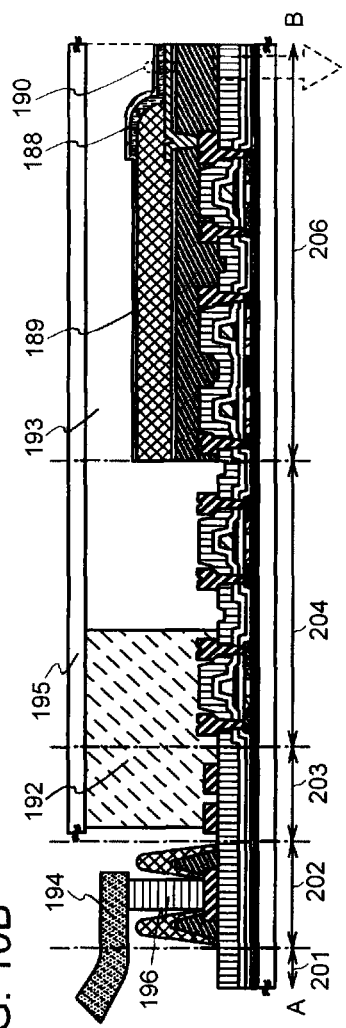
Figure 12:
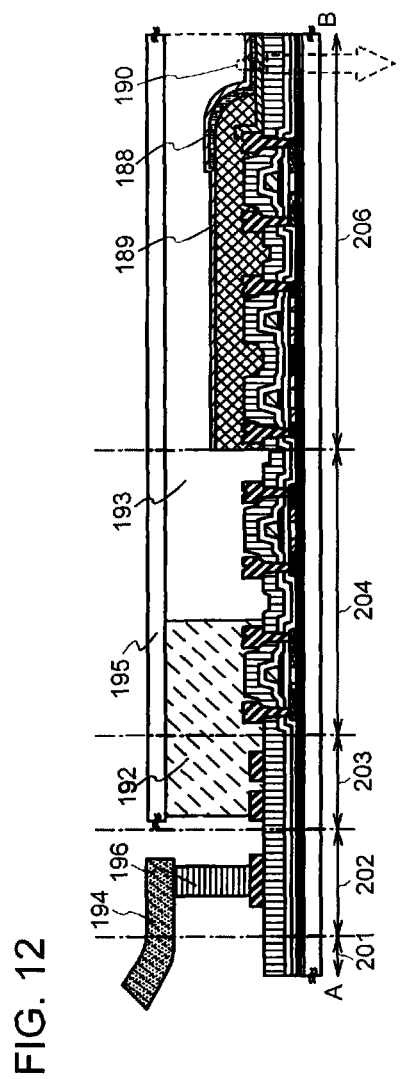
FIG. 12 is a view showing a display device of the invention.

In the display device of this embodiment mode shown in FIGS. 10A and 10B, the light emitted from the light emitting element 190 is emitted from the first electrode layer 185 side and passes through in a direction of an arrow shown in FIG. 10B.

In this embodiment mode, an insulating layer may be provided as a passivation film (protective film) over the second electrode layer 189. It is effective to provide a passivation film so as to cover the second electrode layer 189 in this manner. As the passivation film, an insulating film containing silicon nitride, silicon oxide, silicon oxynitride (SiON), silicon nitride oxide (SiNO), aluminum nitride (AlN), aluminum oxynitride (AlON), aluminum nitride oxide containing nitrogen more than oxygen (AlNO), aluminum oxide, diamond-like carbon (DLC), or a nitrogen-containing carbon film (CN) can be used as a single layer or in combination as stacked layers. Alternatively, siloxane resin can also be used.

At this time, it is preferable to use a film having favorable coverage as a passivation film, such as a carbon film. In particular, a DLC film is effectively used. A DLC film can be formed at a temperature range of a room temperature to 100° C.; therefore, it can be easily formed over the electroluminescent layer 188 with low heat resistance as well. The DLC film can be formed by a plasma CVD method (typically an RF plasma CVD method, a microwave CVD method, an electron cyclotron resonant (ECR) CVD method, a thermal filament CVD method, or the like), a combustion method, a sputtering method, an ion beam vapor deposition method, a laser vapor deposition method, or the like. A reaction gas used for forming the DLC film is a hydrogen gas and a hydrocarbon-based gas (for example, $CH_4$, $C_2H_2$, $C_6H_6$, or the like), which are ionized by glow discharging, and thus generated ions are accelerated to collide with a negatively self-biased cathode, thereby the DLC film is formed. Moreover, the CN film is preferably formed by using a $C_2H_4$ gas and a $N_2$ gas as reaction gases. The DLC film has a high blocking effect against oxygen and can suppress the oxidization of the electroluminescent layer 188. Therefore, a problem can be prevented in that the electroluminescent layer 188 is oxidized during a subsequent sealing step.

In this manner, the substrate 100 over which the light emitting element 190 is formed and a sealing substrate 195 are fixed to each other by a sealing material 192, thereby the light emitting element is sealed (see FIGS. 10A and 10B). In the display device of the invention, the sealing material 192 and the insulating layer 186 are formed apart from each other so as not to have a contact. When the sealing material and the insulating layer 186 are formed apart from each other in this manner, moisture does not easily enter even when using an insulating material formed of an organic material having a high moisture absorbing property for the insulating layer 186. Thus, deterioration of a light emitting element can be prevented and reliability of a display device is improved. As the sealing material 192, it is preferable to use visible light curable, ultraviolet curable, or heat curable resin representatively. For example, epoxy resin such as bisphenol A type liquid resin, bisphenol A type solid resin, bromine epoxy resin, bisphenol F type resin, bisphenol AD type resin, phenol resin, cresol resin, novolac resin, cyclic aliphatic epoxy resin, epi-bis epoxy resin, glycidyl ester based resin, glycidyl amine based resin, heterocyclic epoxy resin, or modified epoxy resin can be used. It is to be noted that a region surrounded by the sealing material may be filled with a filling material 193.

Alternatively, the filling material 193 may fill a region with nitrogen or the like by sealing the substrates in a nitrogen atmosphere. As a bottom emission type is employed in this embodiment mode, the filling material 193 is not required to have light transmissivity. However, in the case of extracting light through the filling material 193, the filling material 193 is required to have light transmissivity. Typically, visible light, ultraviolet ray, or heat curable epoxy resin is preferably used. By the aforementioned steps, a display device having a display function using a light emitting element in this embodiment mode is completed. The filling material can be dropped in a liquid state so as to be filled in the display device.

Figure 24:
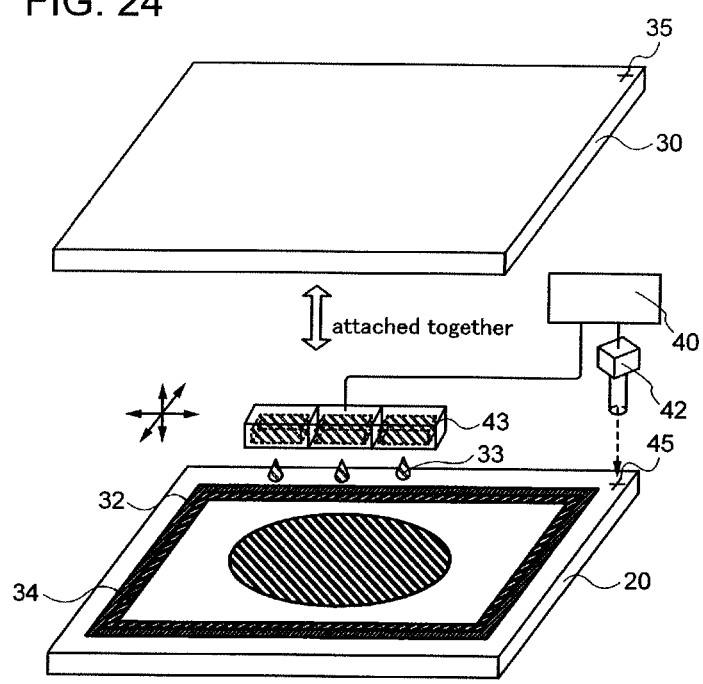
FIG. 24 is a view showing a drop filling method applicable to the invention.

A drop filling method using a dispenser method is described with reference to FIG. 24. The drop filling method shown in FIG. 24 includes a controlling apparatus 40, an image pick-up unit 42, a head 43, a filling material 33, a marker 35, a marker 45, a barrier layer 34, a sealing material 32, a TFT substrate 30, and a counter substrate 20. A closed loop is formed by the sealing material 32, and then the filling material 33 is dropped therein from the head 43 once or a plurality of times. The filling material having high viscosity is continuously discharged and attached to a forming region without being cut off. On the other hand, the filling material having low viscosity is intermittently discharged and dropped as shown in FIG. 24. At that time, in order to prevent reaction of the sealing material 32 and the filling material 33, the barrier layer 34 may be provided. Subsequently, the substrates are attached in vacuum and cured by ultraviolet ray; thereby filled with the filling material. By using a substance having a moisture absorbing property such as a drying agent as the filling material, a further moisture absorbing effect is obtained and deterioration of elements can be prevented.

In order to prevent deterioration of elements due to moisture, a drying agent is provided in the EL display panel. In this embodiment mode, the drying agent is provided in a depression portion formed in the sealing substrate so as to surround the pixel region, therefore, it does not disturb thin design. Further, as a large moisture absorbing area is provided by forming a drying agent in a region corresponding to the gate wiring layer, a high moisture absorbing effect can be obtained. In addition, when a drying agent is formed over the gate wiring layer which does not directly emit light, reduction in light extracting efficiency can be prevented.

It is to be noted in this embodiment mode that the light emitting element is sealed by a glass substrate; however, as the light emitting element is sealed in order to protect it from moisture, a method to mechanically seal with a cover material, a method to seal with heat curable resin or ultraviolet curable resin, a method to seal with a thin film having a high barrier property such as metal oxide, nitride, or the like can also be used. As the cover material, glass, ceramics, plastic, or metal can be used, which is required to have light transmissivity when light is emitted to the cover material side. The cover material and the substrate over which the aforementioned light emitting element is formed are attached to each other by using a sealing material such as heat curable resin or ultraviolet curable resin. Then, the resin is cured by thermal treatment or ultraviolet ray irradiation treatment to form an enclosed space. It is also effective to provide a moisture absorbing material typified by barium oxide in the enclosed space. The moisture absorbing material may be provided on a sealing material, over or in the periphery of the partition which does not disturb light from the light emitting element. Further, it is possible to fill the space between the cover material and the substrate over which the light emitting element is formed with heat curable resin or ultraviolet curable resin. In this case, it is effective to add a moisture absorbing material typified by barium oxide in the heat curable resin or ultraviolet curable resin.

Figure 14:
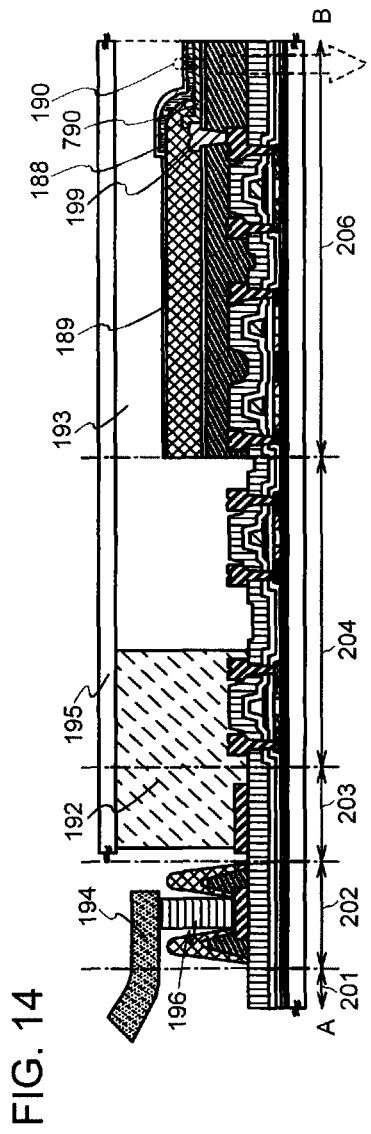
FIG. 14 is a view showing a display device of the invention.

FIG. 14 shows an example to connect the source electrode layer or drain electrode layer 172*b* to the first electrode layer through a wiring layer so as to be electrically connected instead of directly connected. In the display device shown in FIG. 14, the source electrode layer or drain electrode layer of the thin film transistor which drives the light emitting element and a first electrode layer 790 are electrically connected through a wiring layer 199. Moreover, in FIG. 14, the first electrode layer 790 is partially stacked over the wiring layer 199; however, the first electrode layer 790 may be formed first and then the wiring layer 199 may be formed on the first electrode layer 790.

In this embodiment mode, an FPC 194 is connected to the terminal electrode layer 178 by an anisotropic conductive layer 196 at the external terminal connecting region 202 so as to have an electrical connection with outside. Moreover, as shown in FIG. 10A which is a top plan view of the display device, the display device manufactured in this embodiment mode includes a peripheral driver circuit region 207 and a peripheral driver circuit region 208 having a scan line driver circuit in addition to the peripheral driver circuit region 204, and a peripheral driver circuit region 209 having a signal line driver circuit.

In this embodiment mode, the aforementioned circuits are used; however, the invention is not limited to this and an IC chip may be mounted as a peripheral driver circuit by a COG method or a TAB method. Moreover, a gate line driver circuit and a source line driver circuit may be provided in any number.

Moreover, a driving method to display an image is not particularly limited in a display device of the invention. For example, a dot sequential driving method, a line sequential driving method, an area sequential driving method, or the like is preferably used. Representatively, a line sequential driving method is used in combination with a time division grayscale driving method or an area grayscale driving method appropriately. Further, a video signal inputted to the source line of the display device may be an analog signal or a digital signal. A driver circuit or the like is to be designed appropriately in accordance with the video signal.

Furthermore, in a display device using a digital video signal, a video signal inputted to a pixel includes a video signal at a constant voltage (CV) and a video signal at a constant current (CC). The video signal at a constant voltage (CV) is further classified into a video signal with a constant voltage applied to a light-emitting element (CVCV), and a video signal with a constant current applied to a light-emitting element (CVCC). In addition, the video signal at a constant current (CC) is classified into a video signal with a constant voltage applied to a light-emitting element (CCCV), and a video signal with a constant current applied to a light-emitting element (CCCC).

This embodiment mode can be implemented in combination with each of Embodiment Modes 1 to 4.

By using the invention, a highly reliable semiconductor device can be manufactured through simplified steps. Therefore, a semiconductor device and a display device with high resolution and high image quality can be manufactured at low cost and high yield.

Embodiment Mode 6

An embodiment mode of the invention is described with reference to FIGS. 11A to 13. This embodiment mode shows an example where the second interlayer insulating layer (the insulating layers 181 and 182) is not formed in the display device manufactured in Embodiment Mode 5. Therefore, description on the same portion or a portion having a similar function is not repeated.

As described in Embodiment Mode 5, the thin film transistors 173, 174, 175, and 176, and the insulating films 167 and 168 are formed over the substrate 100. Each thin film transistor has a source electrode layer and a drain electrode layer connected to the source region or the drain region of the semiconductor layer. A first electrode layer 770 is formed in contact with the source electrode layer or drain electrode layer 172b in the thin film transistor 176 provided in the pixel region 206 (see FIGS. 11A and 11B).

The first electrode layer 770 which functions as a pixel electrode may be formed of a similar material and in a similar step to the first electrode layer 185 in Embodiment Mode 5. In this embodiment mode also, a light transmissive material is used to extract light through the first electrode layer 770 similarly to Embodiment Mode 1. In this embodiment mode, ITSO as a transparent conductive film is used for the first electrode layer 770 and etched into a desired shape.

The insulating layer 186 is formed so as to cover an edge portion of the first electrode layer 770 and the thin film transistors. In this embodiment mode, a coated film using a siloxane material (inorganic siloxane or organic siloxane) is used to form the insulating layer 186.

The electroluminescent layer 188 is formed over the first electrode layer and the second electrode layer 189 is stacked thereover; thereby the light emitting element 190 is formed. The FPC 194 is adhered to the terminal electrode layer 178 through the anisotropic conductive layer 196 in the external terminal connecting region 202. The substrate 100 is attached to the sealing substrate 195 by the sealing material 192 and the display device is filled with the filling material 193 (see FIG. 12). In the display device of this embodiment mode, the sealing material 192 and the insulating layer 186 are formed apart from each other so as not to have a contact. When the sealing material and the insulating layer 186 are formed apart from each other in this manner, moisture does not easily enter even when using an insulating material using an organic material having a high moisture absorbing property for the insulating layer 186. Thus, deterioration of a light emitting element can be prevented and reliability of a display device is improved.

Figure 13:
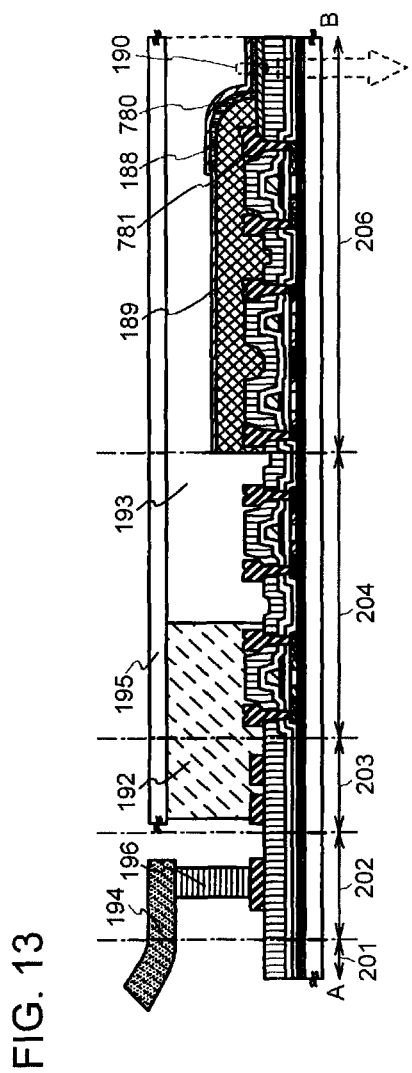
FIG. 13 is a view showing a display device of the invention.

The display device shown in FIG. 13 is an example where a first electrode layer 780 corresponding to the first electrode layer 770 is selectively formed over the insulating film 168 before forming a source electrode layer or drain electrode layer 781 corresponding to the source electrode layer or drain electrode layer 172b connected to the thin film transistor 176. In this case, the source electrode layer or drain electrode layer 781 is stacked over the first electrode layer 780 in this embodiment mode. When the first electrode layer 780 is formed prior to the source electrode layer or drain electrode layer 781, the source electrode layer or drain electrode layer 781 can be formed over a plane forming region. Therefore, there is an advantage in that favorable coverage can be obtained and polishing treatment such as CMP can be sufficiently performed, and thus the source electrode layer or drain electrode layer 781 can be formed with good planarity.

Figure 33:
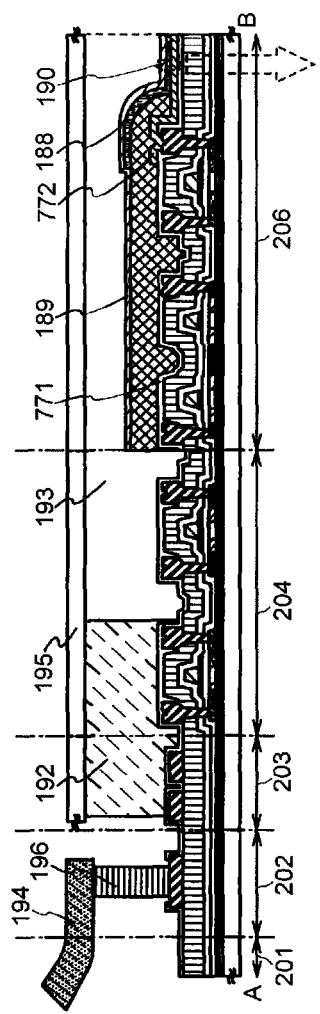
FIG. 33 is a view showing a display device of the invention.

A display device shown in FIG. 33 is an example where an insulating film 771 covering the source electrode layer or drain electrode layer 172b and the insulating film 168 is formed after forming the source electrode layer or drain electrode layer 172b. The insulating film 771 functions as a passivation film and also as a planarizing film. The insulating film 771 can be formed of a similar material by a similar method to the insulating film 168. In FIG. 33, a silicon oxynitride film is formed with a thickness of 50 to 500 nm, preferably 100 to 300 nm (in this embodiment mode, 100 nm) by a plasma CVD method. An opening to reach the source electrode layer or drain electrode layer 172b is formed in the insulating film 771 and an opening to reach the terminal electrode layer 178 is formed in the external terminal connecting region 202. The first electrode layer 772 is formed so as to cover the opening, and the source electrode layer or drain electrode layer 172b and the first electrode layer 772 are electrically connected.

By the invention, a highly reliable semiconductor device can be manufactured through simplified steps. Therefore, a semiconductor device with high resolution and high image quality can be manufactured at low cost and high yield.

Embodiment Mode 7

A display device having a light emitting element can be formed by the invention. The light from the light emitting element is emitted to bottom, top, or dual surfaces. In this embodiment mode, a dual emission type and a top emission type are described with reference to FIGS. 15 and 16.

Figure 16:
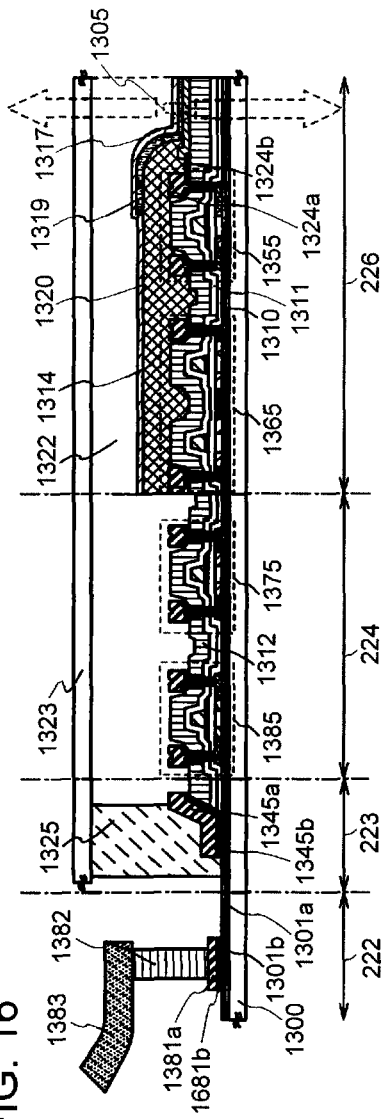
FIG. 16 is a view showing a display device of the invention.

A display device shown in FIG. 16 includes an element substrate 1300, thin film transistors 1355, 1365, 1375, and 1385, wiring layers 1324a and 1324b, a first electrode layer 1317, an electroluminescent layer 1319, a second electrode layer 1320, a filling material 1322, a sealing material 1325, insulating layers 1301 and 1301b, a gate insulating layer 1310, insulating films 1311 and 1312, an insulating layer 1314, a sealing substrate 1323, wiring layers 1345a and 1345b, terminal electrode layers 1381a and 1381b, an anisotropic conductive layer 1382 and an FPC 1383. The display device includes an external terminal connecting region 222, a wiring region 223, a peripheral driver circuit region 224, and a pixel region 226. The filling material 1322 can be formed by dropping a liquid composition as in a dropping method of FIG. 24. The element substrate 1300 over which the filling material is formed by the dropping method and the sealing substrate 1323 are attached to seal a light emitting display device.

A wiring layer (functions as a source electrode layer or a drain electrode layer) connected to each of the thin film transistors 1355, 1365, 1375, and 1385 has a two-layer structure. The wiring layer 1324a and the wiring layer 1324b are also stacked. The wiring layer 1324b extends to exist outside an edge portion of the wiring layer 1324a. The wiring layer 1324b and the first electrode layer 1317 are formed to contact each other. Moreover, in the wiring region 223, edge portions of the gate insulating layer 1310, the insulating film 1311, and the insulating film 1312 are etched into tapered shapes of which edge portions are covered with the wiring layers 1345a and 1345b. In this manner, by using a mask layer formed of an exposure mask provided with a diffraction grating pattern or an auxiliary pattern formed of a semi-transmissive film having a light intensity reducing function, which enables to form a resist mask layer accurately, different shapes can be freely formed by etching even in the same step.

The display device shown in FIG. 16 is a dual emission type which emits light in directions of arrows to the element substrate 1300 side and the sealing substrate 1323 side as well. Therefore, light transmissive electrode layers are used for the first electrode layer 1317 and the second electrode layer 1320.

In this embodiment mode, the first electrode layer 1317 and the second electrode layer 1320 are preferably formed of light transmissive conductive films formed of a conductive material having light transmissivity in specific, such as indium oxide containing tungsten oxide, indium zinc oxide containing tungsten oxide, indium oxide containing titanium oxide, and indium tin oxide containing titanium oxide. It is needless to say that indium tin oxide (ITO), indium zinc oxide (IZO), indium tin oxide to which silicon oxide is added (ITSO), and the like can also be used.

An example of a composition ratio in each light transmissive conductive material is described. In indium oxide containing tungsten oxide, the composition ratio may be 1.0 wt %:99.0 wt %=tungsten oxide:indium oxide. In indium zinc oxide containing tungsten oxide, 1.0 wt %:0.5 wt %:98.5 wt %=tungsten oxide:zinc oxide:indium oxide. In indium oxide containing titanium oxide, 1.0 to 5.0 wt %:99.0 to 95.0 wt %=titanium oxide:indium oxide. In indium tin oxide (ITO), 10.0 wt %:90.0 wt %=tin oxide:indium oxide. In indium zinc oxide (IZO), 10.7 wt %:89.3 wt %=zinc oxide:indium oxide. Further, in indium tin oxide containing titanium oxide, 5.0 wt %:10.0 wt %:85.0 wt %=titanium oxide:tin oxide:indium oxide. The composition ratios as described above are just examples, and a composition ratio may be set appropriately.

In addition, even in a case of a non-light-transmissive material such as a metal film is used, when the thickness is made thin (preferably, about 5 to 30 nm) so as to be able to transmit light, light can be emitted from the first electrode layer 1317 and the second electrode layer 1320. As a metal thin film that can be used for the first electrode layer 1317 and the second electrode layer 1320, a conductive film formed of titanium, tungsten, nickel, gold, platinum, silver, aluminum, magnesium, calcium, lithium, or an alloy thereof can be given.

As described above, in the display device shown in FIG. 16, light emitted from the light emitting element 1305 passes through both the first electrode layer 1317 and the second electrode layer 1320 and is emitted from both surfaces.

In the display device shown in FIG. 16, the wiring layer 1324*a* as a source electrode layer or a drain electrode layer of the thin film transistor 1355 and the first electrode layer 1317 of the light emitting element as a pixel electrode layer are not directly stacked to be electrically connected. Instead, the wiring layer 1324*a* and the first electrode layer 1317 are electrically connected to each other through the wiring layer 1324*b* formed under the wiring layer 1324*a*. With such a structure, even when the wiring layer 1324*a* and the first electrode layer 1317 are formed of materials which are not easily electrically connected by direct connection or materials which generate deterioration such as electric corrosion when contacted to each other, such materials can be used since the wiring layer 1324*b* is interposed therebetween. As a result, choice of materials which can be used for the wiring layer 1324*a* and the first electrode layer 1317 expands. As a problem caused by stacking the wiring layer 1324*a* and the first electrode layer 1317 is not required to be considered, a material having characteristics required for each of the wiring layer 1324*a* or the drain electrode layer and the first electrode layer 1317 can be freely selected. Therefore, a display device with high functionality and higher reliability can be manufactured at high yield. A connection between the source electrode layer or drain electrode layer and the first electrode layer is similar to a display device shown in FIG. 15.

Figure 15:
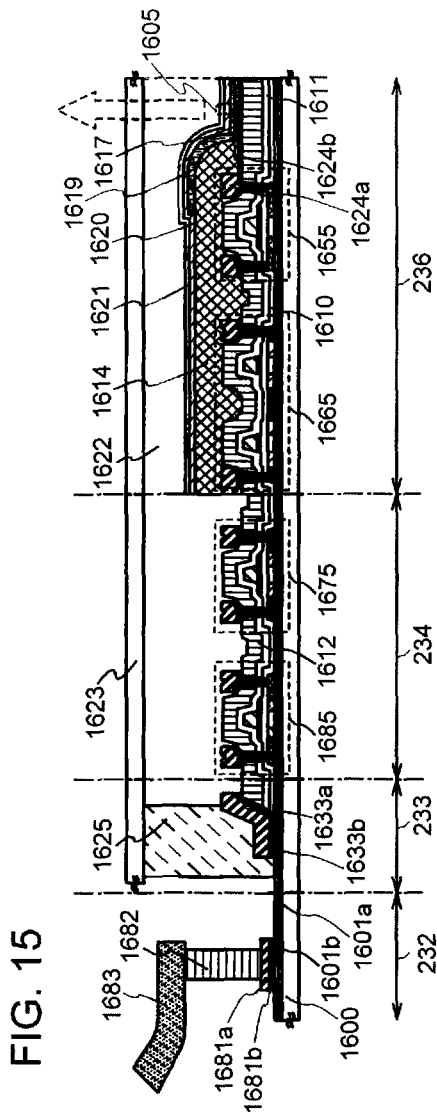
FIG. 15 is a view showing a display device of the invention.

The display device shown in FIG. 15 has a top emission structure in which light is emitted in a direction of an arrow. The display device shown in FIG. 15 includes an element substrate 1600, a thin film transistor 1655, a thin film transistor 1665, a thin film transistor 1675, a thin film transistor 1685, a wiring layer 1624*a*, a wiring layer 1624*b*, a first electrode layer 1617, an electroluminescent layer 1619, a second electrode layer 1620, a protective film 1621, a filling material 1622, a sealing material 1625, an insulating film 1601*a*, an insulating film 1601*b*, a gate insulating layer 1610, an insulating film 1611, an insulating film 1612, an insulating layer 1614, a sealing substrate 1623, a wiring layer 1633*a*, a wiring layer 1633*b*, a terminal electrode layer 1681*a*, a terminal electrode layer 1681*b*, an anisotropic conductive layer 1682, and an FPC 1683.

In the display device shown in FIG. 15, an insulating layer stacked over the terminal electrode layer 1681 is removed by etching. As shown in FIGS. 15 and 16, reliability is further improved with a structure where an insulating layer having a moisture permeable property is not provided in the periphery of the terminal electrode layer. Moreover, the display device includes an external terminal connecting region 232, a wiring region 233, a peripheral driver circuit region 234, and a pixel region 236. In the wiring region 233, edge portions of the gate insulating layer 1610, the insulating film 1611, and the insulating film 1612 are etched into tapered shapes, which are covered with wiring layers 1633*a* and 1633*b*. In this manner, by using a mask layer formed of an exposure mask provided with a diffraction grating pattern or an auxiliary pattern formed of a semi-transmissive film having a light intensity reducing function, which enables to form a resist mask layer accurately, different shapes can be freely formed by etching even in the same step.

In the case of the display device shown in FIG. 15, the wiring layer 1624*b* as a metal layer having reflectivity is formed under the first electrode layer 1317 in the dual emission type display device shown in FIG. 16. The first electrode layer 1617 as a transparent conductive film is formed over the wiring layer 1624*b*. As the wiring layer 1624*b* which is required to have reflectivity, a conductive film formed of titanium, tungsten, nickel, gold, platinum, silver, copper, tantalum, molybdenum, aluminum, magnesium, calcium, lithium, an alloy thereof may be used. It is preferable to use a highly reflective substance in a visible light region. In this embodiment mode, a TiN film is used.

For the first electrode layer 1617 and the second electrode layer 1620, in specific, a transparent conductive film formed of a conductive material having light transmissivity is preferably used, such as indium oxide containing tungsten oxide, indium zinc oxide containing tungsten oxide, indium oxide containing titanium oxide, and indium tin oxide containing titanium oxide. It is needless to say that indium tin oxide (ITO), indium zinc oxide (IZO), indium tin oxide to which silicon oxide is added (ITSO), and the like can also be used.

Further, when even a material such as a metal film having no light transmissivity is formed thin (preferably a thickness of 5 to 30 nm) so as to be able to transmit light, light can be emitted from the second electrode layer 1620. As a metal thin film which can be used for the second electrode layer 1620, a conductive film formed of titanium, tungsten, nickel, gold, platinum, silver, aluminum, magnesium, calcium, lithium, or an alloy thereof, or the like can be used.

A structure of the light emitting element 190 applicable to this embodiment mode is described in details with reference to FIGS. 18A to 18D.

Each of FIGS. 18A to 18D shows a structure of a light emitting element. A light emitting element includes an electroluminescent layer 860 formed of a mixture of an organic compound and an inorganic compound sandwiched between a first electrode layer 870 and a second electrode layer 850. The electroluminescent layer 860 is formed of a first layer

804, a second layer 803, and a third layer 802 as shown. In particular, the first layer 804 and the third layer 802 have notable characteristics.

The first layer 804 functions to transport holes into the second layer 803 and includes at least a first organic compound and a first inorganic compound having an electron acceptor property for the first organic compound. What is important is not simply that the first organic compound and the first inorganic compound are mixed, but that the first inorganic compound has a higher electron acceptor property for the first organic compound. With such a structure, a lot of hole carriers are generated in the first organic compound which originally has hardly any internal carriers, thereby an excellent hole injecting property and hole transporting property can be provided.

Therefore, the first layer 804 can have superior conductivity (a hole injecting and transporting property particularly in the first layer 804) as well as an effect which is thought to be obtained by mixing an inorganic compound (such as improvement in heat resistance). This effect cannot be obtained in a conventional hole transporting layer in which an organic compound and an inorganic compound which do not mutually affect each other electronically are simply mixed. Because of this effect, a driving voltage can be set lower than before. Further, as the first layer 804 can be fowled thick without increasing the driving voltage, a short-circuit of the element caused by dust or the like can also be suppressed.

As described above, hole carriers are generated in the first organic compound, therefore, it is preferable that the first organic compound have a hole transporting property. As the organic compound having a hole transporting property, for example, phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)-triphenylamine (abbreviation: TDATA), 4,4',4"-tris[N-(3-methylphenyl)-N-phenylamino]-triphenylamine (abbreviation: MTDATA), 1,3,5-tris[N,N-di(m-tolyl)amino]benzene (abbreviation: m-MTDAB), N,N'-diphenyl-N,N-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), and 4,4',4"-tris(N-carbazolyl)triphenylamine (abbreviation: TCTA). However, the organic compound having a hole transporting property is not limited to these. In addition, of the compounds mentioned above, aromatic amine compounds as typified by TDATA, MTDATA, m-MTDAB, TPD, NPB, DNTPD, and TCTA easily generate hole carriers, and are a suitable group of compounds for the first organic compound.

On the other hand, the first inorganic compound may be any material as long as the material easily accepts electrons from the first organic compound, and various metal oxides and metal nitrides can be used. However, transition metal oxides each having a transition metal that belongs to any one of Groups 4 to 12 of the periodic table are preferred since an electron accepting property is easily provided. Specifically, the transition metal oxides include titanium oxide, zirconium oxide, vanadium oxide, molybdenum oxide, tungsten oxide, rhenium oxide, ruthenium oxide, and zinc oxide. In addition, of the metal oxides mentioned above, many of transition metal oxides each having a transition metal that belongs to any one of Groups 4 to 8 have a higher electron accepting property, which are a preferable group of compounds. In particular, vanadium oxide, molybdenum oxide, tungsten oxide, and rhenium oxide are preferred since these oxides can be used easily for vacuum deposition.

It is to be noted that the first layer 804 may be formed by stacking a plurality of layers each including a combination of an organic compound and an inorganic compound as described above, or may further include another organic or inorganic compound.

Next, the third layer 802 will be described. The third layer 802 is a layer that takes on the function of transporting electrons to the second layer 803, includes at least a third organic compound and a third inorganic compound that exhibits an electron donating property to the third organic compound. What is important is that the third inorganic compound is not only mixed with the third organic compound but also exhibits an electron donating property to the third organic compound. This structure generates a lot of electron carriers in the third organic compound, which originally has hardly any internal carriers, to provide an excellent electron injecting and transporting property.

Therefore, the third layer 802 provides not only advantages that are considered to be obtained by mixing an inorganic compound (for example, improvement in heat resistance) but also excellent conductivity (in particular, electron injecting and transporting properties in the case of the third layer 802). This excellent conductivity is an advantage that is not able to be obtained from a conventional electron transporting layer in which an organic compound and an inorganic compound that do not electronically interact with each other are simply mixed. This advantage makes it possible to lower a driving voltage more than ever before. In addition, since the third layer 802 can be made thicker without causing an increase in driving voltage, a short circuit of an element due to dust and the like can also be suppressed.

Meanwhile, it is preferable to use an electron-transporting organic compound as the third organic compound since electron carriers are generated in the third organic compound as described above. Examples of the electron-transporting organic compound include, but are not limited to, tris(8-quinolinolato)aluminum (abbreviation: $Alq_3$), tris(4-methyl-8-quinolinolato)aluminum (abbreviation: $Almq_3$), bis(10-hydroxybenzo[h]quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)-benzoxazolato]zinc (abbreviation: $Zn(BOX)_2$) or bis[2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazole-2-yl]benzene (abbreviation: OXD-7), 2,2',2"-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), and 3-(4-biphenylyl)-4-(4-ethylphenyl)-5-(4-tert-butylphenyl)-1,2,4-triazole (abbreviation: p-EtTAZ). In addition, of the compounds mentioned above, chelate metal complexes each having a chelate ligand including an aromatic ring as typified by $Alq_3$, $Almq_3$, $BeBq_2$, BAlq, $Zn(BOX)_2$, and $Zn(BTZ)_2$, organic compounds each having a phenanthroline skeleton as typified by BPhen and BCP, and organic compounds each having an oxadiazole skeleton as typified by PBD and OXD-7 easily generate electron carriers, and are suitable groups of compounds for the third organic compound.

On the other hand, the third inorganic compound may be any material as long as the material easily donates electrons from the third organic compound, and various metal oxides and metal nitrides can be used. However, alkali metal oxides, alkaline-earth metal oxides, rare-earth metal oxides, alkali metal nitrides, alkaline-earth metal nitrides, and rare-earth metal nitrides are preferred since an electron donating property is easily provided. Specifically, examples of the oxides mentioned above include lithium oxide, strontium oxide, barium oxide, erbium oxide, lithium nitride, magnesium nitride, calcium nitride, yttrium nitride, and lanthanum nitride. In particular, lithium oxide, barium oxide, lithium nitride, magnesium nitride, and calcium nitride are preferred since these oxides and nitrides can be used easily for vacuum deposition.

It is to be noted that the third layer 802 may be formed by stacking a plurality of layers each including a combination of an organic compound and an inorganic compound as described above, or may further include another organic compound or inorganic compound.

Next, the second layer 803 will be described. The second layer 803 is a layer that takes on the function of emitting light, and includes at least a second organic compound that is luminescent and may include a second inorganic compound. The second layer 803 can be formed by mixing some of various luminescent organic compounds and inorganic compounds. However, since it is considered that a current does not easily flow through the second layer 803 as compared with the first layer 804 or the third layer 802, it is preferable that the thickness of the second layer 803 be approximately 10 to 100 nm.

The second organic compound is not particularly limited as long as a luminescent organic compound is used, and examples of the second organic compound include 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidine-9-yl)ethenyl]-4H-pyran (abbreviation: DCM2), and 4-(dicyanomethylene)-2,6-bis[p-(dimethylamino)styryl]-4H-pyran (abbreviation: BisDCM). In addition, it is also possible to use compounds that are capable of producing phosphorescence such as bis[2-(4',6'-difluorophenyl)pyridinato-N,$C^{2'}$]iridium(picolinate) (abbreviation: FIrpic), bis{2-[3',5'-bis(trifluoromethyl)phenyl]pyridinato-N,$C^{2'}$}iridium(picolinate) (abbreviation: Ir($CF_3$ ppy)$_2$(pic)), tris(2-phenylpyridinato-N,$C^{2'}$)iridium (abbreviation: Ir(ppy)$_3$), bis(2-phenylpyridinato-N,$C^{2'}$)iridium(acetylacetonate) (abbreviation: Ir(ppy)$_2$(acac)), bis[2-(2'-thienyl)pyridinato-N,$C^{3'}$]iridium(acetylacetonate) (abbreviation: Ir(thp)$_2$(acac)), bis(2-phenylquinolinato-N,$C^{2'}$)iridium(acetylacetonate) (abbreviation: Ir(pq)$_2$(acac)), and bis[2-(2'-benzothienyl)pyridinato-N,$C^{3'}$]iridium(acetylacetonate) (abbreviation: Ir(btp)$_2$(acac)).

Moreover, the second layer 803 may be formed of not only a singlet-excited light-emitting material but also a triplet-excited light-emitting material including a metal complex or the like. For example, among pixels for emitting red, green, and blue light, the pixel for emitting the red color, which has a relatively short half brightness life period of luminance, is formed of the triplet-excited light-emitting material and the other two pixels are formed of the singlet-excited light-emitting material. The triplet-excited light-emitting material has an advantage of low power consumption to obtain the same luminance as that of the singlet-excited light-emitting material because the triplet-excited light-emitting material has higher light-emission efficiency. In other words, when the pixel for the red color is formed of the triplet-excited light-emitting material, the reliability can be improved because the light-emitting element requires a smaller amount of current. For lower power consumption, the pixels for the red and green colors may be formed of the triplet-excited light-emitting material and the pixel for the blue color may be formed of the singlet-excited light-emitting material. When the light-emitting element of the green color that is highly visible to human eyes is formed of the triplet-excited light-emitting material, the power consumption can be further reduced.

Further, not only the second layer 803 may include the second organic compound described above, which produces luminescence, but also another organic compound may be added thereto. Examples of organic compounds that can be added include, but are not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviation: CBP) and 1,3,5-tris[4-(N-carbazolyl)phenyl]benzene (abbreviation: TCPB). It is to be noted that it is preferable that the organic compound, which is added in addition to the second organic compound as described above, have larger excitation energy than the second organic compound and be added more than the second organic compound in order to make the second organic compound produce luminescence efficiently (which makes it possible to prevent concentration quenching of the second organic compound). In addition, as another function, the added organic compound may produce luminescence along with the second organic compound (which makes it possible to produce white luminescence).

The second layer 803 may have a structure for performing color display by providing each pixel with a light emitting layer having different emission wavelength bands. Typically, a light emitting layer corresponding to each color of R (red), G (green), and B (blue) is formed. In this case, color purity can be increased and a pixel portion can be prevented from having a mirror surface (glare) by providing a light emitting side of a pixel with a filter which transmits light of an emission wavelength band. Providing a filter can omit a circularly polarizing plate or the like which is conventionally used to prevent a pixel portion from having a mirror surface (glare) and can eliminate the loss of light emitted from the light emitting layer. Further, a change in tone, which occurs when a pixel portion (display screen) is obliquely seen, can be reduced.

A high molecular organic light emitting material or a low molecular organic light emitting material can be used for the material of the second layer 803. A high molecular organic light emitting material is physically stronger than a low molecular material and is superior in durability of the element. In addition, a high molecular organic light emitting material can be formed by coating; therefore, the element can be manufactured relatively easily.

The emission color is determined depending on a material forming the light emitting layer; therefore, a light emitting element which displays desired luminescence can be formed by selecting an appropriate material for the light emitting layer. As a high molecular electroluminescent material which can be used for forming a light emitting layer, a polyparaphenylene-vinylene-based material, a polyparaphenylene-based material, a polythiophene-based material, or a polyfluorene-based material can be used.

As the polyparaphenylene vinylene-based material, a derivative of poly(paraphenylenevinylene) [PPV], for example, poly(2,5-dialkoxy-1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV]; and the like can be used. As the polyparaphenylene-based material, a derivative of polyparaphenylene [PPP], for example, poly(2,5-dialkoxy-1,4-phenylene) [RO-PPP]; poly(2,5-dihexoxy-1,4-phenylene); and the like can be used. As the polythiophene-based material, a derivative of polythiophene [PT], for example, poly(3-alkylthiophene) [PAT]; poly(3-hexylthiophen) [PHT]; poly (3-cyclohexylthiophen) [PCHT]; poly(3-cyclohexyl-4-methylthiophene) [PCHMT]; poly(3,4-dicyclohexylthiophene) [PDCHT]; poly[3-(4-octylphenyl)-thiophene] [POPT]; poly[3-(4-octylphenyl)-2,2-bithiophene] [PTOPT]; and the like can be used. As the polyfluorene-based material, a derivative of polyfluorene [PF], for example, poly(9,9-dialkylfluorene) [PDAF]; poly(9,9-dioctylfluorene) [PDOF]; and the like can be used.

The second inorganic compound may be any inorganic material as long as luminescence of the second organic compound is not easily subject to quenching by the inorganic compound, and various metal oxides and metal nitrides can be used. In particular, metal oxides each having a metal that belongs to Group 13 or 14 of the periodic table are preferred since luminescence of the second organic compound is not easily subject to quenching, and specifically, aluminum oxide, gallium oxide, silicon oxide, and germanium oxide are preferred. However, the second inorganic compound is not limited thereto.

It is to be noted that the second layer 803 may be formed by stacking a plurality of layers each including a combination of the organic compound and the inorganic compound as described above, or may further include another organic or inorganic compound. The structure of the light emitting layer may vary. Such changes as dispersing a light emitting material and providing a dedicated electrode layer instead of providing a specific electron injecting region or light emitting region are construed as being included in the invention unless such changes depart from the scope of the invention.

A light emitting element formed with the above described materials emits light by being forward biased. A pixel of a display device formed with a light emitting element can be driven by a simple matrix mode or an active matrix mode. In any event, each pixel emits light by applying a forward bias thereto at a specific timing; however, the pixel is in a non-light-emitting state for a certain period. Reliability of a light emitting element can be improved by applying a reverse bias in the non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating current driving where bias is applied forward and reversely. Thus, reliability of a light emitting device can be improved. Additionally, either of digital driving and analog driving can be applied.

In the case of a top emission type and dual emission type display device, a color filter (colored layer) may be formed over the sealing substrate. The color filter (colored layer) can be formed by a deposition method or a droplet discharge method. With the use of the color filter (colored layer), high-definition display can also be performed. This is because a broad peak can be modified by the color filter (colored layer) to be sharp in light emission spectrum of each RGB.

Full color display can be performed by forming a material which exhibits light emission of a single color and combining a color filter and a color conversion layer. The color filter (colored layer) or the color conversion layer may be formed over, for example, a second substrate (a sealing substrate) and may be attached to a substrate.

Naturally, display may be performed in monochrome. For example, an area color type display device may be manufactured by using single color emission. The area color type is suitable for a passive matrix type display area, and can mainly display text and symbols.

Figure 18A:
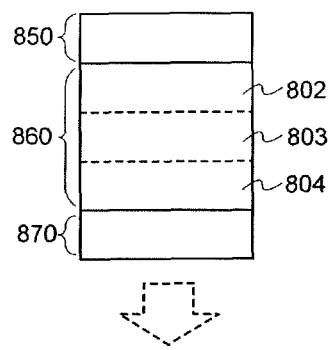
FIGS. 18A to 18D are views showing structures of a light emitting element applicable to the invention.
Figure 18B:
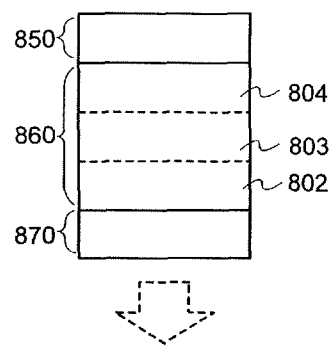

The materials of the first electrode layer 870 and the second electrode layer 850 are required to be selected considering the work functions. Each of the first electrode layer 870 and the second electrode layer 850 can be either an anode or a cathode depending on the pixel structure. In the case where a driving thin film transistor has p-type conductivity, the first electrode layer 870 may preferably serve as an anode and the second electrode layer 850 may serve as a cathode as shown in FIG. 18A. In the case where the driving TFT has n-type conductivity, the first electrode layer 870 may preferably be used as a cathode and the second electrode layer 850 may be used as an anode as shown in FIG. 18B. Materials that can be used for the first electrode layer 870 or the second electrode layer 850 will be described. It is preferable to use a material that has a higher work function (specifically, a material that has a work function of 4.5 eV or higher) for one of the first electrode layer 870 and the second electrode layer 850 which serves as an anode, and a material that has a lower work function (specifically, a material that has a work function of 3.5 eV or lower) for the other which serves as a cathode. However, since the first layer 804 and the third layer 802 are respectively superior in hole injecting and/or transporting property, and electron injecting and/or transporting property, either the first electrode layer 870 or the second electrode layer 850 is scarcely restricted on work function, and various materials can be used for the first electrode layer 870 and the second electrode layer 850.

Each of the light-emitting elements shown in FIGS. 18A and 18B has a structure in which light is extracted from the first electrode layer 870, and thus, the second electrode layer 850 is not always required to have a light-transmitting property. The second electrode layer 850 may be formed of a film mainly including an element selected from Ti, Ni, W, Cr, Pt, Zn, Sn, In, Ta, Al, Cu, Au, Ag, Mg, Ca, Li and Mo, or an alloy material or a compound material containing the element as its main component such as TiN, TiSi$_x$N$_y$, WSi$_x$, WN$_x$, WSi$_x$N$_y$, and NbN, or a stacked film thereof with a total thickness of 100 to 800 nm.

The second electrode layer 850 can be formed by a vapor deposition method, a sputtering method, a CVD method, a printing method, a droplet discharge method, or the like.

In addition, when the second electrode layer 850 is formed by using a light-transmitting conductive material similarly to the material used for the first electrode layer 870, light is also extracted from the second electrode layer 850, and a dual emission structure can be obtained, in which light emitted from the light-emitting element is emitted from both of the first electrode layer 870 side and the second electrode layer 850 side.

It is to be noted that the light-emitting element according to the present invention has variations by changing types of the first electrode layer 870 and the second electrode layer 850.

FIG. 18B shows a case where the third layer 802, the second layer 803, and the first layer 804 are provided in this order from the first electrode layer 870 side in the electroluminescent layer 860.

As described above, in the light-emitting element according to the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions called a high carrier-injecting property and carrier-transporting property by mixing an organic compound and an inorganic compound, where the functions are not obtainable from only either one of the organic compound and the inorganic compound. Further, the first layer 804 and the third layer 802 are particularly required to be layers in which an organic compound and an inorganic compound are combined when provided on the first electrode layer 870 side, and may contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-vapor deposition method of evaporating both an organic compound and an inorganic compound by resistance heating. In addition, for co-evaporation, an inorganic compound may be evaporated by an electron beam (EB) while evaporating an organic compound by resistance heating. Further, the methods also include a method of sputtering an inorganic compound while evaporating an organic compound by resistance heating to deposit the both at the same time. In addition, the electroluminescent layer may also be formed by a wet process.

Similarly, for the first electrode layer 870 and the second electrode layer 850, evaporation by resistance heating, EB evaporation, sputtering, a wet process, and the like can be used.

Figure 18C:
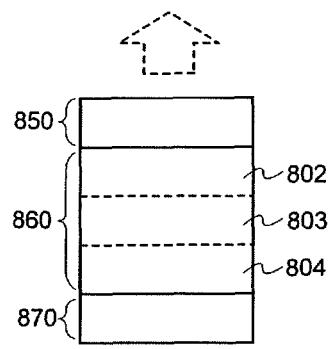
Figure 18D:
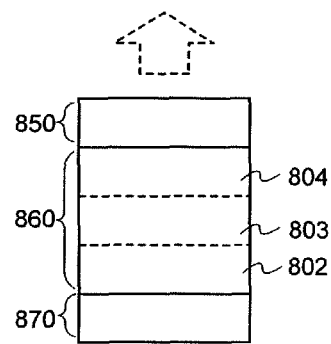

In FIG. 18C, an electrode layer having reflectivity is used for the first electrode layer 870, and an electrode layer having a light-transmitting property is used for the second electrode layer 850 in the structure of FIG. 18A. Light emitted from the electroluminescent layer is reflected by the first electrode layer 870, transmitted through the second electrode layer 850, and is emitted outside. Similarly, in FIG. 18D, an electrode layer having reflectivity is used for the first electrode layer 870, and an electrode layer having a light-transmitting property is used for the second electrode layer 850 in the structure of FIG. 18B. Light emitted from the electroluminescent layer is reflected by the first electrode layer 870, transmitted through the second electrode layer 850, and is emitted to outside.

This embodiment mode can be freely implemented in combination with each of Embodiment Modes 1 to 6.

By the invention, a highly reliable display device can be manufactured through simplified steps. Therefore, a display device with high resolution and high image quality can be manufactured at low cost and high yield.

Embodiment Mode 8

An embodiment mode of the invention is described with reference to FIGS. 17A and 17B. This embodiment mode shows an example of a liquid crystal display device having a liquid crystal display element using a liquid crystal material as a display element in the display device manufactured in Embodiment Mode 5. Therefore, description of the same portion or a portion having a similar function is not repeated.

FIG. 17A is a top plan view of a liquid crystal display device. FIG. 17B is a cross sectional view along a line C-D in FIG. 17A.

A display device shown in FIGS. 17A and 17B include a substrate 600, a thin film transistor 620, a thin film transistor 621, a thin film transistor 622, a capacitor 623, a pixel electrode layer 630, an orientation film 631, a liquid crystal layer 632, an orientation film 633, a counter electrode layer 634, a color filter 635, a counter substrate 695, a polarizing plate 636a, a polarizing plate 636b, a sealing material 692, an insulating film 604a, an insulating film 604b, a gate insulating layer 611, an insulating film 612, an insulating film 615, an insulating film 616, a terminal electrode layer 678, an anisotropic conductive layer 696, an FPC 694, and a spacer 637. The display device includes a separating region 601, an external terminal connecting region 602, a sealing region 603, a driver circuit region 608a, a driver circuit region 608b, and a pixel region 606.

The pixel electrode layer 630 and the counter electrode layer 634 can be formed of a similar material to the first electrode layer 185 of the light emitting element in a similar step to Embodiment Mode 5. In the case of a transmissive liquid crystal display device, a material having light transmissivity may be used for the pixel electrode layer 630 and the counter electrode layer 634. In the case of a light reflective liquid crystal display device in which light is extracted from the counter electrode layer 634 side, a material having light reflectivity may be used for the pixel electrode layer 630.

The alignment film 631 is formed so as to cover the pixel electrode layer 630 and the thin film transistors by a printing method or a spin coating method. It is to be noted that the alignment film 631 can be selectively formed by a screen printing method or an offset printing method. After that, rubbing treatment is applied. Subsequently, the sealing material 692 is formed in a peripheral region of the pixels by a droplet discharge method.

After that, the counter substrate 695 over which the alignment film 633, the counter electrode layer 634, the color filter 635, and the polarizing plate 636b are provided and the element substrate 600 including the TFTs are attached to each other with a spacer 637 interposed therebetween. By providing the liquid crystal layer 632 in the space, a liquid crystal display device can be manufactured. As the liquid crystal display device of this embodiment mode is a transmissive type, the polarizing plate 636a is formed on a side of the element substrate 600, where the TFTs are not formed. The sealing material may be mixed with filler, and the counter substrate 695 may be further provided with a shielding film (black matrix) or the like. Note that as a method for forming the liquid crystal layer, a dispenser method (one drop fill method) may be used as well as a dipping method (pump method) by which liquid crystals are injected by utilizing a capillary phenomenon after attaching the counter substrate 695 to the substrate 600.

The one drop fill method employing the dispenser method may be similarly performed to the drop filling method of the filling material shown in FIG. 24 in Embodiment Mode 5. Subsequently, the substrates are attached to each other in vacuum and ultraviolet curing treatment is applied after that so as to be filled with the liquid crystals. Further, a sealing material may be provided on the TFT substrate side and liquid crystals may be dropped therein.

With respect to spacers, particles having several μm in size may be dispersed. However, in this embodiment mode, a resin film is formed over the entire surface of the substrate, and then the resin film is etched into desired shapes to form the spaces. After a material for such spacers is applied by a spinner, the material is patterned into a predetermined shape through light exposure and development treatments. Also, the material is baked at 150 to 200° C. using a clean oven or the like to be cured. The shapes of these spacers manufactured above can be varied depending on the conditions of the light exposure and development treatments. Preferably, when the spacers are formed to have a columnar shape that has a flat top and a flat bottom, the liquid crystal display device can secure mechanical strength when being attached to the counter substrate. Spacers having a cone shape, a pyramidal shape or the like can be used, and the shapes of the spacers are not particularly limited.

In order to connect inside of the display device manufactured in the above process to an external wiring substrate, a connection portion is formed. An insulating layer in the connection portion is removed by ashing treatment using oxygen gas under atmospheric pressure or almost atmospheric pressure. The ashing treatment uses oxygen gas together with one or more of hydrogen, $CF_4$, $NF_3$, $H_2O$, and $CHF_3$. In this process, the ashing treatment is performed after sealing the liquid crystal with the counter substrate so as to prevent damage or breakage due to electrostatic. In the case of having a less possibility of adverse effect due to electrostatic, however, the ashing treatment can be carried out at any time.

Subsequently, a terminal electrode layer 678 which is electrically connected to the pixel portion and an FPC 694 which is a connection wiring substrate are provided through an anisotropic conductive layer 696. The FPC 694 serves to transmit a signal or an electric potential from outside. According to the above mentioned process, a liquid crystal display device having a display function can be formed.

As shown in FIG. 17A, the pixel region 606, the driver circuit region 608a, and the driver circuit region 608b which function as scan line driver circuits are sealed between the element substrate 600 and the counter substrate 695 by the sealing material 692, and the driver circuit region 607 which functions as a signal line driver circuit formed of a driver IC is provided over the element substrate 600. A driver circuit including thin film transistors 620 and 621 is provided in a driving region.

In a peripheral driver circuit in this embodiment mode, a CMOS circuit formed of the thin film transistors 620 and 621 is provided, since the thin film transistor 620 is a p-channel thin film transistor and the thin film transistor 621 is an n-channel transistor.

The capacitor 395 described in Embodiment Mode 4 and the capacitor 623 can be formed in a similar manner. In the capacitor 623, a first conductive layer 652a can be formed wider than a second conductive layer 652b. Therefore, an n-type impurity region 651 can be formed wide. The capacitance formed between an impurity region and a gate electrode is larger than that formed between a gate electrode and a region to which impurity elements are not added. Therefore, by forming the n-type impurity region 651 under the first conductive layer 652a wide, large capacitance can be obtained.

The thin film transistor 622 is a double-gate type n-channel thin film transistor having an LDD region in a Loff region. The n-type impurity region formed in the Loff region has effects to alleviate an electric field in the vicinity of the drain region to prevent deterioration caused by hot carrier injection and to reduce an off current. As a result, a highly reliable display device with low power consumption can be manufactured.

Embodiment Mode 9

Figure 23:
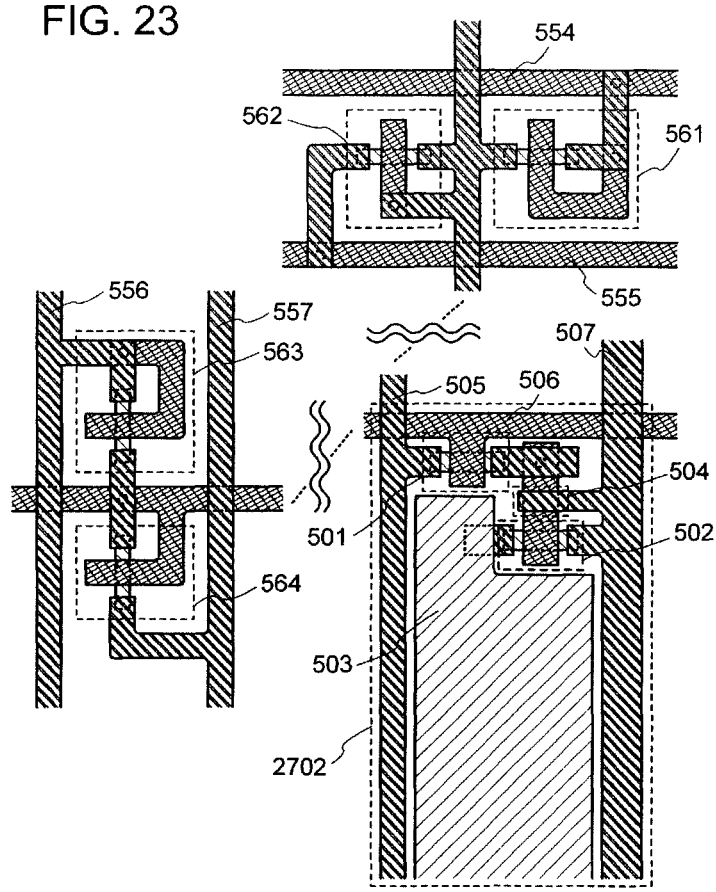
FIG. 23 is a view showing a display device of the invention.

One aspect of the invention where a protective diode is provided in each of a scan line input terminal portion and a signal line input terminal portion is described with reference to FIG. 23. In FIG. 23, TFTs 501 and 502, a capacitor 504, and a pixel electrode layer 503 are provided in a pixel 2702.

Figure 22:
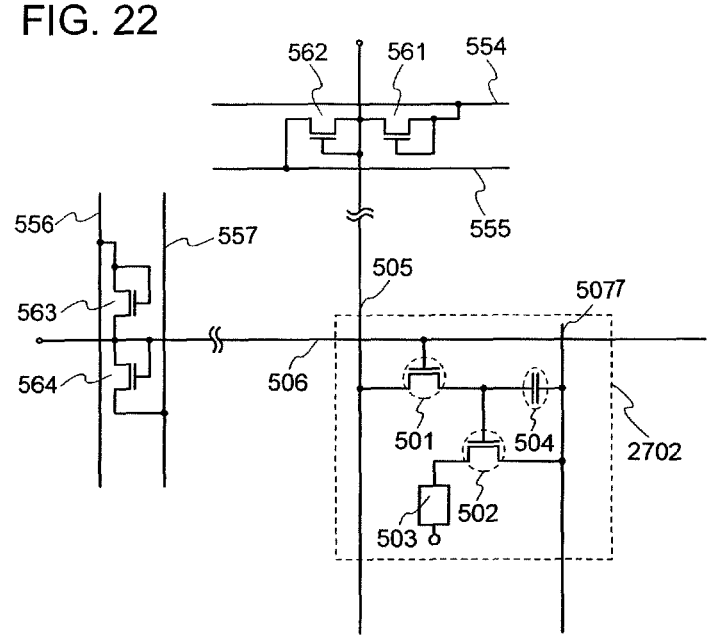
FIG. 22 is an equivalent circuit diagram of a display device shown in FIG. 23.

A protective diode 561 and a protective diode 562 are provided in the signal line input terminal portion. These protective diodes are formed in a similar step to the TFT 501 or 502 so that a gate and one of a drain and a source are connected to operate as diodes. FIG. 22 shows an equivalent circuit diagram of a top plan view shown in FIG. 23.

The protective diode 561 is constituted by a gate electrode layer, a semiconductor layer, and a wiring layer. The protective diode 562 has a similar structure. Common potential lines 554 and 555 connected to these protective diodes are formed in the same layer as the gate electrode layer. Therefore, a contact hole is required to be formed in the insulating layer so that the common potential lines are electrically connected to the wiring layer.

A contact hole may be formed in an insulating layer by forming a mask layer and applying etching process. In this case, when etching process by atmospheric pressure discharge is employed, a discharging process can be performed locally, therefore, a mask layer is not required to be formed over the entire surface of the substrate.

The signal wiring layer is formed of the same layer as a source or drain wiring layer 505 and has a structure in which the signal wiring layer connected to the source or drain wiring layer 505 is connected to a source side or a drain side of the TFT 501.

The input terminal portion of the scan line also has a similar structure. A protective diode 563 includes a gate electrode layer, a semiconductor layer, and a wiring layer. A protective diode 564 has a similar structure. Common potential lines 556 and 557 connected to this protective diode are formed in the same layer as the source and drain electrode layers. The protective diodes provided in an input stage can be formed at the same time. Note that the positions to provide the protective diodes are not limited to this embodiment mode and can be also provided between a driver circuit and a pixel.

As shown in the top plan view of FIG. 23, the wiring layer has a pattern where a corner that is a right triangle in each edge bent into an L shape is removed so that one side of the triangle is 10 μm or shorter, or equal to or longer than one-fifth the line width of the wiring layer and equal to or shorter than half the line width of the wiring layer, thereby the edge is rounded. That is to say, the circumference of the wiring layer in the edge is curved when seen from above. Corners are rounded by removing sharp corners with equal to or longer than one-fifth the width of the wiring layer and equal to or shorter than half the width of the wiring layer. Specifically, in order to form a round circumference of the edge, a part of the wiring layer is removed, which corresponds to an isosceles right triangle having two first straight lines that are perpendicular to each other making the edge, and a second straight line that makes an angle of about 45 degrees with the two first straight lines. When removing the triangle, two obtuse angles are formed in the wiring layer. At this time, the wiring layer is preferably etched by appropriately adjusting the etching conditions and/or a mask design so that a curved line in contact with the first straight line and the second straight line is formed in each obtuse angle part. Note that the length of the two sides of the isosceles right triangle, which are equal to each other, is equal to or longer than one-fifth of the width of the wiring layer and equal to or shorter than half the width of the wiring layer. In addition, the inner circumference of the edge is also made curved in accordance with the circumference of edge.

When the wiring layer is thus disposed so that the corner and the portion where the wire width changes are curved, generation of fine particles due to abnormal discharge can be suppressed in dry etching using plasma. In addition, even when fine particles which tend to gather at a depressed portion are generated, the fine particles can be washed, and yield can be expected to increase significantly. That is to say, the problems of dust and fine particles in manufacturing steps can be solved. Further, the round corner of the wire allows electrical conduction. In addition, dust in multiple parallel wires can be washed effectively.

Embodiment Mode 10

Figure 20C:
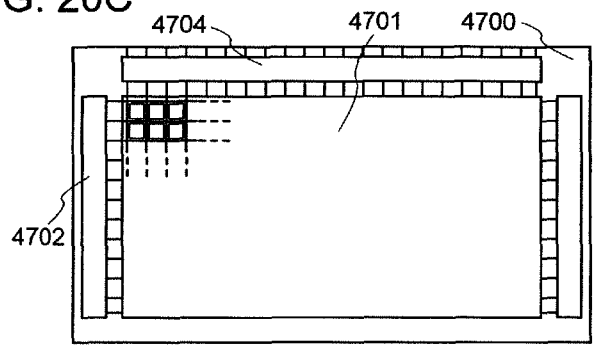

By using a display device formed by the invention, a television device can be completed. FIG. 26 is a block diagram showing a major structure of a television device (in this embodiment mode, an EL television device). In a display panel, there are a case where only a pixel portion is formed in such a structure as shown in FIG. 20A and a scan line driver circuit and a signal line driver circuit are mounted by a TAB method as shown in FIG. 21B, a case where they are mounted by a COG method as shown in FIG. 21A, a case where TFTs are formed of SAS as shown in FIG. 20B, the pixel portion and the scan line driver circuit are integrated over the substrate, and the signal line driver circuit is mounted as a driver IC separately, and a case where the pixel portion, the signal line driver circuit, and the scan line driver circuit are integrated over the substrate as shown in FIG. 20C. The display panel may have any of the aforementioned modes.

As another configuration of an external circuit, on an input side of video signals, a video signal amplifier circuit 705 which amplifies a video signal among signals received by a tuner 704, a video signal processing circuit 706 which converts a signal outputted from the video signal amplifier circuit 705 into a color signal corresponding to each of red, green, and blue, a control circuit 707 which converts the video signal into an input specification of the driver IC, and the like are included. The control circuit 707 outputs signals to the scan line side and the signal line side. In the case of digital driving, a signal dividing circuit 708 is provided on the signal line side so that input digital signals are divided into m pieces to be supplied.

Among the signals received by the tuner 704, audio signals are transmitted to an audio signal amplifier circuit 709 of which output is supplied to a speaker 713 through an audio signal processing circuit 710. The control circuit 711 receives control data such as a receiving station (receiving frequency) and volume from an input portion 712 and transmits signals to the tuner 704 and the audio signal processing circuit 710.

Figure 27A:
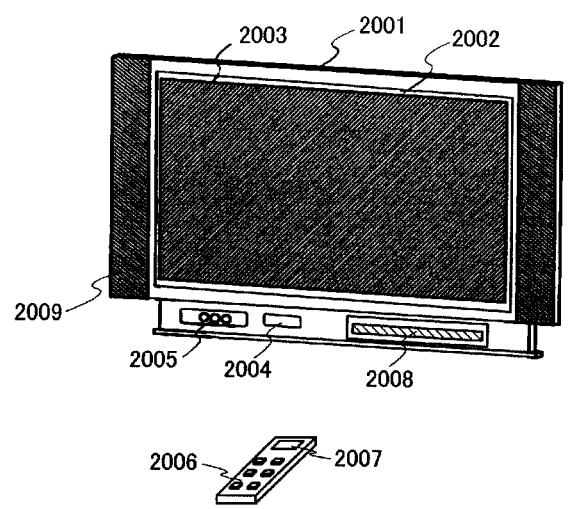
FIGS. 27A and 27B are views showing electronic devices to which the invention is applied.
Figure 27B:
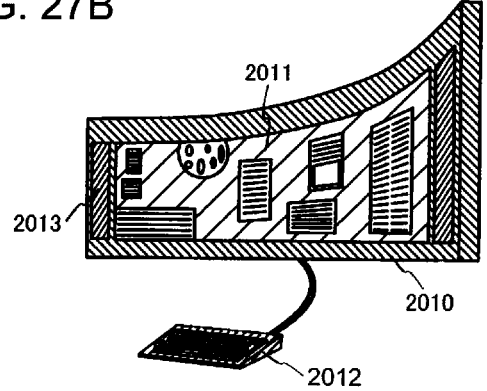

By incorporating a display module in a housing as shown in FIGS. 27A and 27B, a television device can be completed. A display panel in which components up to an FPC are set is generally also called an EL display module. Therefore, by using the EL display module, the EL television device can be completed. A main screen 2003 is formed by the display module, and as other attachment systems, a speaker portion 2009, an operating switch, and the like are provided. In this manner, a television device can be completed by the invention.

By using a retardation film or a polarizing plate, reflected light of light incident from outside may be blocked. In the case of a top emission type display device, an insulating layer as a partition may be colored to be used as a black matrix. The partition can be formed by a droplet discharge method or the like as well, using pigment-based black resin or a resin material such as polyimide mixed with carbon black or the like, or a stacked-layer of these. A partition may be formed by discharging different materials in the same region a plurality of times by a droplet discharge method. As the retardation film, a quarter wave plate and a half wave plate may be used and may be designed to be able to control light. As the structure, the light emitting element, the sealing substrate (sealant), the retardation film (quarter wave plate), the retardation film (half wave plate), and the polarizing plate are sequentially laminated over a TFT element substrate, in which light emitted from the light emitting element is transmitted therethrough and emitted outside from a polarizing plate side. The retardation films or polarizing plate may be provided on a side where light is emitted outside or may be provided on both sides in the case of a dual emission type display device in which light is emitted from the both surfaces. In addition, an anti-reflective film may be provided outside of the polarizing plate. Accordingly, an image with higher resolution and precision can be displayed.

As shown in FIG. 27A, a display panel 2002 using a display element is incorporated in a housing 2001. By connecting to a communication network in a wired or wireless manner through a modem 2004, one way (transmitter to receiver) or two-way (between transmitter and receiver or between receivers) data communication is possible as well as general television broadcast can be received by a receiver 2005. The television device can be operated by using a switch incorporated in the housing or a separate remote control operator 2006. The remote control operator may be provided with a display portion 2007 which displays outputted data.

In the television device, a sub screen 2008 may be formed of a second display panel in addition to the main screen 2003, which has a structure to display a channel, volume, or the like. In this structure, the main screen 2003 may be formed of an EL display panel with a superior viewing angle while the sub screen may be formed of a liquid crystal display panel which can perform display with low power consumption. To give priority to low power consumption, the main screen 2003 may be formed of a liquid crystal display panel and the sub screen may be formed of an EL display panel so as to be capable of blinking. By using the invention, a highly reliable display device can be manufactured even by using a large substrate with a lot of TFTs and electronic components.

FIG. 27B is a television device having a large display portion in a size of, for example, 20 to 80 inches, including a housing 2010, a keyboard portion 2012 as an operating portion, a display portion 2011, a speaker portion 2013, and the like. The invention is applied to manufacturing of the display portion 2011. The display portion shown in FIG. 27B is formed of a substance which can be curved; therefore, the television device has the curved display portion. In this manner, the shape of the display portion can be freely designed; therefore, a television device in a desired shape can be manufactured.

By the invention, a display device can be manufactured through simplified steps; therefore, cost can be reduced as well. As a result, a television device manufactured by the invention can be manufactured at low cost even with a large display portion. Thus, a television device with high functionality and high reliability can be manufactured at high yield.

It is needless to say that the invention is not limited to a television device and the invention can be used for various applications as a large display medium such as an information display board at train stations, airports, and the like, and an advertisement board on street as well as a monitor of a personal computer.

Embodiment Mode 11

This embodiment mode is described with reference to FIGS. 28A and 28B. This embodiment mode shows an example of a module using a panel including a display device manufactured in Embodiment Modes 1 to 9.

Figure 28A:
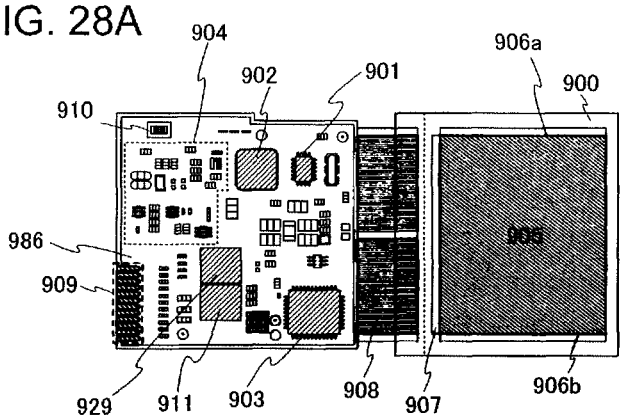
FIGS. 28A and 28B are views showing application examples of a semiconductor device of the invention.

A module of an information terminal shown in FIG. 28A includes a printed wiring board 986 over which a controller 901, a central processing unit (CPU) 902, a memory 911, a power source circuit 903, an audio processing circuit 929, a transmission/reception circuit 904, and other elements such as a resistor, a buffer, and a capacitor are mounted. In addition, a panel 900 is connected to the printed wiring board 986 through a flexible wiring circuit (FPC) 908.

The panel 900 is provided with a pixel portion 905 having a light emitting element in each pixel, a first scan line driver circuit 906a, a second scan line driver circuit 906b which selects a pixel included in the pixel portion 905, and a signal line driver circuit 907 which supplies a video signal to the selected pixel.

Various control signals are inputted and outputted through an interface (I/F) portion 909 provided on the printed wiring board 986. An antenna port 910 for transmitting and receiving signals to/from an antenna is provided on the printed wiring board 986.

It is to be noted in this embodiment mode that the printed wiring board 986 is connected to the panel 900 through the FPC 908; however, the invention is not limited to this structure. The controller 901, the audio processing circuit 929, the memory 911, the CPU 902, or the power source circuit 903 may be directly mounted on the panel 900 by a COG (Chip on Glass) method. Moreover, various elements such as a capacitor and a buffer provided on the printed wiring board 986 prevent a noise in a power source voltage or a signal and a rounded rise of a signal.

Figure 28B:
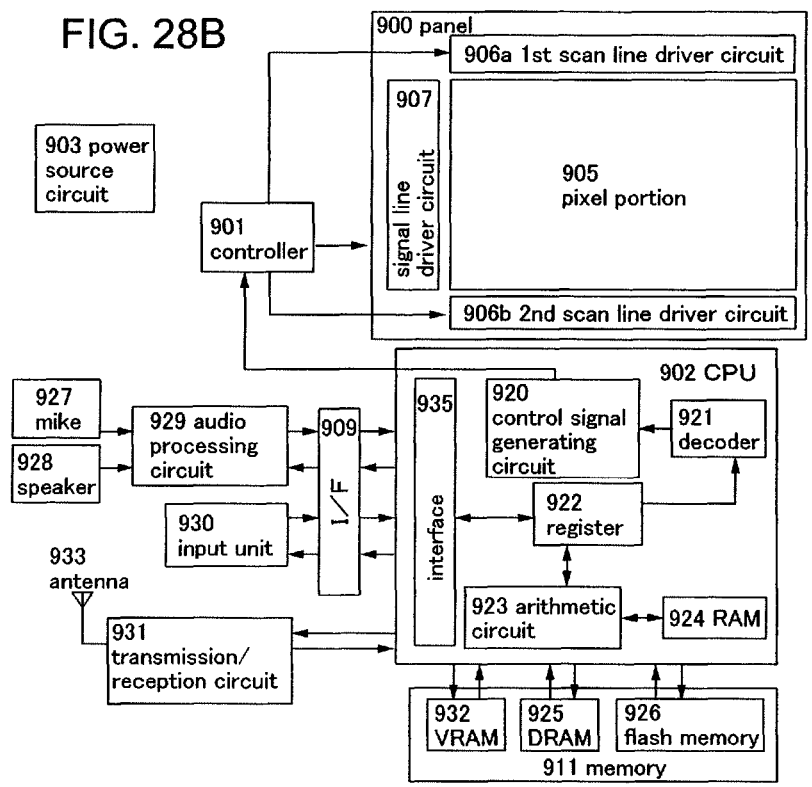

FIG. 28B is a block diagram of the module shown in FIG. 28A. A module 999 includes a VRAM 932, a DRAM 925, a flash memory 926, and the like as the memory 911. The VRAM 932 stores image data displayed by a panel, the DRAM 925 stores image data or audio data, and the flash memory stores various programs.

The power source circuit 903 generates a power source voltage applied to the panel 900, the controller 901, the CPU 902, the audio processing circuit 929, the memory 911, and the transmission/reception circuit 931. Moreover, depending on the specifications of the panel, a current source is provided in the power source circuit 903 in some cases.

The CPU 902 includes a control signal generating circuit 920, a decoder 921, a register 922, an arithmetic circuit 923, a RAM 924, an interface 935 for the CPU, and the like. Various signals inputted to the CPU 902 through the interface 935 are inputted to the arithmetic circuit 923, the decoder 921, and the like after being held in the register 922 once. The arithmetic circuit 923 operates based on the inputted signal and specifies an address to send various instructions. On the other hand, a signal inputted to the decoder 921 is decoded and inputted to the control signal generating circuit 920. The control signal generating circuit 920 generates a signal containing various instructions based on the inputted signal and sends it to the address specified by the arithmetic circuit 923, which are specifically the memory 911, the transmission/reception circuit 931, the audio processing circuit 929, the controller 901, and the like.

The memory 911, the transmission/reception circuit 931, the audio processing circuit 929, and the controller 901 operate in accordance with respective transmitted instructions. The operations are briefly described below.

The signal inputted from an input unit 930 is transmitted to the CPU 902 mounted on the printed wiring board 986 through the interface 909. The control signal generating circuit 920 converts the image data stored in the VRAM 932 into a predetermined format in accordance with the signal transmitted from the input unit 930 such as a pointing device and a keyboard, and then transmits it to the controller 901.

The controller 901 processes a signal containing image data transmitted from the CPU 902 in accordance with the specifications of the panel and supplies it to the panel 900. The controller 901 generates and sends a Hsync signal, a Vsync signal, a clock signal CLK, an alternating voltage (AC Cont), and a switching signal L/R to the panel 900 based on the power source voltage inputted from the power source circuit 903 and various signals inputted from the CPU 902.

In the transmission/reception circuit 904, a signal transmitted and received as an electric wave by the antenna 933 is processed. In specific, high frequency circuits such as an isolator, a band path filter, a VCO (Voltage Controlled Oscillator), an LPF (Low Pass Filter), coupler, and balan are included. Among the signals transmitted and received by the transmission/reception circuit 904, signals containing audio data are transmitted to an audio processing circuit 929 in accordance with an instruction transmitted from the CPU 902.

The signals containing audio data transmitted in accordance with the instruction from the CPU 902 are demodulated into audio signals in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power source circuit 903, the audio processing circuit 929, and the memory 911 can be incorporated as a package of this embodiment mode. This embodiment mode can be applied to any circuit besides high frequency circuits such as an isolator, a band path filter, a VCO (Voltage Controlled Oscillator), an LPF (Low Pass Filter), coupler, and balan.

Embodiment Mode 12

Figure 29:
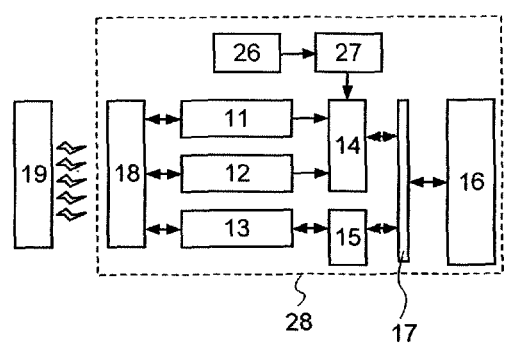
FIG. 29 is a diagram showing an application example of a semiconductor device of the invention.

A configuration of a semiconductor device of this embodiment mode is described with reference to FIG. 29. As shown in FIG. 29, a semiconductor device 28 of the invention has a function to communicate data wirelessly, and includes a power source circuit 11, a clock generating circuit 12, a data demodulation/modulation circuit 13, a control circuit 14 which controls other circuits, an interface circuit 15, a memory circuit 16, a data bus 17, an antenna (antenna coil) 18, a sensor 26, and a sensor circuit 27.

The power source circuit 11 generates various power sources to be supplied to each circuit in the semiconductor device 28 based on alternating signals inputted from the antenna 18. The clock generating circuit 12 generates various clock signals to be supplied to each circuit in the semiconductor device 28 based on alternating signals inputted from the antenna 18. The data demodulation/modulation circuit 13 has a function to demodulate/modulate data to communicate with the reader/writer 19. The control circuit 14 has a function to control the memory circuit 16. The antenna 18 has a function to transmit and receive electromagnetic waves or electric waves. The reader/writer 9 controls a process related to communication, control, and data of the semiconductor device. It is to be noted that the semiconductor device is not limited to have the aforementioned configuration. For example, other elements such as a limiter circuit of a power source voltage or hardware dedicated for cipher processing may be additionally provided.

The memory circuit 16 features that a memory element in which an organic compound layer or a phase change layer is sandwiched between a pair of conductive layers is included.

The memory circuit 16 may have only a memory element in which an organic compound layer or a phase change layer is sandwiched between a pair of conductive layers or may have a memory circuit with another configuration in addition. The memory circuit with another configuration corresponds to one or a plurality selected from, for example, a DRAM, an SRAM, a FeRAM, a mask ROM, a PROM, an EPROM, an EEPROM, and a flash memory.

The sensor 26 is formed of a semiconductor element such as a resistor, a capacitive coupling element, an inductive coupling element, a photo-electromotive element, a photoelectric converting element, a thermo-electromotive element, a transistor, a thermistor, and a diode. The sensor circuit 27 detects a change in impedance, reactance, inductance, voltage, or current and carries out analog/digital conversion (A/D conversion) and outputs a signal to the control circuit 14.

Embodiment Mode 13

Figure 25:
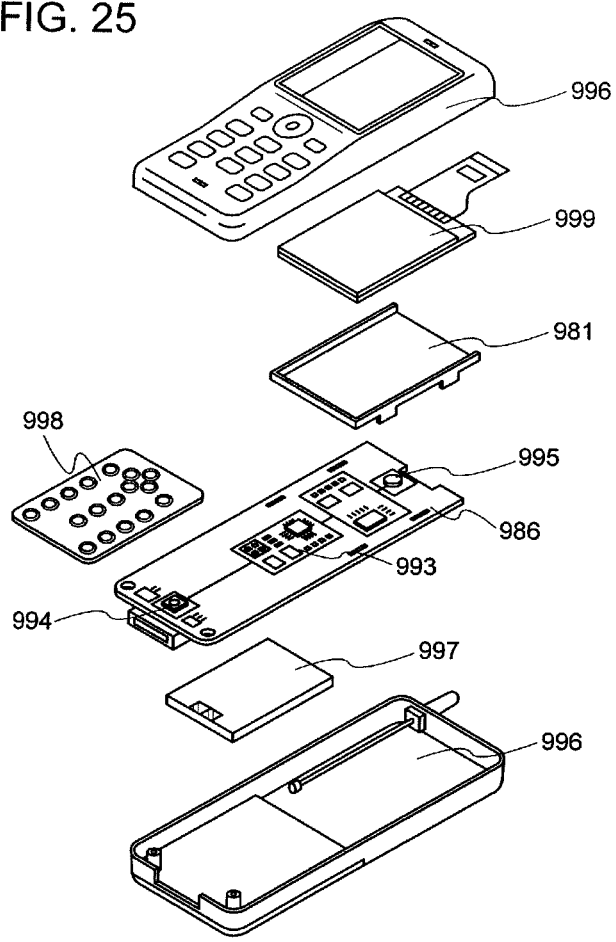
FIG. 25 is a view showing an electronic device to which the invention is applied.

This embodiment mode is described with reference to FIG. 25. FIG. 25 shows one aspect of a portable phone (mobile phone) including the module manufactured in Embodiment Mode 11, which operates wirelessly and can be carried. Moreover, a semiconductor device using the invention is incorporated in the portable phone. The panel 900 is detachably incorporated in a housing 981 so as to be easily combined with a module 999. The housing 981 can be appropriately changed in shape and size in accordance with an electronic device incorporated therein.

The housing 981 in which the panel 900 is fixed is fit in the printed wiring board 986 and set up as a module. A plurality of semiconductor devices which are packaged are incorporated in the printed wiring board 986, for one of which a semiconductor device of the invention can be used. The plurality of semiconductor devices incorporated in the printed wiring board 986 have any function of a controller, a central processing unit (CPU), a memory, a power source circuit, and other elements such as a resistor, a buffer, and a capacitor. Moreover, an audio processing circuit including a microphone 994 and a speaker 995 and a signal processing circuit 993 such as a transmission/reception circuit are provided. The panel 900 is connected to the printed wiring board 986 through the FPC 908.

The module 999, the housing 981, the printed wiring board 986, an input unit 998, and a battery 997 are stored in a housing 996. The pixel portion of the panel 900 is arranged so that it can be seen through a window formed in the housing 996. As a semiconductor device of the invention can be highly integrated easily, an electronic device using a semiconductor device having a large capacitance memory circuit can be provided. Further, a highly reliable electronic device can be manufactured at high productivity.

The housing 996 shown in FIG. 25 shows an exterior shape of a portable phone as an example. However, an electronic device of this embodiment mode could change to have various aspects in accordance with functions and applications. In the following embodiment mode, an example of the aspects is described.

Embodiment Mode 14

By using the invention, various display devices can be manufactured. That is, the invention can be applied to various electronic devices incorporating the display device in a display portion.

Such electronic devices include a camera such as a video camera and a digital camera, a projector, a head mounted display (goggle type display), a car navigation system, a car stereo, a personal computer, a game machine, a portable information terminal (mobile computer, mobile phone, electronic book, or the like), an image reproducing device provided with a recording medium (specifically a device which reproduces a recording medium such as a DVD (Digital Versatile Disc) and has a display capable of displaying the reproduced image), and the like. Examples of these are shown in FIGS. 32A to 32D.

Figure 32A:
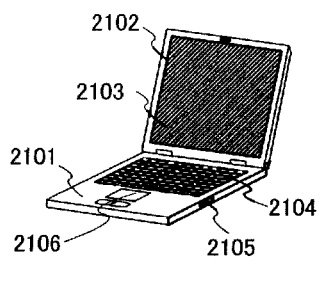
FIGS. 32A to 32D are views showing electronic devices to which the invention is applied.

FIG. 32A illustrates a computer including a main body 2101, a housing 2102, a display portion 2103, a keyboard 2104, an external connecting port 2105, a pointing mouse 2106, and the like. In this computer, the display portion 2103 has a structure of the aforementioned embodiment mode. As a result, an aperture ratio of the display portion 2103 of the computer can be improved. Further, a highly reliable computer which displays a high quality image can be provided.

Figure 32B:
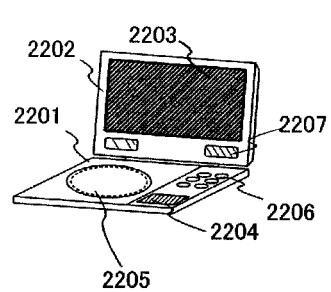

FIG. 32B illustrates an image reproducing device provided with a recording medium (specifically a DVD reproducing device), including a main body 2201, a housing 2202, a display portion A 2203, a display portion B 2204, a recording medium (DVD or the like) reading portion 2205, an operating key 2206, a speaker portion 2207, and the like. The display portion 2203 A mainly displays image data while the display portion B 2204 mainly displays text data. In the image reproducing device provided with a recording medium, the display portion A 2203 and the display portion B 2204 have the structures of the aforementioned embodiment mode. As a result, an aperture ratio of each of the display portion A 2203 and the display portion B 2204 of the image reproducing device provided with a recording medium can be improved. Further, a highly reliable image reproducing device provided with a recording medium, which displays a high quality image, can be provided.

Figure 32C:
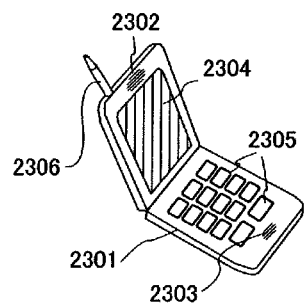

FIG. 32C illustrates a portable phone including a main body 2301, an audio output portion 2302, an audio input portion 2303, a display portion 2304, operating switches 2305, an antenna 2306, and the like. In this portable phone, the display portion 2304 has the structure of the aforementioned embodiment mode. As a result, an aperture ratio of the display portion 2304 of the portable phone can be improved. Further, a highly reliable portable phone which displays a high quality image can be provided.

Figure 32D:
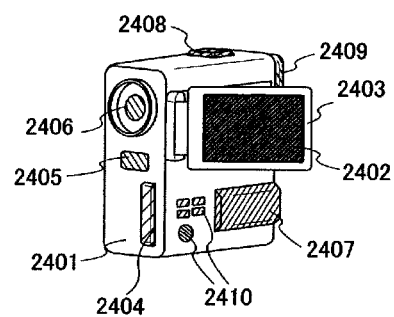

FIG. 32D illustrates a video camera including a main body 2401, a display portion 2402, a housing 2403, an external connecting port 2404, a remote control receiving portion 2405, an image receiving portion 2406, a battery 2407, an audio input portion 2408, an eyepiece portion 2409, operating keys 2410, and the like. In this video camera, the display portion 2402 has the structure of the aforementioned embodiment mode. As a result, an aperture ratio of the display portion 2402 of the video camera can be improved. Further, a highly reliable video camera which displays a high quality image can be provided. This embodiment mode can be freely implemented in combination with the aforementioned embodiment modes.

Embodiment Mode 15

By the invention, a semiconductor device functioning as a processor chip (also referred to as a wireless chip, a wireless processor, a wireless memory, or a wireless tag) can be formed. The semiconductor device of the invention is used for various purposes. The semiconductor device can be used for, for example, bills, coins, securities, certificates, bearer bonds, packages, documents, recording media, personal belongings, vehicles, food, clothing, health products, commodities, chemicals, electronic appliances, and the like.

Figure 30A:
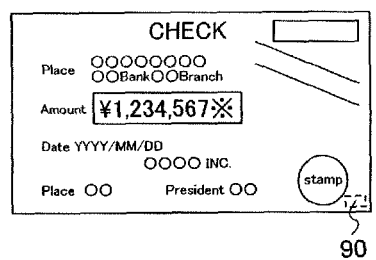
FIGS. 30A to 30G are views showing application examples of a semiconductor device of the invention.
Figure 30B:
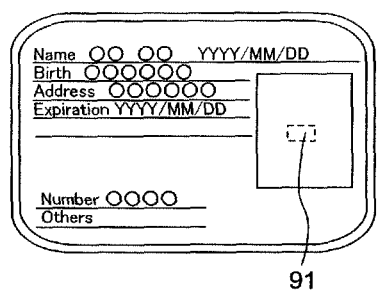
Figure 30C:
Figure 30D:
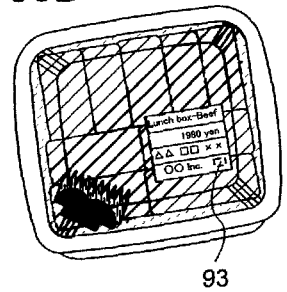
Figure 30E:
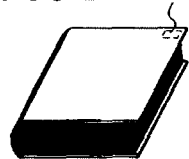
Figure 30F:
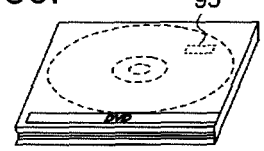
Figure 30G:
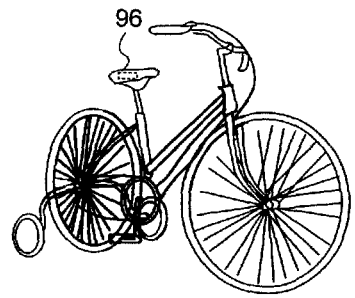

Bills and coins are money that circulate in the market and include ones valid in a certain area (cash voucher), memorial coins, and the like. Securities include checks, certificates, promissory notes, and the like, and can be provided with a processor chip 90 (see FIG. 30A). Certificates include driver's licenses, certificates of residence, and the like, and can be provided with a processor chip 91 (see FIG. 30B). Personal belongings include bags, glasses, and the like, and can be provided with a processor chip 97 (see FIG. 30C). Bearer bonds include stamps, rice coupons, various gift certificates, and the like. Packages include wrapping paper for food containers and the like, plastic bottles, and the like, and can be provided with a processor chip 93 (see FIG. 30D). Books include hardbacks, paperbacks, and the like, and can be provided with a processor chip 94 (see FIG. 30E). Recording media include DVD software, video tapes, and the like, and can be provided with a processor chip 95 (see FIG. 30F). Vehicles include wheeled vehicles such as bicycles, ships, and the like, and can be provided with a processor chip 96 (see FIG. 30G). Food includes food articles, drink, and the like. Clothing include clothes, footwear, and the like. Health products include medical instruments, health instruments, and the like. Commodities include furniture, lighting equipment, and the like. Chemicals includes medical products, pesticides, and the like. Electronic devices include liquid crystal display devices, EL display devices, television devices (TV sets and flat-screen TV sets), portable phones, and the like.

The semiconductor device of the invention is fixed to a product by being mounted on a printed board, attached to the surface of the product, or embedded in the product. For example, the semiconductor device may be embedded in the paper of a book, or an organic resin of a package. Since the semiconductor device of the invention is small, thin, and lightweight, it can be fixed to a product without detracting from the design of the product itself. In addition, when provided with the semiconductor device of the invention, bills, coins, securities, bearer bonds, certificates, and the like can have an authentication function. The use of the authentication function prevents forgery. When the semiconductor device of the invention is incorporated in containers for packages, recording media, personal belongings, foods, commodities, clothing, electronic apparatuses, and the like, systems such as inspection systems can be performed more efficiently.

Figure 31A:
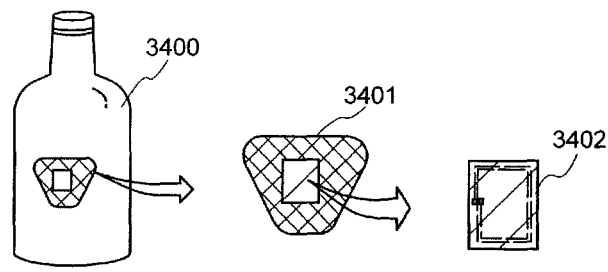
FIGS. 31A and 31B are views showing application examples of a semiconductor device of the invention.
Figure 31B:
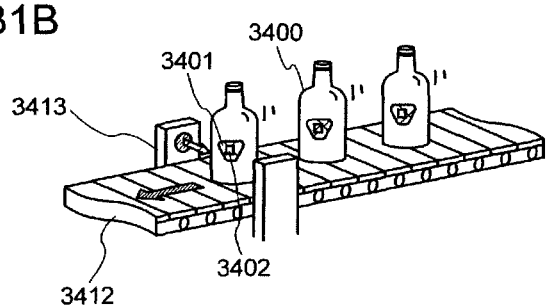

An example of capable of being applied to product management and distribution system is described with reference to FIGS. 31A and 31B. This embodiment mode shows an example of incorporating a processor chip in a product. As shown in FIG. 31A, a processor chip 3402 is mounted on a beer bottle 3400 using a label 3401.

The processor chip 3402 stores basic data such as a manufacturing date, a manufacturing area, and ingredients. Such basic data is not required to be rewritten, thus it may be stored in a non-rewritable memory such as a mask ROM and a memory element of the invention. The basic data such as a manufacturing date, a manufacturing area, and ingredients is information that consumers may want to correctly obtain when purchasing a product. When such information is stored in a non-rewritable memory element, falsification of data and the like can be prevented, and thus accurate information with high reliability can be transmitted to the consumers. The processor chip 3402 also stores individual data such as a delivery address and a delivery date of each beer bottle. For example, as shown in FIG. 31B, when the beer bottle 3400 moving on a conveyor belt 3412 passes a writer device 3413, each delivery address and delivery date can be stored in the processor chip 3402. Such individual data may be stored in a rewritable and erasable memory such as an EEPROM.

A system is preferably configured such that when data on a purchased product is transmitted from a delivery destination to a distribution management center via a network, the delivery address and date are calculated based on the product data by a writer device, a personal computer for controlling the writer device, or the like, and then stored in the processor chip.

Since the bottles are delivered per case, a processor chip may be incorporated in each case or every several cases to store individual data.

When the processor chip is incorporated in such products that may store a plurality of delivery addresses, the time required for manual data input can be reduced, resulting in reduced input errors. In addition, it is possible to lower labor costs that are the most costly expenses in the distribution management. Thus, incorporation of the processor chip allows the distribution management to be performed with few errors at low cost.

Additional data such as food to go with beer and a recipe with beer may be stored at the delivery destination. As a result, the food and the like can be promoted and consumers' willingness to buy can be increased. Such additional data may be stored in a rewritable and erasable memory such as an EEPROM. In this manner, incorporation of the processor chip increases the amount of information given to consumers; thus they can purchase products at ease.

Embodiment Mode 16

In this embodiment mode, other structures which can be applied to a light emitting element of the invention are described with reference to FIGS. 34A to 35C.

A light emitting element which utilizes electroluminescence is categorized depending on a light emitting material: an organic compound or an inorganic compound. In general, the former is called an organic EL element while the latter is called an inorganic EL element.

The inorganic EL element is categorized into a dispersion type inorganic EL element and a thin film inorganic EL element depending on the element structure. The former has an electroluminescent layer in which particles of light emitting material are dispersed in a binder while the latter has an electroluminescent layer formed of a thin film of a light emitting material. However, they are common in that an electron accelerated in a high electronic field is required. As a light emission mechanism, there are a donor-acceptor recombination type light emission which utilizes a donor level and an acceptor level and a localized type light emission which utilizes inner-shell electron transition of metal ions. In general, a dispersion type inorganic EL element employs a donor-acceptor recombination type light emission while a thin film type inorganic EL element employs localized light emission in many cases.

A light emitting material which can be used in the invention is formed of a host material and an impurity element as a light emission center. By changing the impurity element to be contained, light emission of various colors can be obtained. As a manufacturing method of a light emitting material, various methods such as a solid phase method and a liquid phase method (coprecipitation method) can be used. In addition, a liquid phase method such as a spray pyrolysis method, a metathesis method, a method by pyrolysis decomposition reaction of precursor, a reverse micelle method, a combination method of the aforementioned method and high temperature baking, a freeze drying method, or the like can be used.

In the solid phase method, a host material and an impurity element or a compound containing an impurity element are weighed, mixed in a mortar, and heated and baked in an electric furnace so as to react, thereby the impurity element is contained in the host material. The baking temperature is preferably 700 to 1500° C. When the temperature is too low, the solid phase reaction does not proceed while when the temperature is too high, the host material is decomposed. It is to be noted that baking may be carried out in a powder state; however, a pellet state is preferable. A relatively high temperature is required for baking; however, this method being simple and favorable in productivity is suitable for mass production.

The liquid phase method (coprecipitation method) is a method to react a host material or a compound containing a host material and an impurity element or a compound containing an impurity element in a solution, dried, and then baked. The particles of the light emitting material are evenly distributed; therefore, the reaction proceeds even with small particles at a low baking temperature.

As a host material used for the light emitting material, sulfide, oxide, and nitride can be used. As sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS) or the like can be used. As oxide, for example, zinc oxide (ZnO), yttrium oxide ($Y_2O_3$), or the like can be used. As nitride, for example, aluminum nitride (AlN), gallium nitride (GaN), indium nitride (InN), or the like can be used. Furthermore, zinc selenide (ZnSe), zinc telluride (ZnTe) or the like can also be used and a mixed crystal of ternary compound system such as calcium gallium-sulfide ($CaGa_2S_4$), strontium gallium sulfide ($SrGa_2S_4$), or barium-gallium sulfide ($BaGa_2S_4$) may be used as well.

As the light emission center of the localized type light emission, manganese (Mn), copper (Cu), samarium (Sm), terbium (Tb), erbium (Er), thulium (Tm), europium (Eu), cerium (Ce), praseodymium (Pr), or the like can be used. In addition, as charge compensation, halogen element such as fluorine (F) and chlorine (Cl) may be added.

On the other hand, as a light emission center of the donor-acceptor recombination type light emission, a light emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case of synthesizing the light emitting material of the donor-acceptor recombination type light emission by the solid phase method, a host material, a first impurity element or a compound containing the first impurity element, and a second impurity element or a compound containing the second impurity element are each weighed and mixed in a mortar, and then heated and baked in an electronic furnace. As the host material, the aforementioned host material can be used. As the first impurity element or the compound containing the first impurity element, for example, fluorine (F), chlorine (Cl), aluminum sulfide ($Al_2S_3$), and the like can be used. As the second impurity element or a compound containing the second impurity element, for example, copper (Cu), silver (Ag), copper sulfide ($Cu_2S$), silver sulfide ($Ag_2S$), and the like can be used. The baking temperature is preferably 700 to 1500° C. When the temperature is too low, the solid phase reaction does not proceed while when the temperature is too high, the host material is decomposed. It is to be noted that baking may be carried out in a powder state; however, a pellet state is preferable.

As an impurity element used in the case of utilizing the solid phase reaction, a compound formed of the first impurity element and the second impurity element may be used in combination. In this case, the impurity element is easily dispersed which facilitates the solid phase reaction. Therefore, an even light emitting material can be obtained. Furthermore, as no redundant impurity elements are included, a highly pure light emitting material can be obtained. As a compound formed of the first impurity element and the second impurity element, for example, copper chloride (CuCl), silver chloride (AgCl), or the like can be used.

It is to be noted that the concentration of these impurity elements may be 0.01 to 10 atom %, or preferably 0.05 to 5 atom % with respect to the host material.

In the case of a thin film type inorganic EL element, the electroluminescent layer contains the aforementioned light emitting material and can be formed by a resistance heating vapor deposition method, a vacuum vapor deposition method such as electron beam evaporation (EB deposition) method, a physical vapor deposition method (PVD) such as a sputtering method, an organic metal CVD method, a chemical vapor deposition method (CVD) such as hydride transfer low pressure CVD method, an atomic layer epitaxy method (ALE), or the like.

Figure 34A:
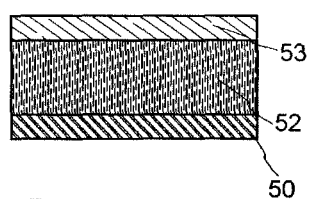
FIGS. 34A to 34C are views showing structures of a light emitting element applicable to the invention.
Figure 34B:
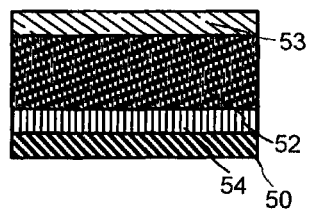
Figure 34C:
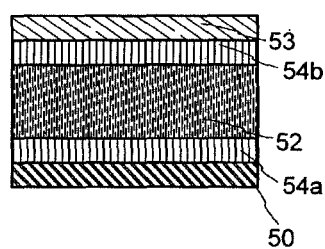

FIGS. 34A to 34C show examples of thin film type inorganic EL elements which can be used as light emitting elements. In FIGS. 34A to 34C, each light emitting element includes a first electrode layer 50, an electroluminescent layer 51, and a second electrode layer 53.

Each light emitting element shown in FIGS. 34B and 34C has a structure where an insulating layer is provided between an electrode layer and an electroluminescent layer in the light emitting element shown in FIG. 34A. The light emitting element shown in FIG. 34B includes an insulating layer 54 between the first electrode layer 50 and the electroluminescent layer 52. The light emitting element shown in FIG. 34C includes an insulating layer 54a between the first electrode layer 50 and the electroluminescent layer 52 and an insulating layer 54b between the second electrode layer 53 and the electroluminescent layer 52. In this manner, an insulating layer may be provided between one or both of pairs of electrode layers sandwiching an electroluminescent layer. The insulating layer may be formed of a single layer or a plurality of layers.

Further, the insulating layer 54 is provided so as to contact the first electrode layer 50; however, the insulating layer 54 may be provided so as to contact the second electrode layer 53 by reversing the order of the insulating layer and the electroluminescent layer.

In the case of a dispersion type inorganic EL element, an electroluminescent layer in a film state is formed by dispersing a light emitting material in particles in binder. In the case where particles in a desired shape cannot be obtained sufficiently depending on a manufacturing method of a light emitting material, the particles may be processed by crushing in a mortar or the like. The binder is a substance for fixing the light emitting material in particles in a dispersed state and holding them in a shape as an electroluminescent layer. The light emitting material is evenly dispersed in the electroluminescent layer and fixed by the binder.

In the case of a dispersion type inorganic EL element, the electroluminescent layer may be formed by a droplet discharge method by which an electroluminescent layer can be selectively formed, a printing method (such as screen printing or offset printing), a coating method such as a spin coating method, a dipping method, a dispenser method, or the like. The thickness it not particularly limited; however, it is preferably 10 to 1000 nm. Further, it is preferable that the ratio of the light emitting material is 50 to 80 wt % in the electroluminescent layer containing a light emitting material and binder.

Figure 35A:
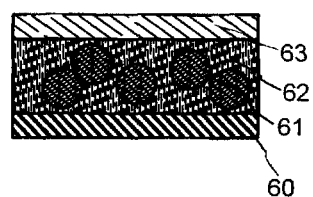
FIGS. 35A to 35C are views showing structures of a light emitting element applicable to the invention.
Figure 35B:
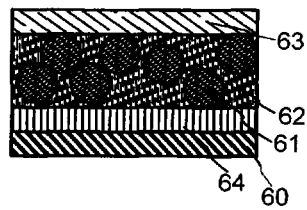
Figure 35C:
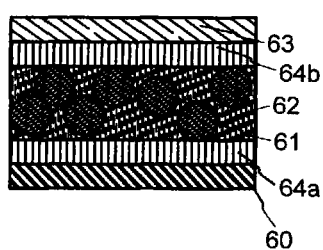

FIGS. 35A to 35C show examples of a dispersion type inorganic EL element which can be used as a light emitting element. The light emitting element shown in FIG. 35A has a stacked-layer structure of a first electrode layer 60, an electroluminescent layer 62, and a second electrode layer 63. The electroluminescent layer 62 contains a light emitting material 61 held by the binder.

An insulating material can be used as binder in this embodiment mode. A mixed material of an organic material and an inorganic material may also be used. As the organic insulating material, a polymer material having a relatively high dielectric constant such as cyanoethyl cellulose-based resin, resin such as polyethylen, polypropylene, polystyrenic resin, silicone resin, epoxy resin, and vinylidene fluoride can be used. Moreover, heat resistant high molecular such as aromatic polyamide, polybenzimidazole, or siloxane resin may be used. A siloxane resin includes a Si—O—Si bond. Siloxane has a skeleton formed by the bond of silicon (Si) and oxygen (O), in which an organic group containing at least hydrogen (such as an alkyl group and aromatic hydrocarbon) is included as a substituent. Alternatively, a fluoro group may be used as the substituent. Further alternatively, a fluoro group and an organic group containing at least hydrogen may be used as the substituent. Further, vinyl resin such as polyvinyl alcohol and polyvinyl butyral, a resin material such as phenol resin, novolac resin, acrylic resin, melamine resin, urethane resin, and oxazole resin (polybenzoxazole) may be used. A dielectric constant can be controlled by mixing micro particles having a high dielectric constant such as barium titanate ($BaTiO_3$) and strontium titanate ($SrTiO_3$) in the aforementioned resin.

As an inorganic insulating material included in binder, a material selected from silicon oxide (SiOx), silicon nitride (SiNx), silicon including oxygen and nitrogen, aluminum nitride (AlN), aluminum including oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalite ($LiTaO_3$), yttrium oxide ($Y_2O_3$), zirconia ($ZrO_2$), and other substances containing an inorganic insulating material can be used. When an organic material contains an inorganic material having a high dielectric constant (by adding or the like), a dielectric constant of the electroluminescent layer formed of a light emitting material and binder can be more controlled, thereby the dielectric constant can be larger. By using a mixed layer of an inorganic material and an organic material for the binder so as to obtain a high dielectric constant, a large charge can be induced in the light emitting material.

A light emitting material is dispersed in a solution containing binder in the manufacturing steps. As a solvent of a solution containing binder which can be used in this embodiment mode, a solvent which enables the binder material to be dissolved and to manufacture a solution with a suitable viscosity for a desired whickness and a method for forming an electroluminescent layer (various wet processes) may be appropriately selected. An organic solvent or the like can be used, for example, propylene glycol monomethyl ether, propylene glycol monomethyl ether acetate (also called PGMEA), 3-methoxy-3-methyl-1-butanol (also called MMB) and the like can be used in the case of using siloxane resin as the binder.

Each of the light emitting elements shown in FIGS. 35B and 35C has a structure where an insulating layer is provided between an electrode layer and an electroluminescent layer in the light emitting element of FIG. 35A. The light emitting element shown in FIG. 35B has an insulating layer 64 between a first electrode layer 60 and the electroluminescent layer 62. The light emitting element shown in FIG. 35C has an insulating layer 64a between the first electrode layer 60 and the electroluminescent layer 62, and an insulating layer 64b between a second electrode layer 63 and the electroluminescent layer 62. In this manner, an insulating layer may be provided between one or both of pairs of electrode layers sandwiching an electroluminescent layer. The insulating layer may be formed of a single layer or a plurality of layers.

In FIG. 35B, the insulating layer 64 is provided so as to contact the first electrode layer 60; however, the insulating layer 64 may be provided so as to contact the second electrode layer 63 by reversing the order of the insulating layer and the electroluminescent layer.

An insulating layer such as the insulating layer 54 in each of FIGS. 34A to 34C and the insulating layer 64 in FIG. 35 is not particularly limited; however, it preferably has a high insulating property, a dense film quality, and further a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconia ($ZrO_2$), and the like, a mixed film or a stacked-layer of two or more kinds of the aforementioned substances can be used. These insulating films can be formed by a sputtering method, a vapor deposition method, a CVD method, or the like. Moreover, the insulating layer may be formed by dispersing particles of these insulating materials in a binder. The binder material may be formed of a similar material and method to the binder contained in the electroluminescent layer. The film thickness is not particularly limited; however, it is preferably 10 to 1000 nm.

In the light emitting element described in this embodiment mode, light is emitted by applying a voltage between a pair of electrode layers which sandwich an electroluminescent layer. An operation is possible with either a DC drive or an AC drive.

By using the invention, a thin film transistor which drives the light emitting element described in this embodiment mode can be manufactured by a simplified method with high reliability. Therefore, a highly reliable display device can be manufactured through simplified steps. As a result, a display device with high resolution and high image quality can be manufactured at low cost and high yield.

What is claimed is:

1. A method for manufacturing a semiconductor device comprising:
    forming a semiconductor layer over a substrate;
    forming a first insulating layer over the semiconductor layer;
    forming a first conductive layer over the first insulating layer;
    forming a second conductive layer over and in contact with the first conductive layer;
    adding an impurity into the semiconductor layer to form a non-impurity added region at one end of the semiconductor layer, a first impurity region, and a second impurity region at the other end of the semiconductor layer; and forming a second insulating layer over the second conductive layer and in direct contact with a portion of a top surface of the first conductive layer, wherein a width of the first conductive layer is larger than a width of the second conductive layer.

2. The method for manufacturing a semiconductor device according to claim 1, wherein the impurity is an n-type impurity.

3. The method for manufacturing a semiconductor device according to claim 1, wherein an impurity concentration of the second impurity region is higher than an impurity concentration of the first impurity region.

4. The method for manufacturing a semiconductor device according to claim 1, further comprising a step of forming a wiring layer in direct contact with the second impurity region.

5. A method for manufacturing a semiconductor device comprising:

forming a semiconductor layer over a substrate;

forming a first insulating layer over the semiconductor layer;

forming a first conductive layer over the first insulating layer;

forming a second conductive layer over and in contact with the first conductive layer;

adding an impurity into the semiconductor layer to form a non-impurity added region at one end of the semiconductor layer, a first impurity region, and a second impurity region at the other end of the semiconductor layer; and forming a second insulating layer over the second conductive layer and in direct contact with a portion of a top surface of the first conductive layer, wherein a width of the first impurity region is larger than a width of the non-impurity added region, and wherein a width of the first conductive layer is larger than a width of the second conductive layer.

6. The method for manufacturing a semiconductor device according to claim 5, wherein the impurity is an n-type impurity.

7. The method for manufacturing a semiconductor device according to claim 5, wherein an impurity concentration of the second impurity region is higher than an impurity concentration of the first impurity region.

8. The method for manufacturing a semiconductor device according to claim 5, further comprising a step of forming a wiring layer in direct contact with the second impurity region.

9. A method for manufacturing a semiconductor device comprising:

forming a semiconductor layer over a substrate;

forming a first insulating layer over the semiconductor layer;

forming a first conductive layer over the first insulating layer;

forming a second conductive layer over and in contact with the first conductive layer;

adding an impurity into the semiconductor layer to form a non-impurity added region at one end of the semiconductor layer, a first impurity region, and a second impurity region at the other end of the semiconductor layer; and forming second insulating layer over the second conductive layer and in direct contact with a portion of a top surface of the first conductive layer, wherein a width of the first impurity region is larger than a width of the second impurity region, and wherein a width of the first conductive layer is larger than a width of the second conductive layer.

10. The method for manufacturing a semiconductor device according to claim 9, wherein the impurity is an n-type impurity.

11. The method for manufacturing a semiconductor device according to claim 9, wherein an impurity concentration of the second impurity region is higher than an impurity concentration of the first impurity region.

12. The method for manufacturing a semiconductor device according to claim 9, further comprising a step of forming a wiring layer in direct contact with the second impurity region.

* * * * *